US012563783B2

(12) United States Patent
Song et al.

(10) Patent No.: US 12,563,783 B2
(45) Date of Patent: Feb. 24, 2026

(54) SEMICONDUCTOR DEVICE

(71) Applicant: SAMSUNG ELECTRONICS CO., LTD., Suwon-si (KR)

(72) Inventors: Jaeyeol Song, Suwon-si (KR);
Ohseong Kwon, Suwon-si (KR);
Suyoung Bae, Suwon-si (KR);
Sangyong Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 566 days.

(21) Appl. No.: 18/103,897

(22) Filed: Jan. 31, 2023

(65) Prior Publication Data

US 2023/0402523 A1    Dec. 14, 2023

(30) Foreign Application Priority Data

Jun. 13, 2022    (KR) ......................... 10-2022-0071344

(51) Int. Cl.
   *H10D 30/67*      (2025.01)
   *H10D 30/43*      (2025.01)
   *H10D 62/10*      (2025.01)
   *H10D 84/83*      (2025.01)

(52) U.S. Cl.
   CPC ......... *H10D 30/6735* (2025.01); *H10D 30/43* (2025.01); *H10D 62/121* (2025.01); *H10D 84/83* (2025.01)

(58) Field of Classification Search
   None
   See application file for complete search history.

(56) References Cited

U.S. PATENT DOCUMENTS

| | | |
|---|---|---|
| 10,319,846 B1 | 6/2019 | Ando et al. |
| 10,559,566 B1 | 2/2020 | Lee et al. |
| 10,600,913 B2 | 3/2020 | Chung et al. |
| 10,692,778 B2 | 6/2020 | Bao et al. |
| 10,692,866 B2 | 6/2020 | Ando et al. |
| 10,700,064 B1 | 6/2020 | Zhang et al. |
| 11,183,574 B2 | 11/2021 | Cheng et al. |
| 11,264,289 B2 | 3/2022 | Smith et al. |
| 2021/0151432 A1* | 5/2021 | Song ..................... H10D 30/62 |
| 2021/0249517 A1 | 8/2021 | Cheng et al. |

FOREIGN PATENT DOCUMENTS

KR      1020180050817 A      5/2018

* cited by examiner

*Primary Examiner* — Chad M Dicke
*Assistant Examiner* — Dave Tan
(74) *Attorney, Agent, or Firm* — Sughrue Mion, PLLC

(57) ABSTRACT

A semiconductor device includes first and second active patterns respectively provided on a first and second PMOS-FET regions of a substrate, a first channel pattern on the first active pattern, the first channel pattern including first semiconductor patterns stacked and spaced apart from each other, a second channel pattern on the second active pattern, the second channel pattern including second semiconductor patterns stacked and spaced apart from each other, a first gate electrode on the first channel pattern, and a second gate electrode on the second channel pattern. A first concentration of aluminum (Al) or silicon (Si) in an inner gate electrode of the first gate electrode is different from a second concentration of aluminum (Al) or silicon (Si) in an inner gate electrode of the second gate electrode.

15 Claims, 49 Drawing Sheets

SHC

FIG. 4

SEMICONDUCTOR DEVICE

CROSS-REFERENCE TO RELATED APPLICATION

This application claims priority to Korean Patent Application No. 10-2022-0071344, filed on Jun. 13, 2022, in the Korean Intellectual Property Office, the disclosure of which is incorporated by reference herein in its entirety.

BACKGROUND

The present disclosure relates to a semiconductor device and a method of fabricating the same, and in particular, to a semiconductor device including a field effect transistor and a method of fabricating the same.

A semiconductor device may include an integrated circuit composed of metal-oxide-semiconductor field-effect transistors (MOS-FETs). To meet an increasing demand for a semiconductor device with a small pattern size and a reduced design rule, the MOS-FETs are being aggressively scaled down. The scale-down of the MOS-FETs may negatively affect operational properties of the semiconductor device. A variety of studies are being conducted to overcome technical limitations associated with the scale-down of the semiconductor device and to realize the semiconductor devices with high performance.

SUMMARY

One or more example embodiments provide a semiconductor device with improved electrical and reliability characteristics.

One or more example embodiments provide a method of fabricating a semiconductor device with improved electrical and reliability characteristics.

According to an aspect of an example embodiment, a semiconductor device includes: a first active pattern provided on a first PMOSFET region of a substrate and a second active pattern respectively a second PMOSFET region of the substrate; a first channel pattern on the first active pattern, the first channel pattern including first semiconductor patterns stacked and spaced apart from each other; a second channel pattern on the second active pattern, the second channel pattern including second semiconductor patterns stacked and spaced apart from each other; a first gate electrode on the first channel pattern; and a second gate electrode on the second channel pattern. The first gate electrode includes a first inner gate electrode provided in a first inner region between the first semiconductor patterns and a first outer gate electrode provided in a first outer region spaced apart from the first semiconductor patterns. The second gate electrode includes a second inner gate electrode provided in a second inner region between the second semiconductor patterns and a second outer gate electrode provided in a second outer region spaced apart from the second semiconductor patterns. A first concentration of aluminum (Al) or silicon (Si) in the first inner gate electrode is different from a second concentration of aluminum (Al) or silicon (Si) in the second inner gate electrode.

According to an aspect of an example embodiment, a semiconductor device includes: a substrate; a device isolation layer provided on the substrate and defining an active pattern; semiconductor patterns on the active pattern; and a gate electrode on the semiconductor patterns. The gate electrode includes an inner gate electrode and an outer gate electrode, each of which includes inner electrodes. The inner electrodes of the inner gate electrode and the semiconductor patterns are alternately stacked to define a fin structure. The outer gate electrode includes: a first metal pattern on the fin structure; a second metal pattern on the first metal pattern; and a fill metal pattern on the second metal pattern. A first concentration of aluminum (Al) or silicon (Si) in the inner gate electrode is different from a second concentration of aluminum (Al) or silicon (Si) in the first metal pattern.

According to an aspect of an example embodiment, a semiconductor device includes: a first active pattern provided on a first PMOSFET region of a substrate and a second active pattern provided on a second PMOSFET region of the substrate; a device isolation layer provided in a trench defining the first active pattern and the second active pattern; a first channel pattern on the first active pattern, the first channel pattern including first semiconductor patterns stacked and spaced apart from each other; a second channel pattern on the second active pattern, the second channel pattern including second semiconductor patterns stacked and spaced apart from each other; a first gate electrode on the first channel pattern; a second gate electrode on the second channel pattern; a first interlayer insulating layer on the first gate electrode and the second gate electrode; gate contacts provided to penetrate the first interlayer insulating layer and coupled to the first gate electrode and the second gate electrode; a second interlayer insulating layer on the first interlayer insulating layer; a first metal layer provided in the second interlayer insulating layer, the first metal layer including first interconnection lines electrically connected to the gate contacts; a third interlayer insulating layer on the second interlayer insulating layer; and a second metal layer provided in the third interlayer insulating layer. The second metal layer includes second interconnection lines electrically connected to the first interconnection lines. The first gate electrode includes a first inner gate electrode provided in a first inner region between the first semiconductor patterns and a first outer gate electrode provided in a first outer region outside the first semiconductor patterns. The second gate electrode includes a second inner gate electrode provided in a second inner region between the second semiconductor patterns and a second outer gate electrode provided in a second outer region outside the second semiconductor patterns. A work-function of the first inner gate electrode is different from a work-function of the second inner gate electrode.

BRIEF DESCRIPTION OF DRAWINGS

The above and other aspects and features will be more apparent from the following description of example embodiments taken in conjunction with the accompanying drawings, in which:

FIG. 4 is a plan view illustrating a semiconductor device according to an example embodiment.

DETAILED DESCRIPTION

Hereinafter, example embodiments are described in conjunction with the accompanying drawings. Embodiments described herein are example embodiments, and thus, the present disclosure is not limited thereto, and may be realized in various other forms. Each example embodiment provided in the following description is not excluded from being associated with one or more features of another example or another embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. It will be also understood that, even if a certain step or operation of manufacturing an apparatus or structure is described later than another step or operation, the step or operation may be performed later than the other step or operation unless the other step or operation is described as being performed after the step or operation.

Figure 1:
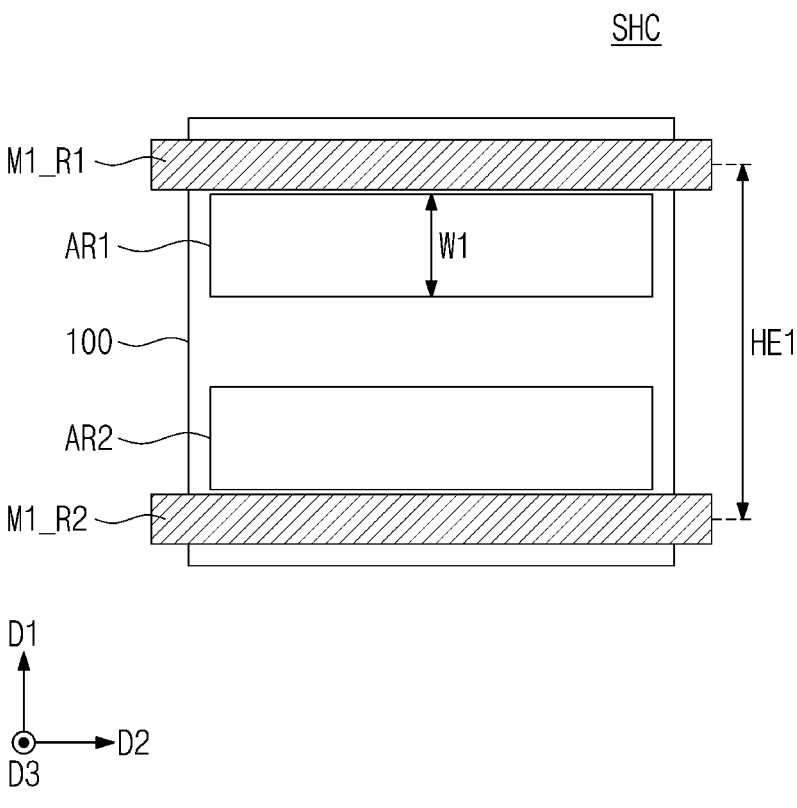
FIGS. 1 to 3 are conceptual diagrams illustrating logic cells of a semiconductor device according to example embodiments.
Figure 2:
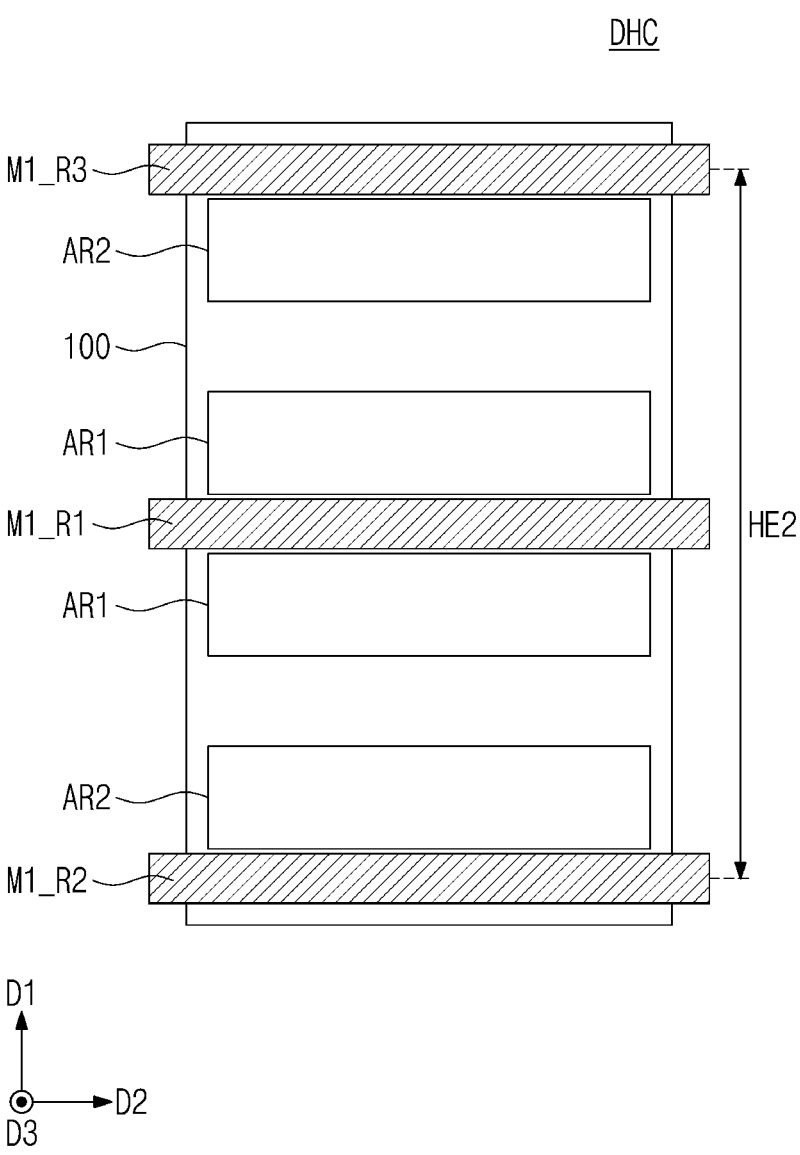
Figure 3:
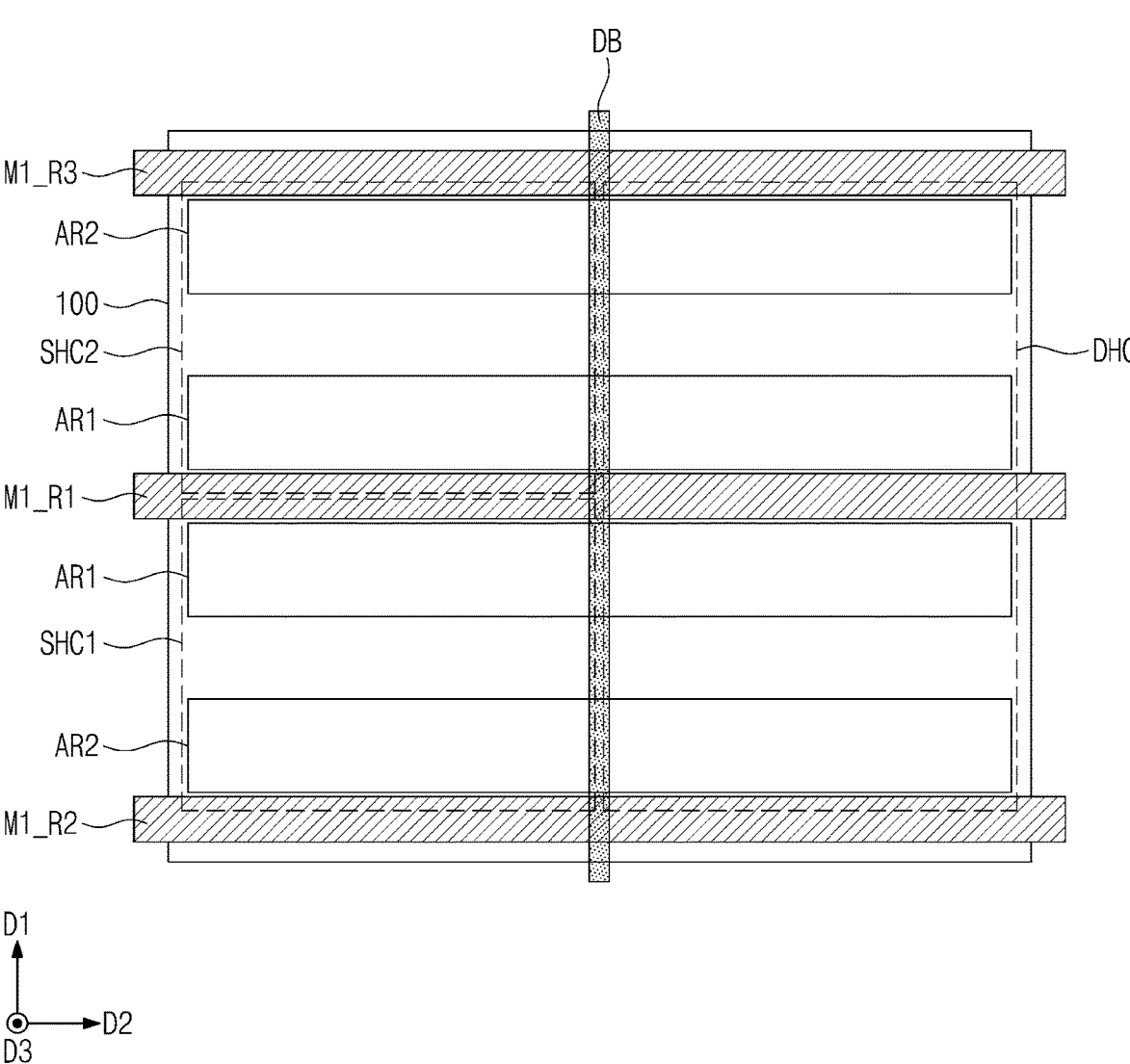
Figure 5A:
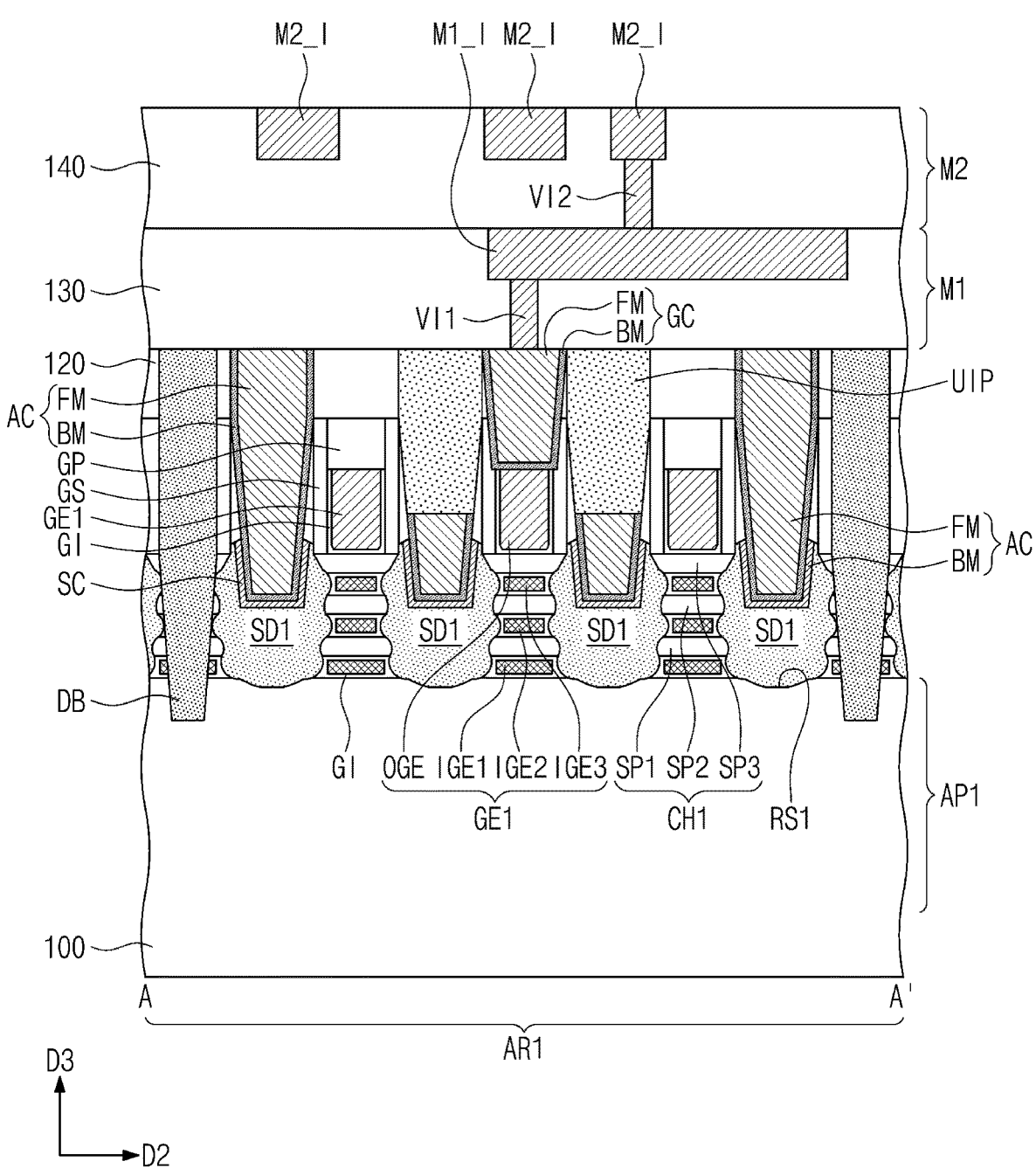
FIGS. 5A, 5B, 5C, 5D, 5E, 5F and 5G are sectional views taken along lines A-A', B-B', C-C', D-D', E-E', F-F', and G-G', respectively, of FIG. 4 according to example embodiments.
Figure 5B:
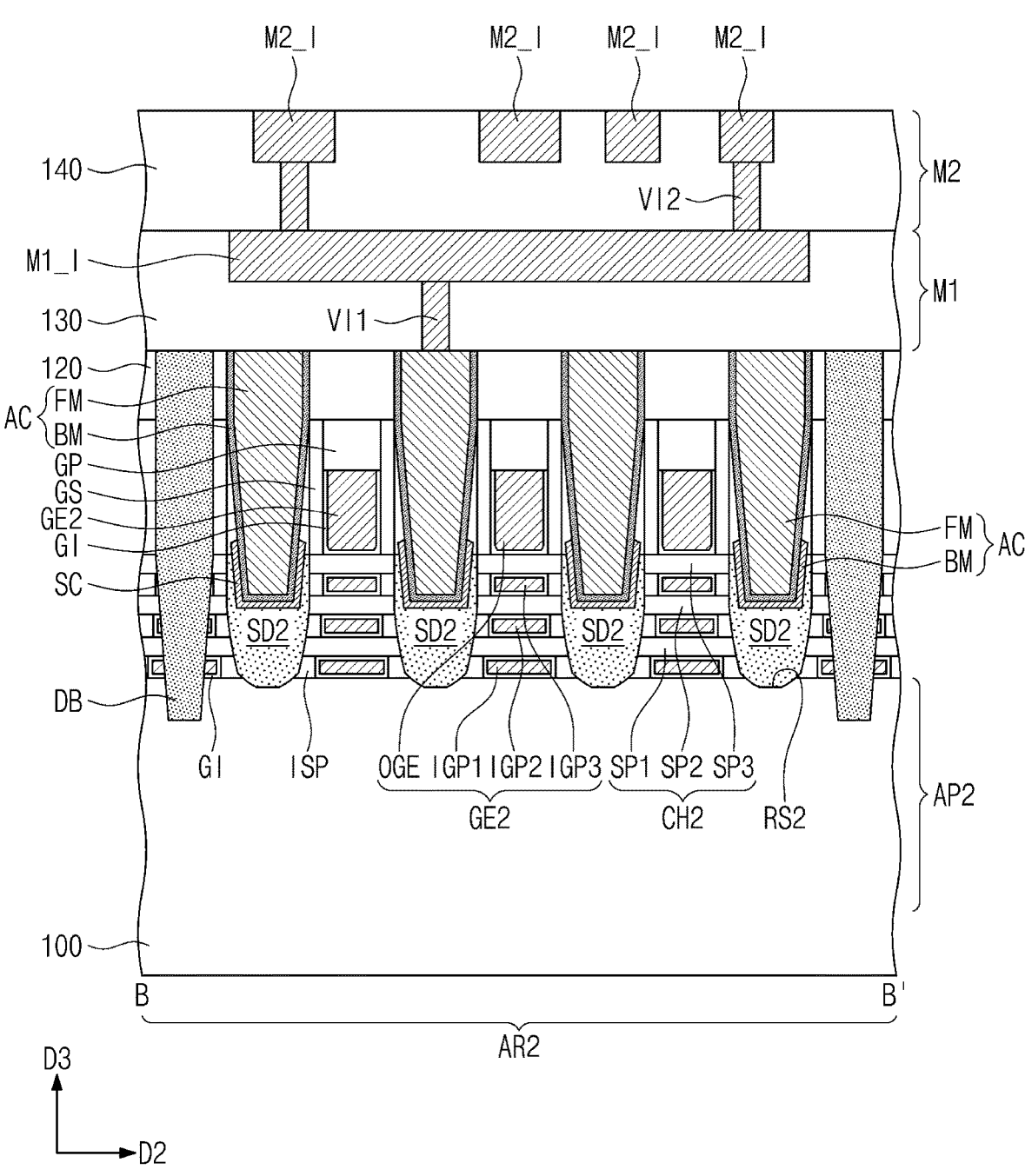
Figure 5C:
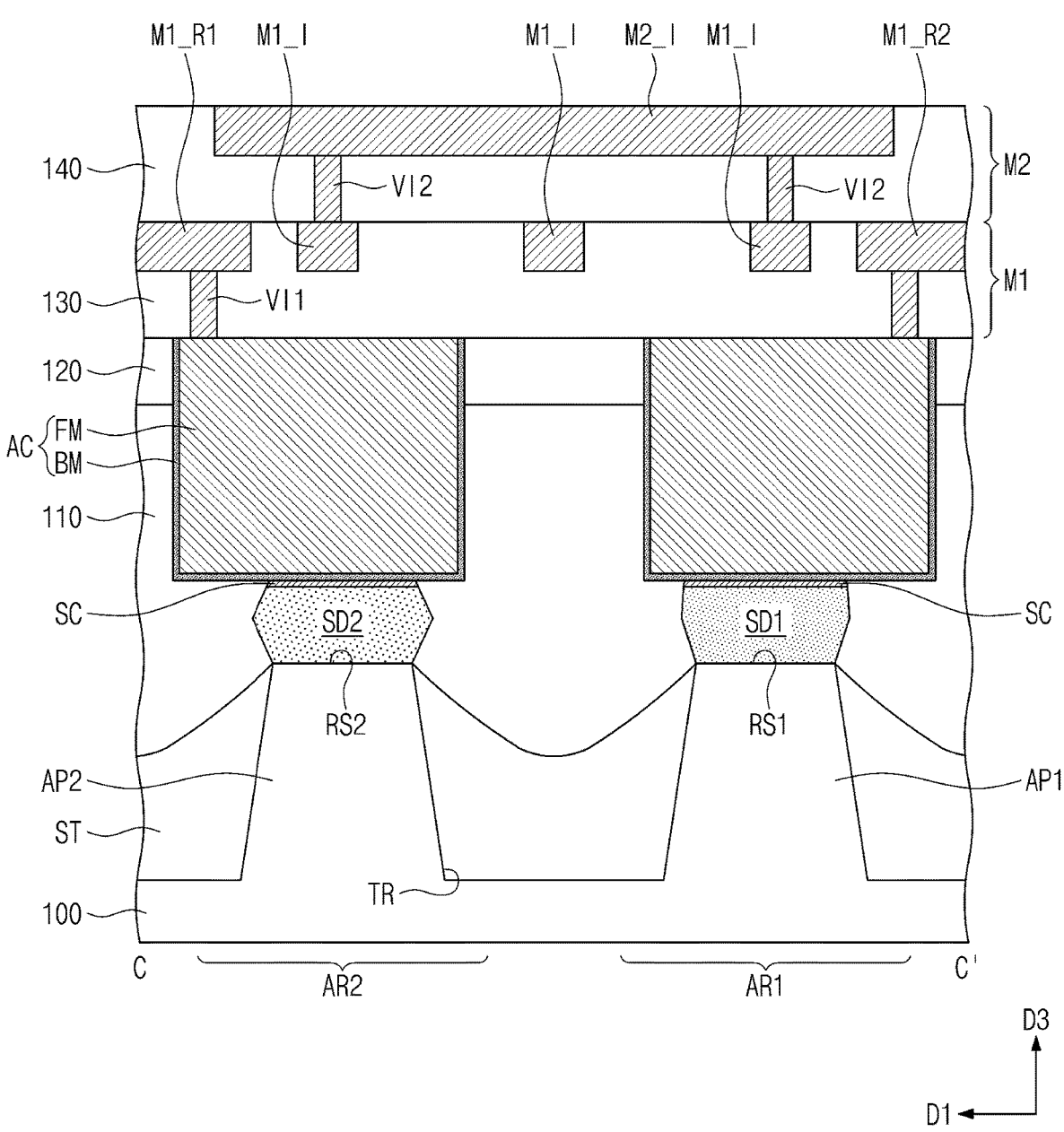
Figure 5D:
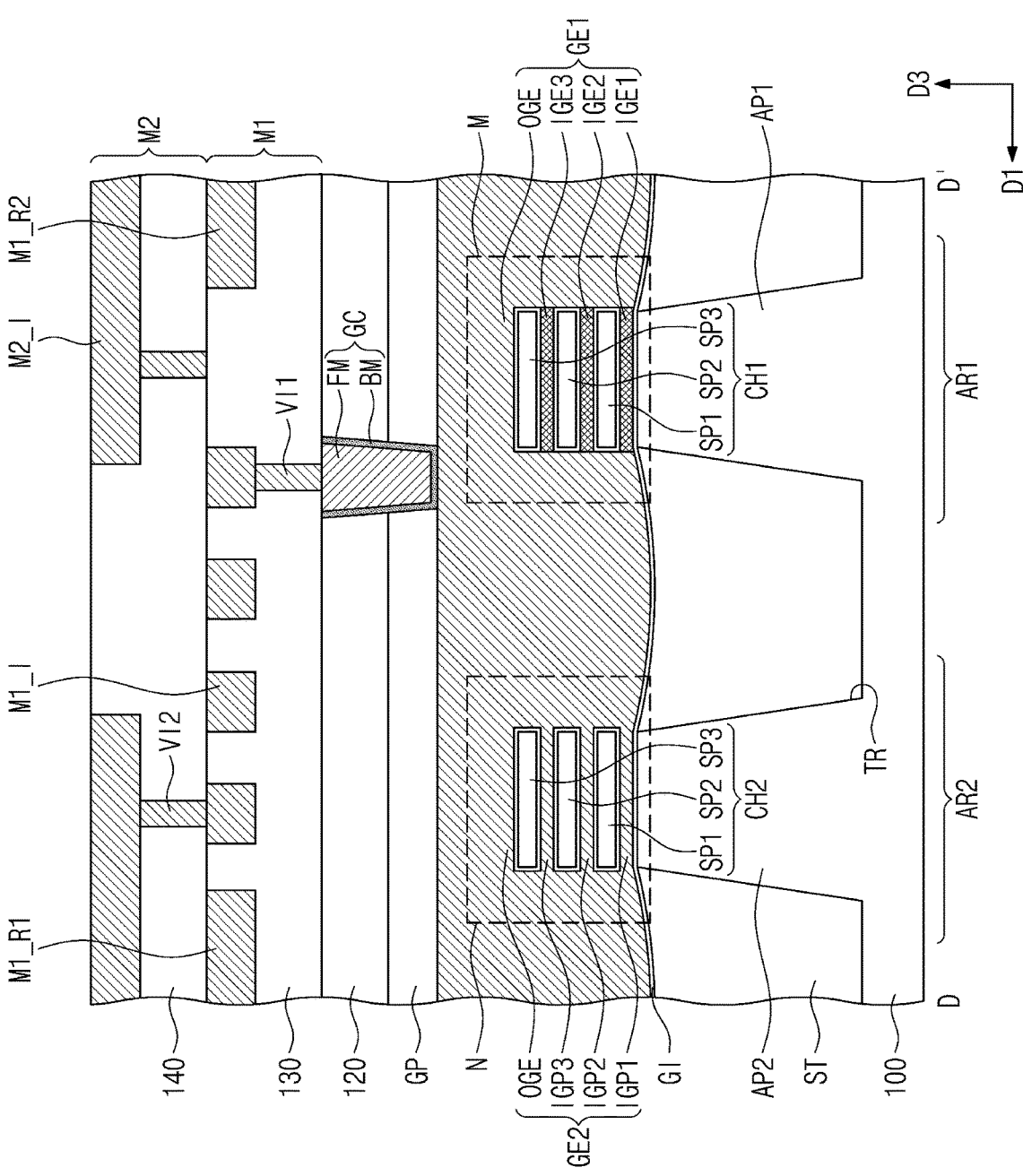
Figure 5E:
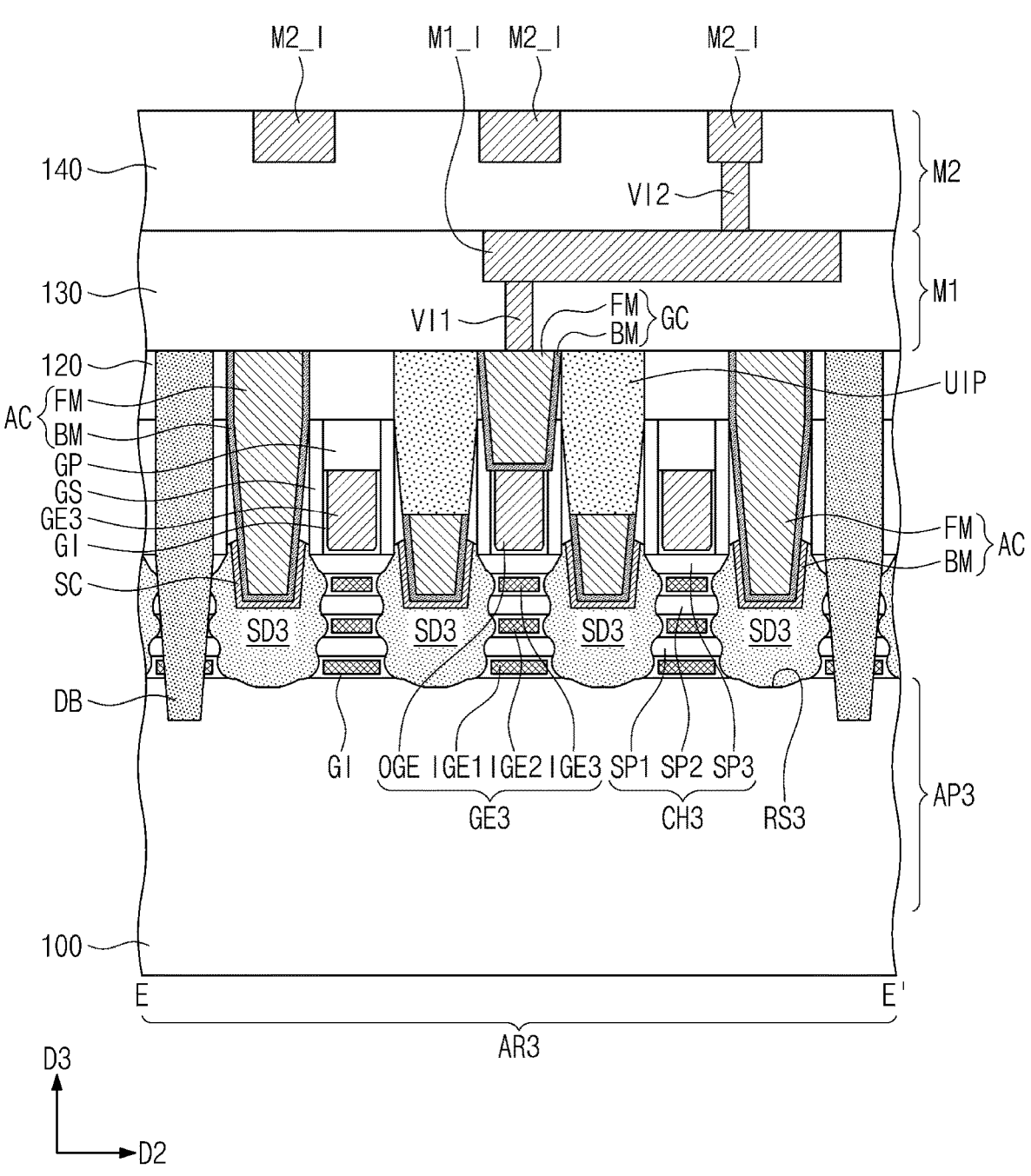
Figure 5F:
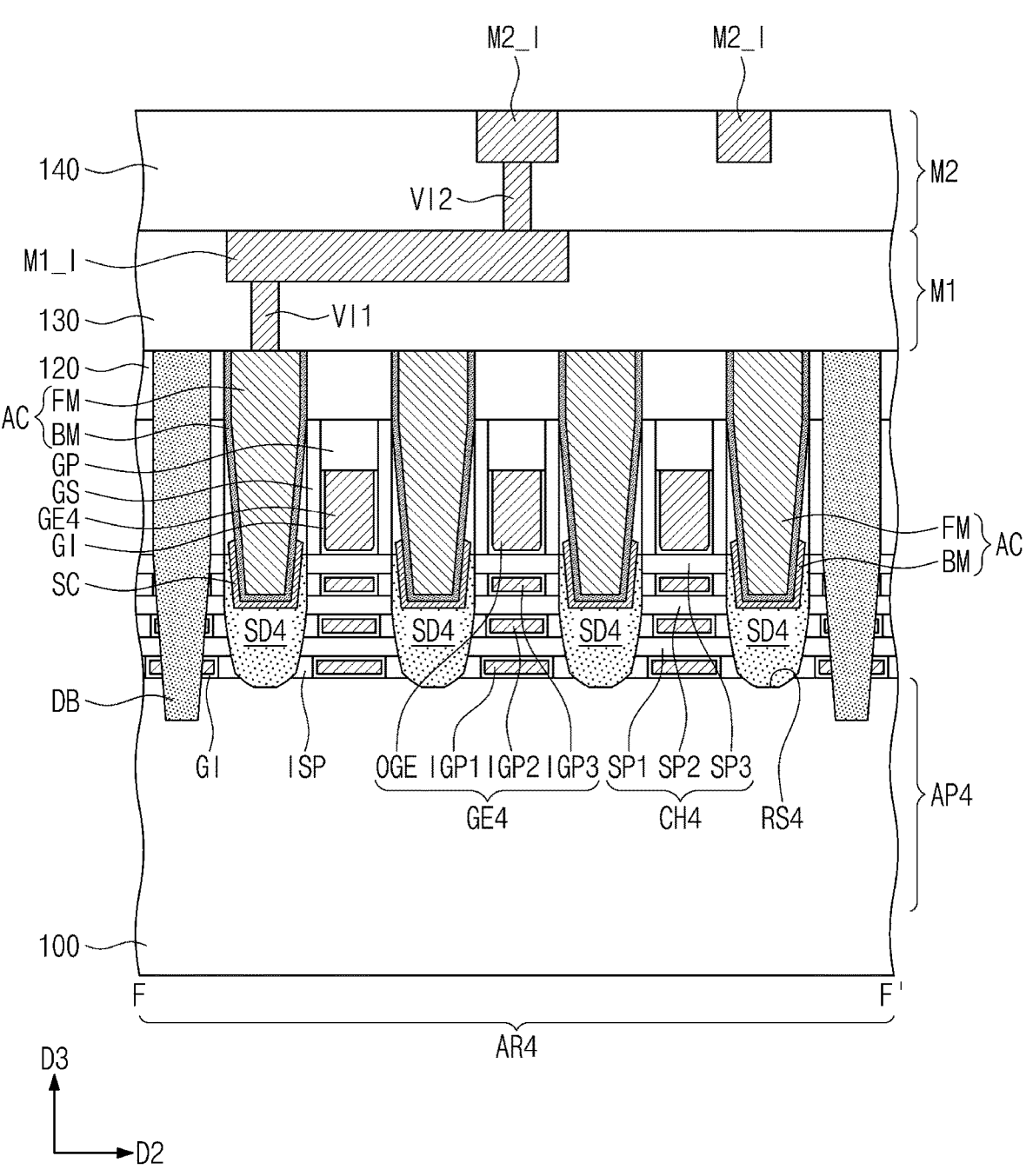
Figure 5G:
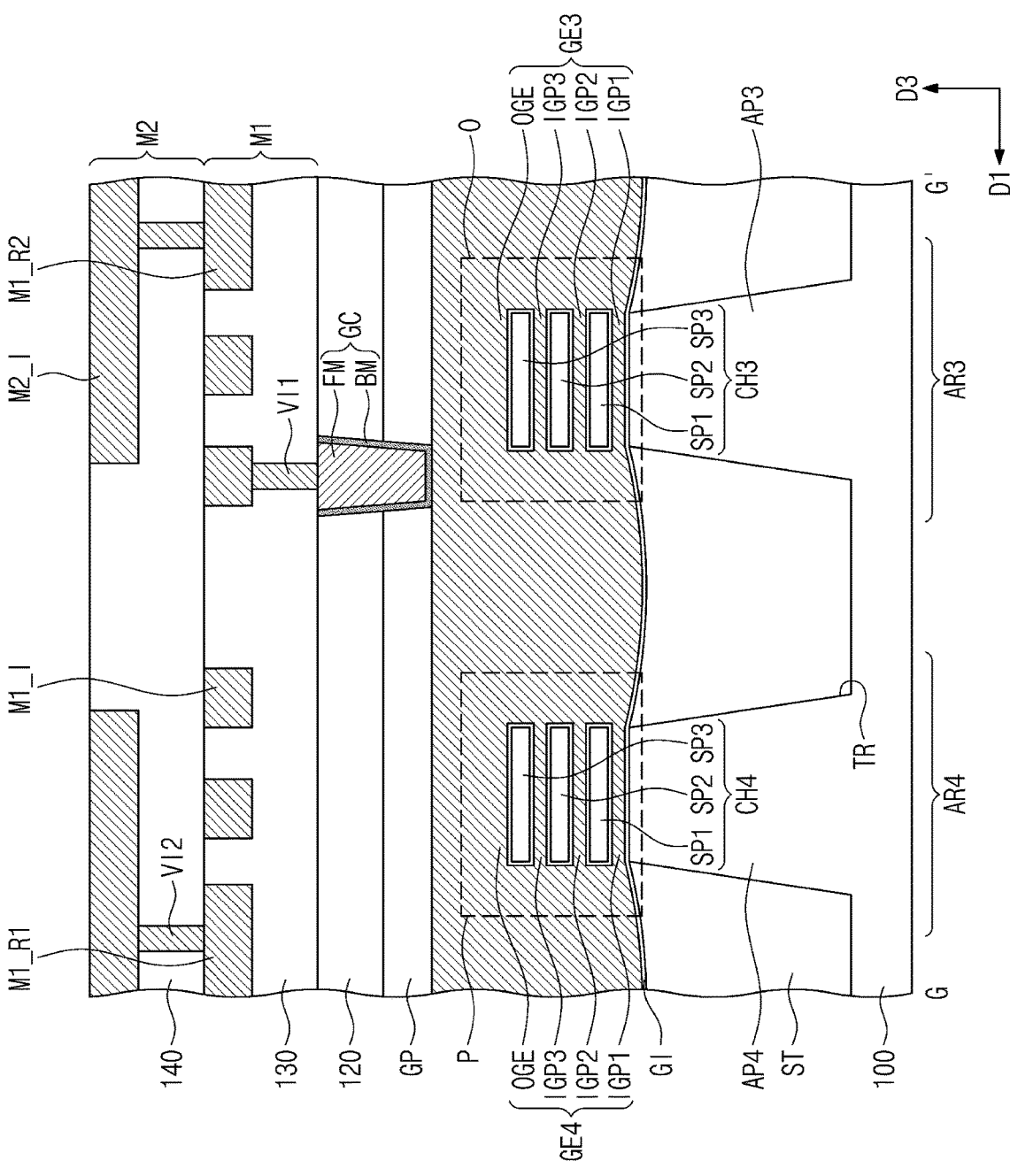

FIGS. 1 to 3 are conceptual diagrams illustrating logic cells of a semiconductor device according to example embodiments.

Referring to FIG. 1, a single height cell SHC may be provided. In detail, a first power line M1_R1 and a second power line M1_R2 may be provided on a substrate 100. The first power line M1_R1 may be a conduction path, to which a source voltage VSS (e.g., a ground voltage) is provided. The second power line M1_R2 may be a conduction path, to which a drain voltage (VDD) (e.g., a power voltage) is provided.

The single height cell SHC may be defined between the first power line M1_R1 and the second power line M1_R2.

The single height cell SHC may include one first active region AR1 and one second active region AR2. One of the first and second active regions AR1 and AR2 may be a PMOSFET region, and the other may be an NMOSFET region. In this regard, the single height cell SHC may have a CMOS structure provided between the first and second power lines M1_R1 and M1_R2.

Each of the first and second active regions AR1 and AR2 may have a first width W1 in a first direction D1. A length of the single height cell SHC in the first direction D1 may be defined as a first height HE1. The first height HE1 may be substantially equal to a distance (e.g., a pitch) between the first and second power lines M1_R1 and M1_R2.

The single height cell SHC may constitute a single logic cell. In the present specification, a logic cell may indicate a logic device (e.g., AND, OR, XOR, XNOR, inverter, and so forth), which is configured to execute a specific function. In this regard, the logic cell may include transistors constituting the logic device and interconnection lines connecting transistors to each other.

Referring to FIG. 2, a double height cell DHC may be provided. In detail, a first power line M1_R1, a second power line M1_R2, and a third power line M1_R3 may be provided on the substrate 100. The first power line M1_R1 may be disposed between the second power line M1_R2 and the third power line M1_R3. The third power line M1_R3 may be a conduction path, to which the source voltage (VSS) is provided.

The double height cell DHC may be defined between the second power line M1_R2 and the third power line M1_R3. The double height cell DHC may include a pair of first active regions AR1 and a pair of second active regions AR2.

One of the pair of second active regions AR2 may be adjacent to the second power line M1_R2. The other of the pair of second active regions AR2 may be adjacent to the third power line M1_R3. The pair of the first active regions AR1 may be adjacent to the first power line M1_R1. When viewed in a plan view, the first power line M1_R1 may be disposed between the first active regions AR1.

A length of the double height cell DHC in the first direction D1 may be defined as a second height HE2. The second height HE2 may be about two times the first height HE1 of FIG. 1. The pair of first active regions AR1 of the double height cell DHC may be combined to serve as a single active region.

In an example embodiment, the double height cell DHC shown in FIG. 2 may be defined as a multi-height cell. Additionally, the multi-height cell may include a triple height cell having a cell height about three times that of the single height cell SHC.

Referring to FIG. 3, a first single height cell SHC1, a second single height cell SHC2, and a double height cell DHC may be two-dimensionally arranged on the substrate 100. The first single height cell SHC1 may be disposed between the first and second power lines M1_R1 and M1_R2. The second single height cell SHC2 may be disposed between the first and third power lines M1_R1 and M1_R3. The second single height cell SHC2 may be adjacent to the first single height cell SHC1 in the first direction D1.

The double height cell DHC may be disposed between the second and third power lines M1_R2 and M1_R3. The double height cell DHC may be adjacent to the first and second single height cells SHC1 and SHC2 in a second direction D2.

A division structure DB may be provided between the first single height cell SHC1 and the double height cell DHC, and between the second single height cell SHC2 and the double height cell DHC. The active region of the double height cell DHC may be electrically separated from the active region of each of the first and second single height cells SHC1 and SHC2 by the division structure DB.

Figure 4:
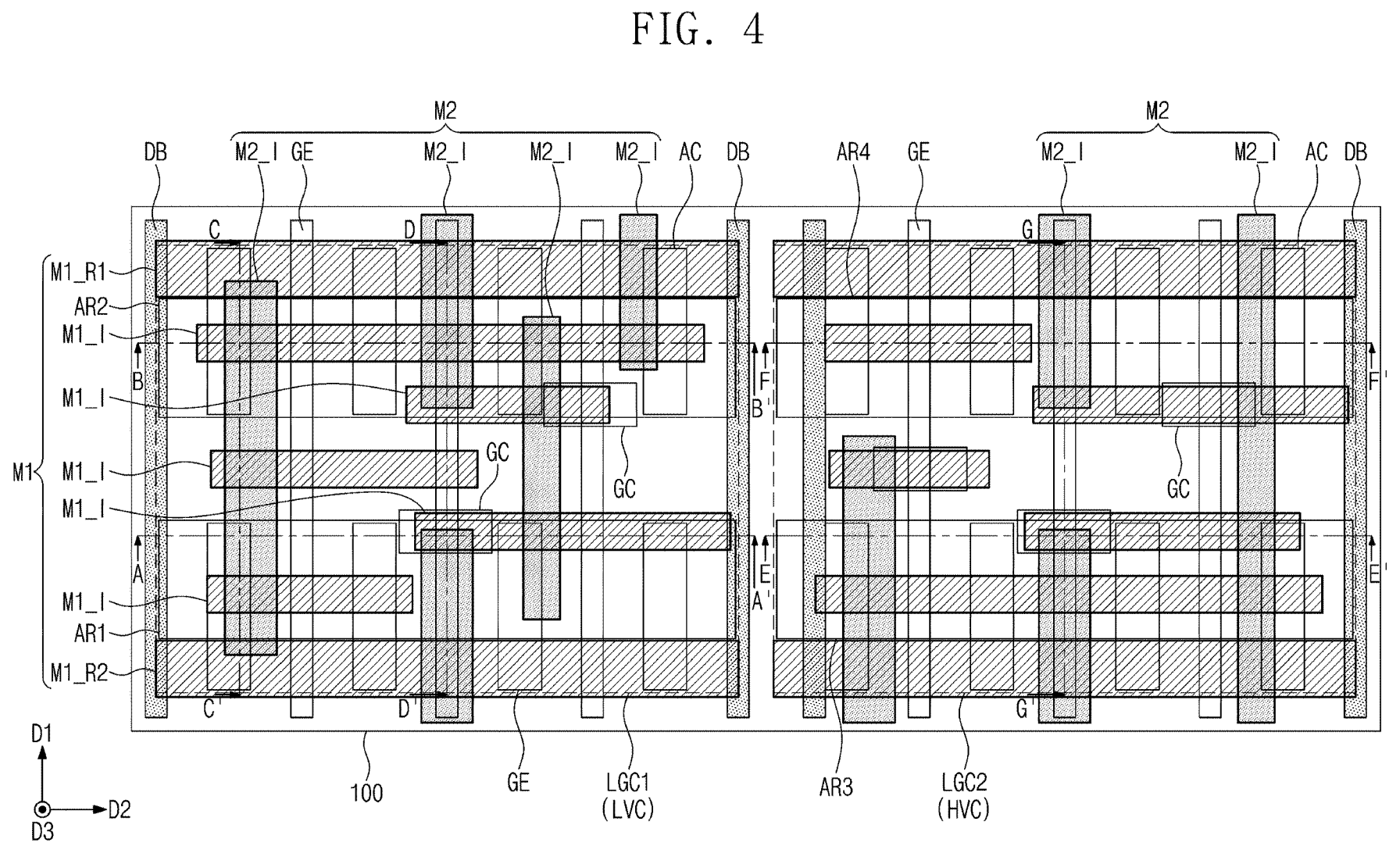
Figure 6A:
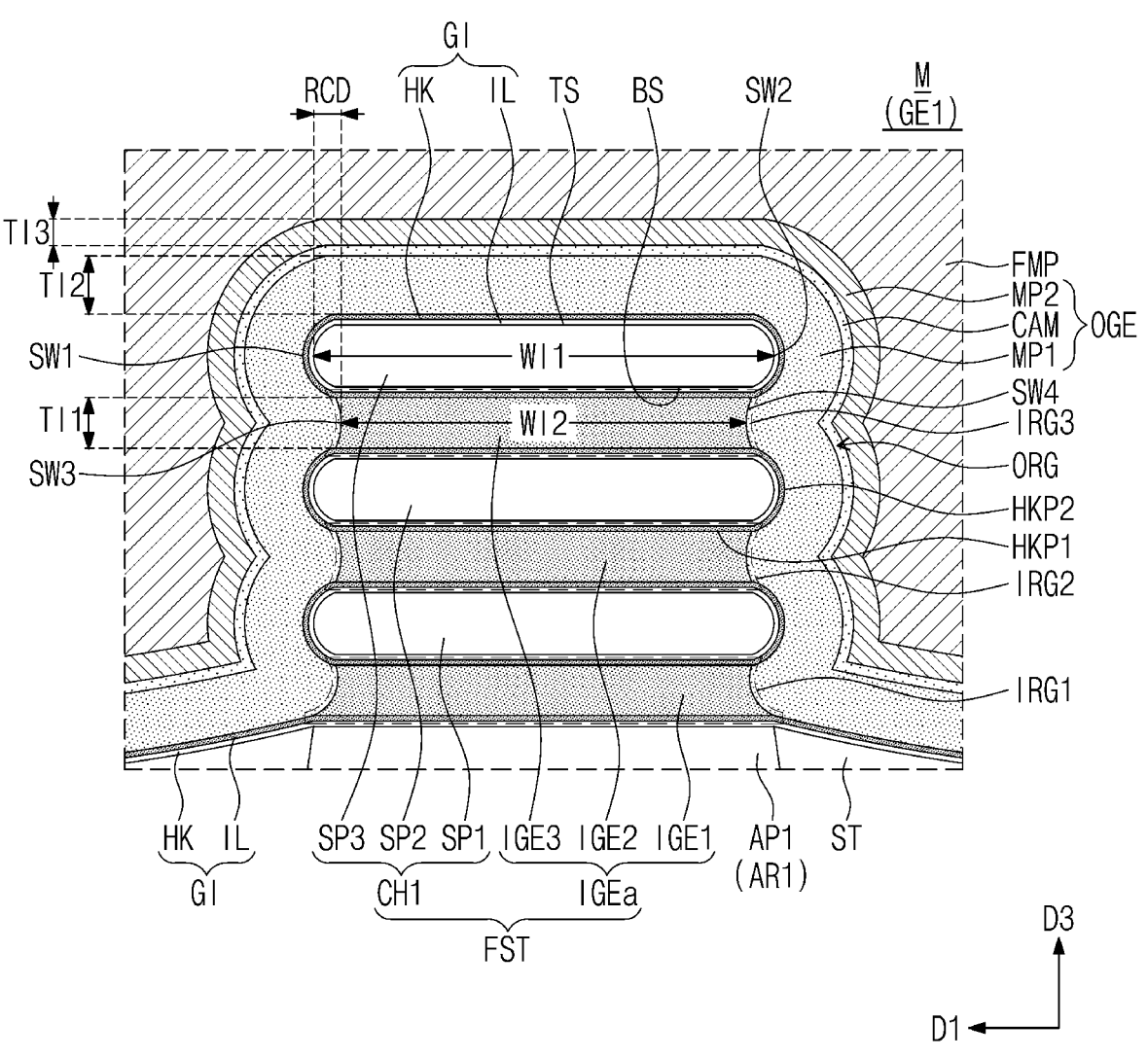
FIG. 6A is an enlarged sectional view illustrating a portion 'M' of FIG. 5D according to an example embodiment.
Figure 6B:
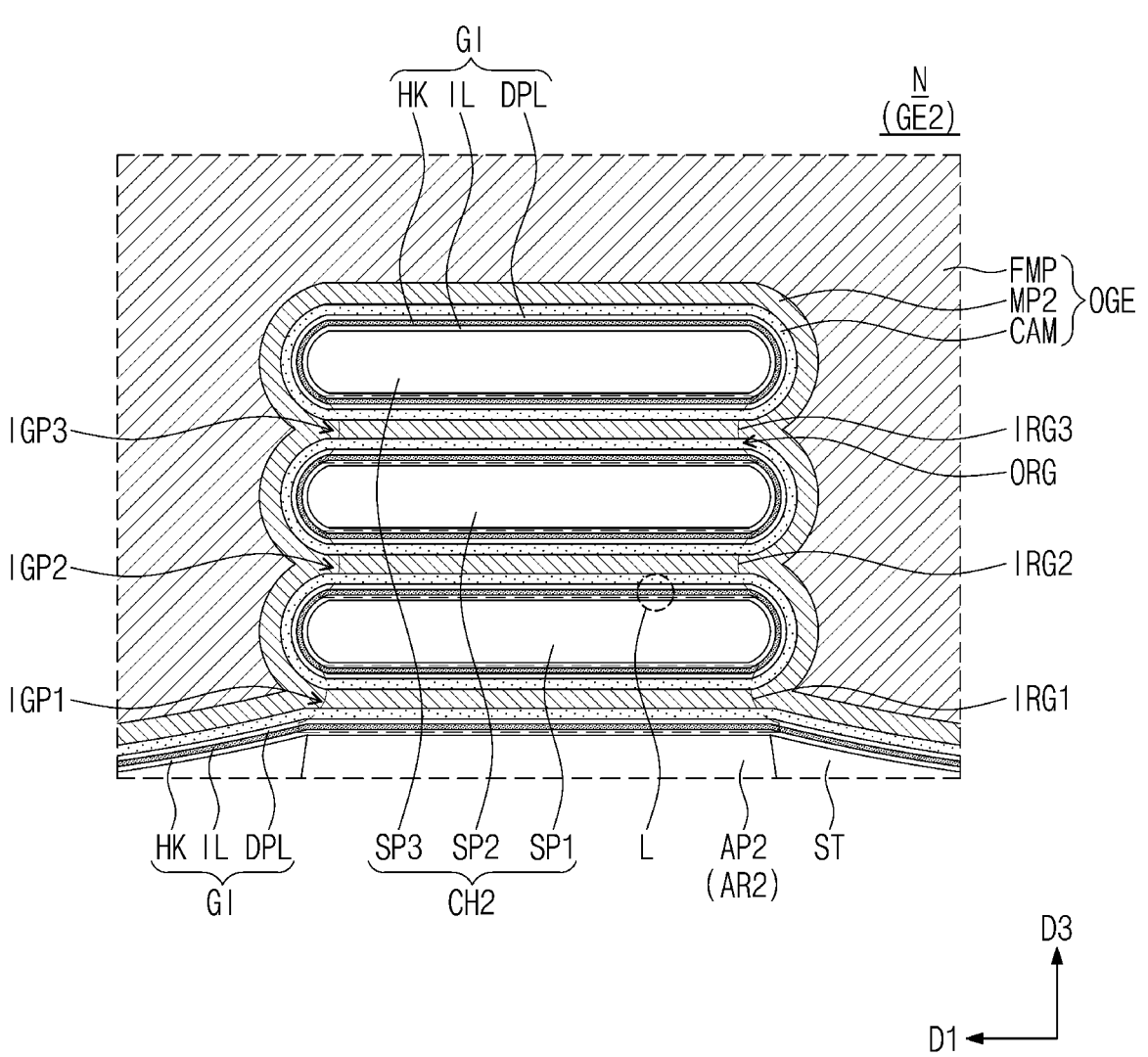
FIG. 6B is an enlarged sectional view illustrating a portion 'N' of FIG. 5D according to an example embodiment.
Figure 6C:
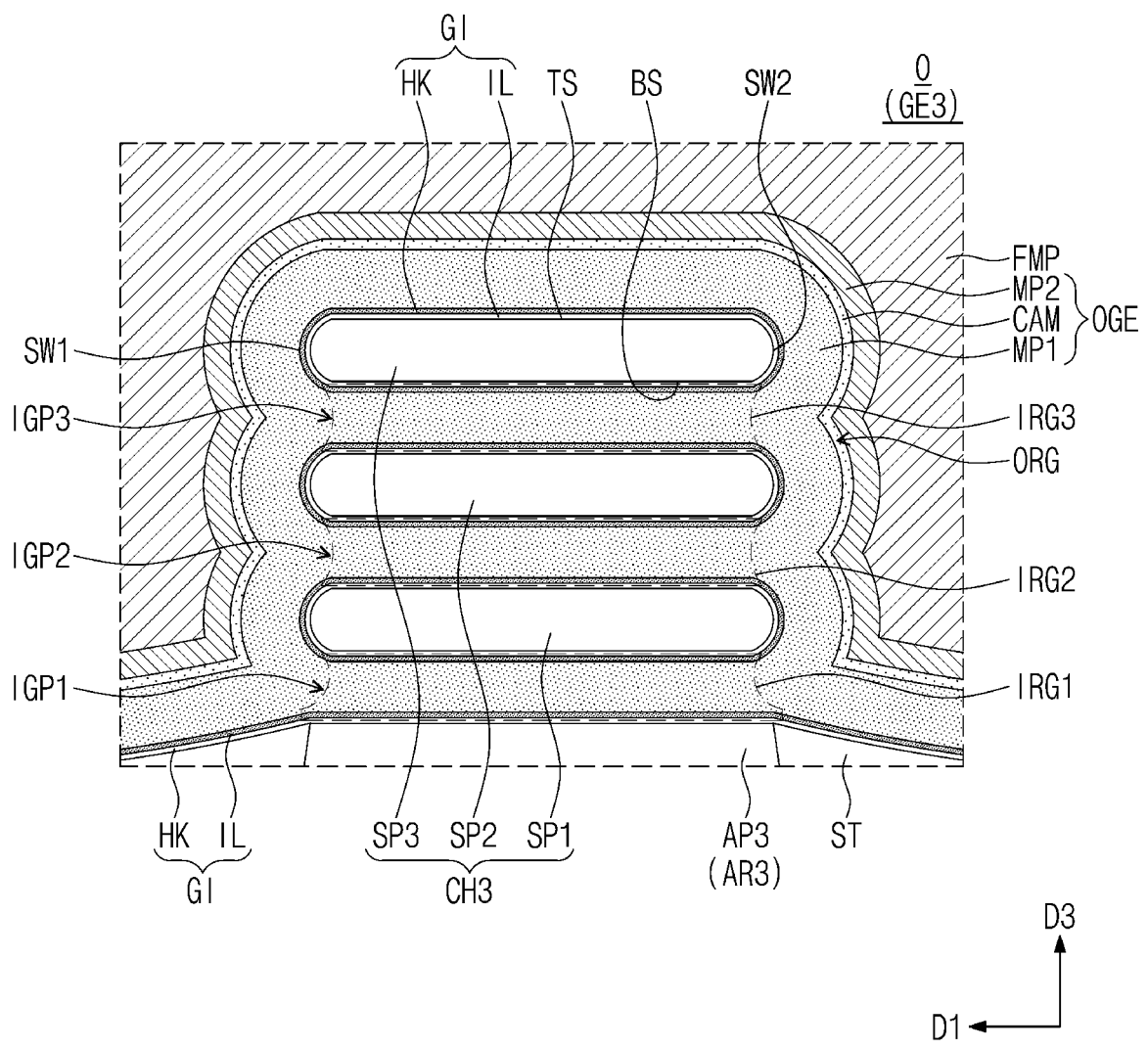
FIG. 6C is an enlarged sectional view illustrating a portion 'O' of FIG. 5G according to an example embodiment.
Figure 6D:
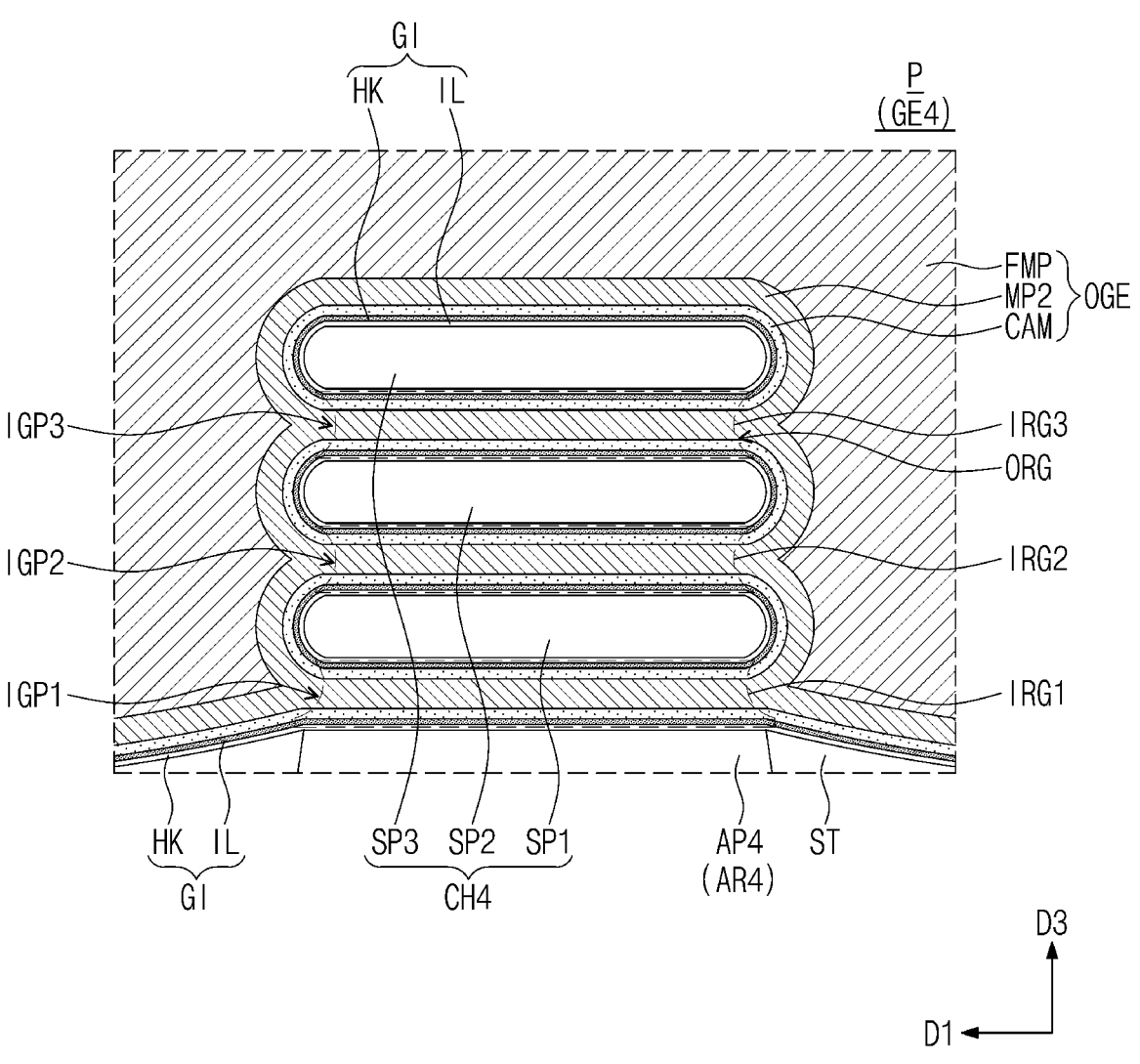
FIG. 6D is an enlarged sectional view illustrating a portion 'P' of FIG. 5G according to an example embodiment.

FIG. 4 is a plan view illustrating a semiconductor device according to an example embodiment. FIGS. 5A to 5G are sectional views taken along lines A-A', B-B', C-C', D-D', E-E', F-F', and G-G', respectively, of FIG. 4. FIG. 6A is an enlarged sectional view illustrating a portion 'M' of FIG. 5D. FIG. 6B is an enlarged sectional view illustrating a portion 'N' of FIG. 5D. FIG. 6C is an enlarged sectional view illustrating a portion 'O' of FIG. 5G. FIG. 6D is an enlarged sectional view illustrating a portion 'P' of FIG. 5G. The semiconductor device of FIGS. 4 and 5A to 5G is an example of the single height cell SHC of FIG. 1.

Referring to FIG. 4 and FIGS. 5A to 5G, a first logic cell LGC1 and a second logic cell LGC2 may be provided on the substrate 100. The first logic cell LGC1 and the second logic cell LGC2 may correspond to two different regions of a semiconductor chip, which are spaced apart from each other or adjacent to each other. Logic transistors constituting a logic circuit may be disposed on each of the first and second logic cells LGC1 and LGC2. In an example embodiment, the first logic cell LGC1 may be a low Vt region LVC, in which logic transistors with low threshold voltage are disposed. The second logic cell LGC2 may be a high Vt region HVC, in which logic transistors with high threshold voltage are disposed.

The substrate 100 may be a semiconductor substrate that is formed of or includes silicon, germanium, silicon germanium, a compound semiconductor material, or the like. In an example embodiment, the substrate 100 may be a silicon wafer.

The first logic cell LGC1 may include the first active region AR1 and the second active region AR2. The first active region AR1 and the second active region AR2 may be spaced apart from each other in the first direction D1. For example, the first active region AR1 may be a PMOSFET region, and the second active region AR2 may be an NMOSFET region.

The second logic cell LGC2 may include a third active region AR3 and a fourth active region AR4. The third active region AR3 and the fourth active region AR4 may be spaced apart from each other in the first direction D1. For example, the third active region AR3 may be a PMOSFET region, and the fourth active region AR4 may be an NMOSFET region.

A first active pattern AP1, a second active pattern AP2, a third active pattern AP3, and a fourth active pattern AP4 may be defined by a trench TR, which is formed in an upper portion of the substrate 100. The first to fourth active patterns AP1 to AP4 may be provided on the first to fourth active regions AR1 to AR4, respectively. The first to fourth active patterns AP1 to AP4 may extend in the second direction D2. Each of the first to fourth active patterns AP1 to AP4 may vertically protrude from the substrate 100.

A device isolation layer ST may be provided to fill the trench TR. The device isolation layer ST may include a silicon oxide layer. The device isolation layer ST may not cover first to fourth channel patterns CH1 to CH4, which will be described below.

A first channel pattern CH1, a second channel pattern CH2, a third channel pattern CH3, and a fourth channel pattern CH4 may be provided on the first to fourth active patterns AP1 to AP4, respectively. Each of the first to fourth channel patterns CH1 to CH4 may include a first semiconductor pattern SP1, a second semiconductor pattern SP2, and a third semiconductor pattern SP3, which are sequentially stacked. The first to third semiconductor patterns SP1, SP2, and SP3 may be spaced apart from each other in a vertical direction (i.e., a third direction D3). The third semiconductor pattern SP3 may be the uppermost semiconductor pattern of the first to third semiconductor patterns SP1, SP2, and SP3.

Each of the first to third semiconductor patterns SP1, SP2, and SP3 may be formed of or include at least one of silicon (Si), germanium (Ge), or silicon germanium (SiGe). For example, each of the first to third semiconductor patterns SP1, SP2, and SP3 may be formed of or include crystalline silicon (more specifically, single crystalline silicon). In an example embodiment, the first to third semiconductor patterns SP1, SP2, and SP3 may be nano sheets which are stacked.

A plurality of first source/drain patterns SD1 may be provided on the first active pattern AP1. A plurality of first recesses RS1 may be formed in an upper portion of the first active pattern AP1. The first source/drain patterns SD1 may be provided in the first recesses RS1, respectively. The first source/drain patterns SD1 may be impurity regions of a first conductivity type (e.g., p-type). The first channel pattern CH1 may be interposed between each pair of the first source/drain patterns SD1. In this regard, each pair of the first source/drain patterns SD1 may be connected to each other by the stacked first to third semiconductor patterns SP1, SP2, and SP3.

A plurality of second source/drain patterns SD2 may be provided on the second active pattern AP2. A plurality of second recesses RS2 may be formed in an upper portion of the second active pattern AP2. The second source/drain patterns SD2 may be provided in the second recesses RS2, respectively. The second source/drain patterns SD2 may be impurity regions of a second conductivity type (e.g., n-type). The second channel pattern CH2 may be interposed between each pair of the second source/drain patterns SD2. In this regard, each pair of the second source/drain patterns SD2 may be connected to each other by the stacked first to third semiconductor patterns SP1, SP2, and SP3.

The first and second source/drain patterns SD1 and SD2 may be epitaxial patterns, which are formed by a selective epitaxial growth (SEG) process. In an example embodiment, each of the first and second source/drain patterns SD1 and SD2 may have a top surface that is higher than a top surface of the third semiconductor pattern SP3. In another example embodiment, a top surface of at least one of the first and second source/drain patterns SD1 and SD2 may be located at substantially the same level as the top surface of the third semiconductor pattern SP3.

In an example embodiment, the first source/drain patterns SD1 may include a semiconductor material (e.g., SiGe) having a lattice constant greater than a lattice constant of a semiconductor material (e.g., Si) of the substrate 100. In this case, the pair of the second source/drain patterns SD2 may exert a compressive stress on the second channel pattern CH2 therebetween. The second source/drain patterns SD2 may be formed of or include the same semiconductor material (e.g., Si) as the substrate 100.

In an example embodiment, a side surface of the first source/drain pattern SD1 may have an uneven shape with recessed portions. In this regard, the side surface of the first source/drain pattern SD1 may have a wavy profile. The side surface of the first source/drain pattern SD1 may protrude toward first to third inner electrodes IGE1, IGE2, and IGE3 of a gate electrode GE to be described below.

A plurality of third source/drain patterns SD3 may be provided on the third active pattern AP3. The third source/ drain patterns SD3 may have a structure substantially similar to the first source/drain patterns SD1 described above. A plurality of fourth source/drain patterns SD4 may be provided on the fourth active pattern AP4. The fourth source/drain patterns SD4 may have a structure substantially similar to the second source/drain patterns SD2 described above.

Gate electrodes GE may be provided on the first logic cell LGC1 to cross the first and second channel patterns CH1 and CH2 and to extend in the first direction D1. Each of the gate electrodes GE may vertically overlap the first and second channel patterns CH1 and CH2. The gate electrodes GE may be provided on the second logic cell LGC2 to cross the third and fourth channel patterns CH3 and CH4 and to extend in the first direction D1. Each of the gate electrodes GE may vertically overlap the third and fourth channel patterns CH3 and CH4. The gate electrodes GE may be arranged at a first pitch in the second direction D2.

Referring back to FIG. 5D, the gate electrode GE may be provided on top, bottom, and opposite side surfaces of each of the first to third semiconductor patterns SP1, SP2, and SP3. In this regard, the transistor may be a three-dimensional field-effect transistor (e.g., multi-bridge channel field-effect transistor (MBCFET)), in which the gate electrode GE is provided to three-dimensionally surround the channel pattern.

In detail, the gate electrodes GE may include a first gate electrode GE1 on the first channel pattern CH1, a second gate electrode GE2 on the second channel pattern CH2, a third gate electrode GE3 on the third channel pattern CH3, and a fourth gate electrode GE4 on the fourth channel pattern CH4.

Referring back to FIG. 5D, the first gate electrode GE1 may include a first inner electrode IGE1 between the first active pattern AP1 and the first semiconductor pattern SP1, a second inner electrode IGE2 between the first semiconductor pattern SP1 and the second semiconductor pattern SP2, and a third inner electrode IGE3 between the second semiconductor pattern SP2 and the third semiconductor pattern SP3. The third inner electrode IGE3 may be the uppermost inner electrode of the first to third inner electrodes IGE1, IGE2, and IGE3. The first gate electrode GE1 may further include an outer gate electrode OGE on the first to third inner electrodes IGE1, IGE2, and IGE3.

The second gate electrode GE2 may include a first inner portion IGP1 between the first active pattern AP1 and the first semiconductor pattern SP1, a second inner portion IGP2 between the first semiconductor pattern SP1 and the second semiconductor pattern SP2, and a third inner portion IGP3 between the second semiconductor pattern SP2 and the third semiconductor pattern SP3. The second gate electrode GE2 may further include the outer gate electrode OGE on the first to third inner portions IGP1, IGP2, and IGP3.

The first and second gate electrodes GE1 and GE2 may be connected to each other to form one gate electrode GE, which extends in the first direction D1. The first and second gate electrodes GE1 and GE2 may share the outer gate electrode OGE.

Referring back to FIG. 5G, the third gate electrode GE3 may include the first to third inner electrodes IGE1, IGE2, and IGE3 and the outer gate electrode OGE. The fourth gate electrode GE4 may include the first to third inner portions IGP1, IGP2, and IGP3 and the outer gate electrode OGE. The third and fourth gate electrodes GE3 and GE4 may be connected to each other to form one gate electrode GE, which extends in the first direction D1. The third and fourth gate electrodes GE3 and GE4 may share the outer gate electrode OGE.

Referring back to FIG. 4 and FIGS. 5A to 5G, a pair of gate spacers GS may be respectively disposed on both side surfaces of the outer gate electrode OGE. The gate spacers GS may extend along the gate electrode GE and in the first direction D1. Top surfaces of the gate spacers GS may be higher than a top surface of the outer gate electrode OGE. The top surfaces of the gate spacers GS may be coplanar with a top surface of a first interlayer insulating layer 110, which will be described below. The gate spacers GS may be formed of or include at least one of SiCN, SiCON, or SiN. In an example embodiment, the gate spacers GS may have a multi-layered structure including at least two layers, each of which is made of SiCN, SiCON, or SiN.

A gate capping pattern GP may be provided on the gate electrode GE. The gate capping pattern GP may extend along the gate electrode GE in the first direction D1. The gate capping pattern GP may be formed of or include a material having an etch selectivity with respect to first and second interlayer insulating layers 110 and 120, which will be described below. In detail, the gate capping pattern GP may be formed of or include at least one of SiON, SiCN, SiCON, or SiN.

Gate insulating layers GI may be respectively interposed between the first to fourth gate electrodes GE1 to GE4 and the first to fourth channel patterns CH1 to CH4. The gate insulating layer GI may cover top, bottom, and opposite side surfaces of each of the first to third semiconductor patterns SP1, SP2, and SP3. The gate insulating layer GI may cover the top surface of the device isolation layer ST below the gate electrode GE (e.g., see FIG. 5D).

In an example embodiment, the gate insulating layer GI may include a silicon oxide layer, a silicon oxynitride layer, and/or a high-k dielectric layer. For example, as illustrated in FIG. 6A, the gate insulating layer GI may have a structure, in which an interface layer IL and a high-k dielectric layer HK are stacked. The interface layer IL may include a silicon oxide layer or a silicon oxynitride layer. The high-k dielectric layer HK may be formed of or include a high-k dielectric material having a dielectric constant higher than silicon oxide. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

In another example embodiment, the semiconductor device may include a negative capacitance (NC) FET using a negative capacitor. For example, the gate insulating layer GI may include a ferroelectric layer exhibiting a ferroelectric property and a paraelectric layer exhibiting a paraelectric property.

The ferroelectric layer may have a negative capacitance, and the paraelectric layer may have a positive capacitance. In the case where two or more capacitors are connected in series and each capacitor has a positive capacitance, a total capacitance may be reduced to a value that is less than a capacitance of each of the capacitors. By contrast, in the case where at least one of serially-connected capacitors has a negative capacitance, a total capacitance of the serially-connected capacitors may have a positive value and may be greater than an absolute value of each capacitance.

In the case where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS), which is less than 60 mV/decade, at room temperature.

The ferroelectric layer may have the ferroelectric property. The ferroelectric layer may be formed of or include at least one of, for example, hafnium oxide, hafnium zirconium oxide, barium strontium titanium oxide, barium titanium oxide, and/or lead zirconium titanium oxide. Here, the hafnium zirconium oxide may be hafnium oxide that is doped with zirconium (Zr). Alternatively, the hafnium zirconium oxide may be a compound composed of hafnium (Hf), zirconium (Zr), and/or oxygen (O).

The ferroelectric layer may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The kind of the dopants in the ferroelectric layer may vary depending on a ferroelectric material included in the ferroelectric layer.

In the case where the ferroelectric layer includes hafnium oxide, the dopants in the ferroelectric layer may include at least one of, for example, gadolinium (Gd), silicon (Si), zirconium (Zr), aluminum (Al), and/or yttrium (Y).

In the case where the dopants are aluminum (Al), a content of aluminum in the ferroelectric layer may range from 3 to 8 at % (atomic percentage). Here, the content of the dopants (e.g., aluminum atoms) may be a ratio of the number of aluminum atoms to the number of hafnium and aluminum atoms.

In the case where the dopants are silicon (Si), a content of silicon in the ferroelectric layer may range from 2 at % to 10 at %. In the case where the dopants are yttrium (Y), a content of yttrium in the ferroelectric layer may range from 2 at % to 10 at %. In the case where the dopants are gadolinium (Gd), a content of gadolinium in the ferroelectric layer may range from 1 at % to 7 at %. In the case where the dopants are zirconium (Zr), a content of zirconium in the ferroelectric layer may range from 50 at % to 80 at %.

The paraelectric layer may have the paraelectric property. The paraelectric layer may be formed of or include at least one of, for example, silicon oxide and/or high-k metal oxides. The metal oxides, which can be used as the paraelectric layer, may include at least one of, for example, hafnium oxide, zirconium oxide, and/or aluminum oxide, but example embodiments are not limited thereto.

The ferroelectric layer and the paraelectric layer may be formed of or include the same material. The ferroelectric layer may have the ferroelectric property, but the paraelectric layer may not have the ferroelectric property. For example, in the case where the ferroelectric and paraelectric layers contain hafnium oxide, a crystal structure of the hafnium oxide in the ferroelectric layer may be different from a crystal structure of the hafnium oxide in the paraelectric layer.

The ferroelectric layer may exhibit the ferroelectric property, only when its thickness is in a specific range. In an example embodiment, the ferroelectric layer may have a thickness ranging from 0.5 to 10 nm, but example embodiments are not limited thereto. Because a critical thickness associated with the occurrence of the ferroelectric property varies depending on the kind of the ferroelectric material, the thickness of the ferroelectric layer may be changed depending on the kind of the ferroelectric material.

As an example, the gate insulating layer GI may include a single ferroelectric layer. As another example, the gate insulating layer GI may include a plurality of ferroelectric layers spaced apart from each other. The gate insulating layer GI may have a multi-layered structure, in which a plurality of ferroelectric layers and a plurality of paraelectric layers are alternately stacked.

Referring back to FIG. 5B, inner spacers ISP may be provided on the second active region AR2 to be respectively interposed between the first to third inner portions IGP1, IGP2, and IGP3 of the second gate electrode GE2 and the second source/drain pattern SD2. Each of the first to third inner portions IGP1, IGP2, and IGP3 of the second gate electrode GE2 may be spaced apart from the second source/drain pattern SD2 with the inner spacer ISP interposed therebetween. The inner spacer ISP may prevent a leakage current between the second gate electrode GE2 and the second source/drain pattern SD2.

Referring back to FIG. 5F, the inner spacers ISP may also be provided on the fourth active region AR4. The inner spacers ISP on the fourth active region AR4 may be respectively interposed between the first to third inner portions IGP1, IGP2, and IGP3 of the fourth gate electrode GE4 and the fourth source/drain pattern SD4.

Referring back to FIG. 4 and FIGS. 5A to 5G, a first interlayer insulating layer 110 may be provided on the substrate 100. The first interlayer insulating layer 110 may cover the gate spacers GS and the first to fourth source/drain patterns SD1-SD4. The first interlayer insulating layer 110 may have a top surface that is substantially coplanar with the top surface of the gate capping pattern GP and the top surface of the gate spacer GS. A second interlayer insulating layer 120 may be disposed on the first interlayer insulating layer 110 to cover the gate capping pattern GP. As an example, at least one of the first and second interlayer insulating layers 110 and 120 may include a silicon oxide layer.

A pair of division structures DB may be provided at both sides of each of the first and second logic cells LGC1 and LGC2 to be opposite to each other in the second direction D2. The division structure DB may extend in the first direction D1 to be parallel to the gate electrodes GE. A pitch between the division structure DB and the gate electrode GE, which are adjacent to each other, may be equal to the first pitch.

The division structure DB may be provided to penetrate the first and second interlayer insulating layers 110 and 120 and may extend into the active pattern AP1-AP4. The division structure DB may penetrate the channel pattern CH1-CH4. The division structure DB may separate the active region AR1-AR4 of each of the first and second logic cells LGC1 and LGC2 from the active region of a neighboring logic cell.

Active contacts AC may be provided to penetrate the first and second interlayer insulating layers 110 and 120, and to be electrically connected to the first to fourth source/drain patterns SD1-SD4, respectively. A pair of the active contacts AC may be respectively provided at both sides of the gate electrode GE. When viewed in a plan view, the active contact AC may be a bar-shaped pattern which extends in the first direction D1.

The active contact AC may be a self-aligned contact. For example, the active contact AC may be formed by a self-alignment process using the gate capping pattern GP and the gate spacer GS. For example, the active contact AC may cover at least a portion of the side surface of the gate spacer GS. Additionally, the active contact AC may cover a portion of the top surface of the gate capping pattern GP.

A metal-semiconductor compound layer SC (e.g., a silicide layer) may be interposed between the active contact AC and the source/drain pattern SD1-SD4. The active contact AC may be electrically connected to the source/drain pattern SD1-SD4 via the metal-semiconductor compound layer SC. For example, the metal-semiconductor compound layer SC may be formed of or include at least one of titanium silicide, tantalum silicide, tungsten silicide, nickel silicide, or cobalt silicide.

A gate contact GC may be provided to penetrate the second interlayer insulating layer 120 and the gate capping pattern GP, and to be electrically connected to the gate electrode GE. As an example, referring to FIG. 5A, an upper region of each of the active contacts AC adjacent to the gate contact GC may be filled with an upper insulating pattern UIP. Accordingly, it may be possible to prevent a process failure (e.g., a short circuit), which may occur when the gate contact GC is in contact with the active contact AC adjacent thereto.

Each of the active and gate contacts AC and GC may include a conductive pattern FM and a barrier pattern BM enclosing the conductive pattern FM. For example, the conductive pattern FM may be formed of or include at least one of metallic materials (e.g., aluminum, copper, tungsten, molybdenum, and cobalt). The barrier pattern BM may be provided to cover side and bottom surfaces of the conductive pattern FM. In an example embodiment, the barrier pattern BM may include a metal layer and a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

A first metal layer M1 may be provided in a third interlayer insulating layer 130. For example, the first metal layer M1 may include the first power line M1_R1, the second power line M1_R2, and first interconnection lines M1_I. Each of the interconnection lines M1_R1, M1_R2, and M1_I of the first metal layer M1 may extend in the second direction D2 and parallel to each other.

The first and second power lines M1_R1 and M1_R2 may be provided on borders of each of the first and second logic cells LGC1 and LGC2. Each of the first and second power lines M1_R1 and M1_R2 may extend along the border and in the second direction D2.

The first interconnection lines M1_I of the first metal layer M1 may be disposed between the first and second power lines M1_R1 and M1_R2. The first interconnection lines M1_I of the first metal layer M1 may be arranged at a second pitch in the first direction D1. The second pitch may be smaller than the first pitch. A linewidth of each of the first interconnection lines M1_I may be smaller than a linewidth of each of the first and second power lines M1_R1 and M1_R2.

The first metal layer M1 may further include first vias VI1. The first vias VI1 may be respectively disposed below the interconnection lines M1_R1, M1_R2, and M1_I of the first metal layer M1. The active contact AC and the interconnection line of the first metal layer M1 may be electrically connected to each other through the first via VI1. The gate contact GC and the interconnection line of the first metal layer M1 may be electrically connected to each other through the first via VI1.

The interconnection line of the first metal layer M1 and the first via VI1 thereunder may be independently formed by separate processes. For example, the interconnection line and the first via VI1 of the first metal layer M1 may be independently formed by respective single damascene processes. The semiconductor device may be fabricated using a sub-20 nm process.

A second metal layer M2 may be provided in a fourth interlayer insulating layer 140. The second metal layer M2 may include a plurality of second interconnection lines M2_I. Each of the second interconnection lines M2_I of the second metal layer M2 may be a line- or bar-shaped pattern that extends in the first direction D1. In this regard, the second interconnection lines M2_I may extend in the first direction D1 and parallel to each other.

The second metal layer M2 may further include second vias VI2, which are respectively provided below the second interconnection lines M2_I. The interconnection lines of the first and second metal layers M1 and M2 may be electrically connected to each other through the second via VI2. The interconnection line of the second metal layer M2 and the second via VI2 thereunder may be formed together by a dual damascene process.

The interconnection lines of the first metal layer M1 may be formed of or include a conductive material that is the same as or different from those of the second metal layer M2. For example, the interconnection lines of the first and second metal layers M1 and M2 may be formed of or include at least one of metallic materials (e.g., aluminum, copper, tungsten, ruthenium, molybdenum, and cobalt).

In an example embodiment, a plurality of metal layers (e.g., M3, M4, M5, and so forth) may be additionally stacked on the fourth interlayer insulating layer 140. Each of the stacked metal layers may include interconnection lines, which are used as routing paths between cells.

The first gate electrode GE1 on the first active region AR1 will be described in more detail with reference to FIG. 6A. The gate insulating layer GI may be provided to cover a surface of each of the first to third semiconductor patterns SP1 to SP3. The gate insulating layer GI may include the interface layer IL and the high-k dielectric layer HK on the interface layer IL. The interface layer IL may be provided to directly cover a surface of each of the first to third semiconductor patterns SP1-SP3. The high-k dielectric layer HK may be spaced apart from the first to third semiconductor patterns SP1-SP3 with the interface layer IL interposed therebetween. A thickness of the high-k dielectric layer HK may be greater than a thickness of the interface layer IL.

The first gate electrode GE1 may include a first inner gate electrode IGEa and the outer gate electrode OGE on the first inner gate electrode IGEa. A first inner region IRG1 may be defined between the first active pattern AP1 and the first semiconductor pattern SP1, a second inner region IRG2 may be defined between the first semiconductor pattern SP1 and the second semiconductor pattern SP2, and a third inner region IRG3 may be defined between the second semiconductor pattern SP2 and the third semiconductor pattern SP3. The first to third inner electrodes IGE1, IGE2, and IGE3 may be provided in the first to third inner regions IRG1, IRG2, and IRG3, respectively. The first to third inner electrodes IGE1, IGE2, and IGE3 may be provided on the gate insulating layer GI.

The first to third inner electrodes IGE1, IGE2, and IGE3 may be formed of or include the same material. The first inner gate electrode IGEa may include a first work-function metal, which is used to adjust a threshold voltage of a transistor. By adjusting a composition of the first work-function metal, it may be possible to realize a transistor having a desired threshold voltage. As an example, the first work-function metal may be a p-type work-function metal having a relatively high work-function.

In an example embodiment, the first inner gate electrode IGEa may include a metal nitride layer. The first inner gate electrode IGEa may be formed of or include at least one metal, which is selected from the group consisting of titanium (Ti), tantalum (Ta), niobium (Nb), aluminum (Al), tungsten (W) and molybdenum (Mo), and nitrogen (N). For example, the first inner gate electrode IGEa may be formed of or include at least one of titanium nitride (TiN), tantalum nitride (TaN), titanium oxynitride (TiON), titanium silicon nitride (TiSiN), titanium aluminum nitride (TiAlN), tungsten carbon nitride (WCN), or molybdenum nitride (MoN).

In an example embodiment, the first inner gate electrode IGEa may be formed of or include at least one of metal oxynitride materials, metal oxycarbide materials, or metal oxynitride carbide materials. Here, the metal may be one that is selected from the group consisting of Ti, Ta, Nb, Al, W, and Mo.

In an example embodiment, the third inner electrode IGE3 may be adjacent to a bottom surface BS of the third semiconductor pattern SP3. A first side surface SW1 of the third semiconductor pattern SP3 may protrude horizontally relative to a third side surface SW3 of the third inner electrode IGE3. A second side surface SW2 of the third semiconductor pattern SP3 may protrude horizontally relative to a fourth side surface SW4 of the third inner electrode IGE3. For example, the third side surface SW3 may be formed to have a recess depth RCD from the first side surface SW1. The recess depth RCD may range from about 2 nm to about 5 nm. A first width WI1 of the third semiconductor pattern SP3 in the first direction D1 may be greater than a second width WI2 of the third inner electrode IGE3 in the first direction D1.

The first to third inner electrodes IGE1, IGE2, and IGE3 of the first gate electrode GE1 and the first to third semiconductor patterns SP1, SP2, and SP3 of the first channel pattern CH1 may constitute a fin structure FST. In this regard, the fin structure FST may include the first to third inner electrodes IGE1, IGE2, and IGE3 and the first to third semiconductor patterns SP1, SP2, and SP3, which are alternately stacked. The fin structure FST may have a fin-shaped structure protruding from the first active pattern AP1 in a vertical direction (i.e., the third direction D3). Due to the protrusion of the fin structure FST, at least a portion of the fin structure FST may be located at a level higher than the top surface of the device isolation layer ST.

A remaining region, which encloses the fin structure FST, may be referred to as an outer region ORG. The outer gate electrode OGE may be provided in the outer region ORG. The outer gate electrode OGE on the first active region AR1 may be provided to enclose the fin structure FST. For example, the outer gate electrode OGE may be provided on both side surfaces and a top surface of the fin structure FST. In this regard, the outer gate electrode OGE may not be provided in spaces between adjacent ones of the first to third semiconductor patterns SP1, SP2, and SP3.

The outer gate electrode OGE may include a first metal pattern MP1, a capping pattern CAM, a second metal pattern MP2, and a fill metal pattern FMP, which are sequentially stacked. The first metal pattern MP1 may be provided to conformally cover a surface of the fin structure FST. The first metal pattern MP1 may directly cover the exposed high-k dielectric layer HK and the exposed side surfaces SW3 and SW4 of the first inner gate electrode IGEa of the fin structure FST.

The capping pattern CAM may cover the first metal pattern MP1. The second metal pattern MP2 may be provided on the capping pattern CAM and thus may be spaced apart from the first metal pattern MP1 by the capping pattern CAM.

The first metal pattern MP1 may include a first work-function metal, which is used to adjust a threshold voltage of a transistor. By adjusting a composition of the first work-function metal, it may be possible to realize a transistor having a desired threshold voltage. As an example, the first work-function metal may be a p-type work-function metal having a relatively high work-function. The first metal pattern MP1 may be formed of or include at least one of metal nitride materials, metal oxynitride materials, metal oxycarbide materials, or metal oxynitride carbide materials. Here, the metal may be one that is selected from the group consisting of Ti, Ta, Nb, Al, W, and Mo.

A work-function of the first metal pattern MP1 may be smaller than a work-function of the first inner gate electrode IGEa. In this regard, the first metal pattern MP1 may be controlled to have a composition different from the first inner gate electrode IGEa.

In an example embodiment, the first metal pattern MP1 may contain aluminum (Al) or silicon (Si). Here, a concentration of aluminum (Al) or silicon (Si) in the first metal pattern MP1 may be higher than a concentration of aluminum (Al) or silicon (Si) in the first inner gate electrode IGEa. For example, the concentration of aluminum (Al) or silicon (Si) in the first metal pattern MP1 may be higher than the concentration of aluminum (Al) or silicon (Si) in the first inner gate electrode IGEa by 3 at % to 25 at %.

As an example, the first metal pattern MP1 may be formed of or include titanium silicon nitride (TiSiN) or titanium aluminum nitride (TiAlN), and the first inner gate electrode IGEa may be formed of or include titanium nitride (TiN). As another example, each of the first metal pattern MP1 and the first inner gate electrode IGEa may be formed of or include titanium silicon nitride (TiSiN) or titanium aluminum nitride (TiAlN). Here, the concentration of aluminum (Al) or silicon (Si) in the first metal pattern MP1 may be higher than the concentration of aluminum (Al) or silicon (Si) in the first inner gate electrode IGEa.

In an example embodiment, the first metal pattern MP1 may be provided on a top surface TS and both side surfaces SW1 and SW2 of the third semiconductor pattern SP3. As described above, the third inner electrode IGE3 may be provided on the bottom surface BS of the third semiconductor pattern SP3. The first metal pattern MP1 may cover both side surfaces SW3 and SW4 of the third inner electrode IGE3. The first metal pattern MP1 may be in direct contact with both side surfaces SW3 and SW4 of the third inner electrode IGE3.

The third inner electrode IGE3 may have a first thickness TI1 in the third direction D3. The first metal pattern MP1 on the top surface TS of the third semiconductor pattern SP3 may have a second thickness TI2 in the third direction D3. As an example, the second thickness TI2 may be greater than the first thickness TI1.

The high-k dielectric layer HK may include a first portion HKP1 covering the top and bottom surfaces TS and BS of the semiconductor pattern SP1-SP3 and a second portion HKP2 covering both side surfaces SW1 and SW2 of the semiconductor pattern SP1-SP3. The first portion HKP1 may be in direct contact with the first inner gate electrode IGEa. The second portion HKP2 may be in direct contact with the first metal pattern MP1.

The capping pattern CAM may be a capping layer interposed between the first metal pattern MP1 and the second metal pattern MP2. The capping pattern CAM may include a metal nitride layer. The capping pattern CAM may be formed of or include at least one metal, which is selected from the group consisting of titanium (Ti), tantalum (Ta), aluminum (Al), tungsten (W) and molybdenum (Mo), and nitrogen (N). For example, the capping pattern CAM may be formed of or include TiN.

The second metal pattern MP2 may be provided on the capping pattern CAM. The second metal pattern MP2 may include a second work-function metal, which may be used to adjust a threshold voltage of a transistor. By adjusting a composition of the second work-function metal, it may be possible to realize a transistor having a desired threshold voltage. As an example, the second work-function metal may be an n-type work-function metal having a relatively low work-function.

The second metal pattern MP2 may be formed of or include at least one of metal carbides. The second metal pattern MP2 may be formed of or include at least one of metal carbides that are doped with silicon and/or aluminum and contain silicon and/or aluminum. As an example, the second metal pattern MP2 may be formed of or include aluminum-doped titanium carbide (TiAlC), aluminum-doped tantalum carbide (TaAlC), aluminum-doped vanadium carbide (VAlC), silicon-doped titanium carbide (TiSiC), or silicon-doped tantalum carbide (TaSiC). As another example, the second metal pattern MP2 may be formed of or include titanium carbide (TiAlSiC), which is doped with aluminum and silicon, or tantalum carbide (TaAlSiC), which is doped with aluminum and silicon. As other example, the second metal pattern MP2 may be formed of or include aluminum-doped titanium (TiAl). As still other example, the second metal pattern MP2 may be formed of or include a metal nitride doped with silicon and/or aluminum (e.g., aluminum-doped titanium nitride (TiAlN)).

A work-function of the second metal pattern MP2 may be controlled by adjusting a doping concentration of dopants or impurities (e.g., silicon or aluminum) contained in the second metal pattern MP2. As an example, the concentration of the impurity (e.g., silicon or aluminum) in the second metal pattern MP2 may range from 0.1 at % to 25 at %.

The second metal pattern MP2, along with the first metal pattern MP1, may be provided on the top surface and both side surfaces of the fin structure FST. The second metal pattern MP2 on the top surface of the fin structure FST may have a third thickness TI3 in the third direction D3. For example, the third thickness TI3 may be smaller than the second thickness TI2 described above.

The fill metal pattern FMP may be provided on the second metal pattern MP2. The fill metal pattern FMP may have an electric resistance that is lower than the first and second metal patterns MP1 and MP2. As an example, the fill metal pattern FMP may be formed of or include at least one of low resistance metals (e.g., aluminum (Al), tungsten (W), titanium (Ti), and tantalum (Ta)).

The third gate electrode GE3 on the third active region AR3 will be described in more detail with reference to FIG. 6C. The third gate electrode GE3 may include a second inner gate electrode IGEb and the outer gate electrode OGE on the second inner gate electrode IGEb. The outer gate electrode OGE may include the first metal pattern MP1, the capping pattern CAM, the second metal pattern MP2, and the fill metal pattern FMP, which are sequentially stacked. The first metal pattern MP1, the capping pattern CAM, the second metal pattern MP2, and the fill metal pattern FMP may be configured to have substantially the same features as those described above with reference to FIG. 6A.

The second inner gate electrode IGEb may include the first to third inner electrodes IGE1, IGE2, and IGE3, which are provided to fill the first to third inner regions IRG1, IRG2, and IRG3, respectively.

Unlike the first inner gate electrode IGEa described above, the second inner gate electrode IGEb may be formed of or include the same material as the first metal pattern MP1. In this regard, the second inner gate electrode IGEb may be a portion of the first metal pattern MP1. A composition of the second inner gate electrode IGEb may be the same as a composition of the first metal pattern MP1. A work-function of the second inner gate electrode IGEb may be equal to the work-function of the first metal pattern MP1.

For example, the first metal pattern MP1 may be provided on the top surface TS, the bottom surface BS, and both side surfaces SW1 and SW2 of the third semiconductor pattern SP3. In this regard, the first metal pattern MP1 of the third gate electrode GE3 may be provided to enclose not only the top surface TS and both side surfaces SW1 and SW2 of the third semiconductor pattern SP3 but also the bottom surface BS. A portion of the first metal pattern MP1 of the third gate electrode GE3 may be included in the outer gate electrode OGE, and the remaining portion of the third gate electrode GE3 may be included in the second inner gate electrode IGEb.

A threshold voltage of a PMOSFET on the third active region AR3 shown in FIG. 6C may be greater than a threshold voltage of a PMOSFET on the first active region AR1 shown in FIG. 6A. Materials of the first and second inner gate electrodes IGEa and IGEb may have different compositions. Accordingly, the work-function of the first inner gate electrode IGEa on the first active region AR1 may be greater than a work-function of the second inner gate electrode IGEb on the second active region AR2. As a result, the PMOSFET on the first active region AR1 may be controlled to have a threshold voltage that is lower than that of the PMOSFET on the third active region AR3.

The fourth gate electrode GE4 on the fourth active region AR4 will be described in more detail with reference to FIG. 6D. The fourth gate electrode GE4 may include the capping pattern CAM, the second metal pattern MP2, and the fill metal pattern FMP, which are sequentially stacked. The capping pattern CAM, the second metal pattern MP2, and the fill metal pattern FMP may be provided to have substantially the same features as those described with reference to FIG. 6A. Unlike the first and third gate electrodes GE1 and GE3, the first metal pattern MP1, which is a p-type work-function metal, may be omitted from the fourth gate electrode GE4.

The capping pattern CAM and the second metal pattern MP2 of the fourth gate electrode GE4 may fill the first to third inner regions IRG1, IRG2, and IRG3. Thus, the capping pattern CAM and the second metal pattern MP2 filling the first to third inner regions IRG1, IRG2, and IRG3 may constitute each of the first to third inner portions IGP1, IGP2, and IGP3 of the fourth gate electrode GE4.

The second gate electrode GE2 on the second active region AR2 will be described in more detail with reference to FIG. 6B. The second gate electrode GE2 may have substantially the same structure as the fourth gate electrode GE4 described above. The gate insulating layer GI on the second active region AR2 may further include a dipole layer DPL on the high-k dielectric layer HK. The dipole layer DPL may include an oxide material containing a dipole element. The dipole element may include lanthanum (La), aluminum (Al), or combinations thereof. For example, the dipole layer DPL may be formed of or include lanthanum oxide (LaO), aluminum oxide (AlO), or combinations thereof.

The dipole layer DPL may be formed to have a very thin thickness, and thus, the presence of the dipole layer DPL may not be identifiable from an electron microscope image. The dipole element in the dipole layer DPL may be diffused into the gate insulating layer GI. In this case, the gate insulating layer GI on the second active region AR2 may contain lanthanum (La), aluminum (Al), or combinations thereof as an impurity.

The gate insulating layer GI on the second active region AR2 may include a dipole-interface, which is formed between the high-k dielectric layer HK and the interface layer IL by the dipole element. In the case where the gate insulating layer GI contains lanthanum (La), an effective work-function of the second gate electrode GE2 may be lowered. In the case where the gate insulating layer GI contains aluminum (Al), the effective work-function of the second gate electrode GE2 may be increased. In an example embodiment, the gate insulating layer GI on the second active region AR2 may contain lanthanum (La) serving as a low work-function dipole element.

Figure 6E:
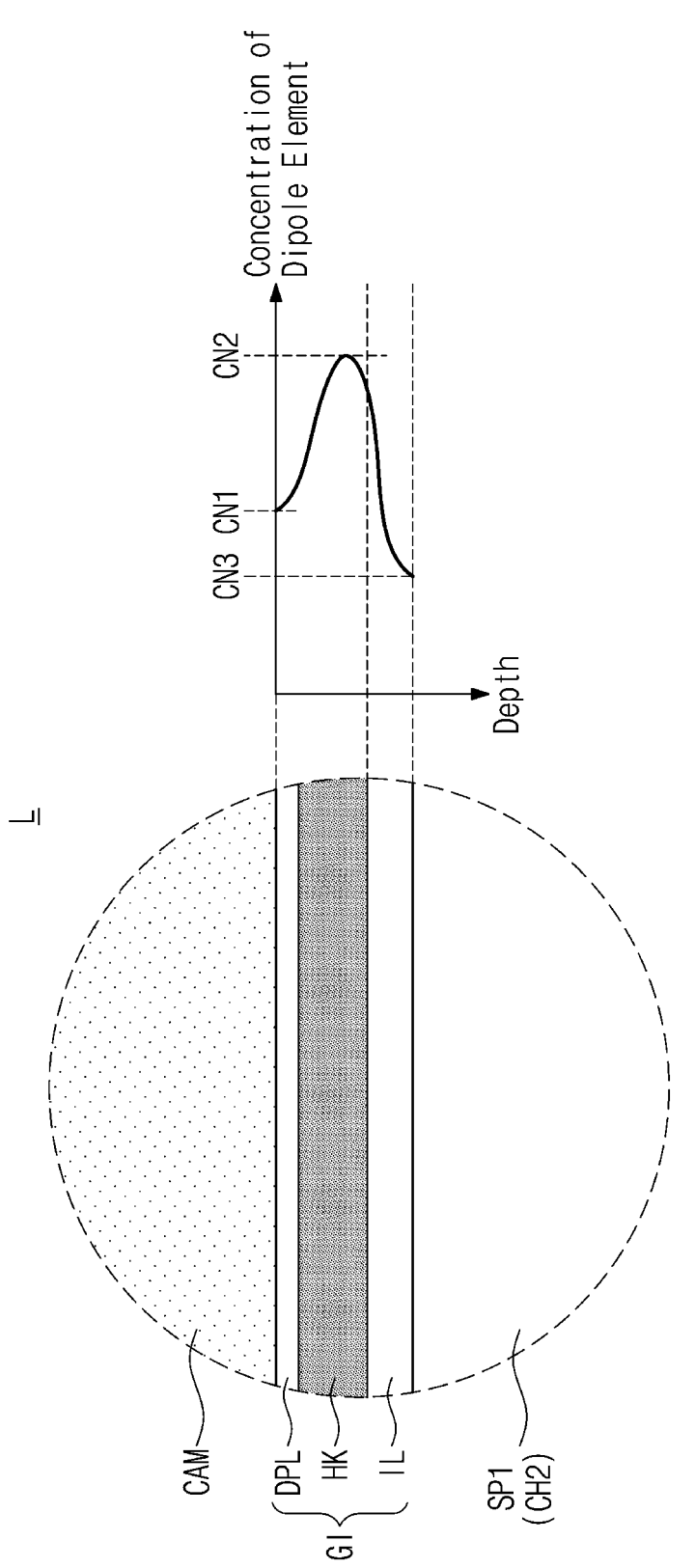
FIG. 6E is an enlarged sectional view of portion 'L' of FIG. 6B and a concentration profile of a dipole element in a gate insulating layer according to an example embodiment.

The sectional view of FIG. 6E illustrates an enlarged structure of a portion 'L' of FIG. 6B. In addition, a concentration profile of the dipole element in the gate insulating layer GI is illustrated in FIG. 6E. Referring to FIG. 6E, a concentration of the dipole element in the dipole layer DPL may be a first concentration CN1. The concentration of the dipole element may increase from the dipole layer DPL toward a lower portion of the high-k dielectric layer HK. The high-k dielectric layer HK may have a second concentration CN2 that is the highest concentration of the dipole element. The dipole concentration may decrease from the lower portion of the high-k dielectric layer HK toward a lower portion of the interface layer IL and may have a third concentration CN3, which is the lowest concentration, at the bottom of the interface layer IL.

A threshold voltage of an NMOSFET on the fourth active region AR4 shown in FIG. 6D may be greater than a threshold voltage of an NMOSFET on the second active region AR2 shown in FIG. 6B. Because the dipole layer DPL containing the low work-function dipole element is additionally provided on the second active region AR2, the NMOSFET on the second active region AR2 may be controlled to have a lowered threshold voltage, even when the gate electrodes GE2 and GE4 have the same metal stack.

To make a difference in threshold voltage between the PMOSFETs previously described with reference to FIGS. 6A and 6C, it may be effective to control the first and second inner gate electrodes IGEa and IGEb to have different work-functions (i.e., different compositions) from each other. By contrast, to make a difference in threshold voltage between the NMOSFETs previously described with reference to FIGS. 6B and 6D, it may be effective to control the concentration of the dipole element in the gate insulating layer GI.

FIGS. 7A to 12C are sectional views illustrating a method of fabricating a semiconductor device, according to example embodiments. In detail, FIGS. 7A, 8A, 9A, 10A, 11A, and 12A are sectional views corresponding to the line A-A' of FIG. 4. FIGS. 9C and 10C are sectional views corresponding to the line C-C' of FIG. 4. FIGS. 7B, 8B, 11C, and 12C are sectional views corresponding to the line D-D' of FIG. 4.

Figure 7A:
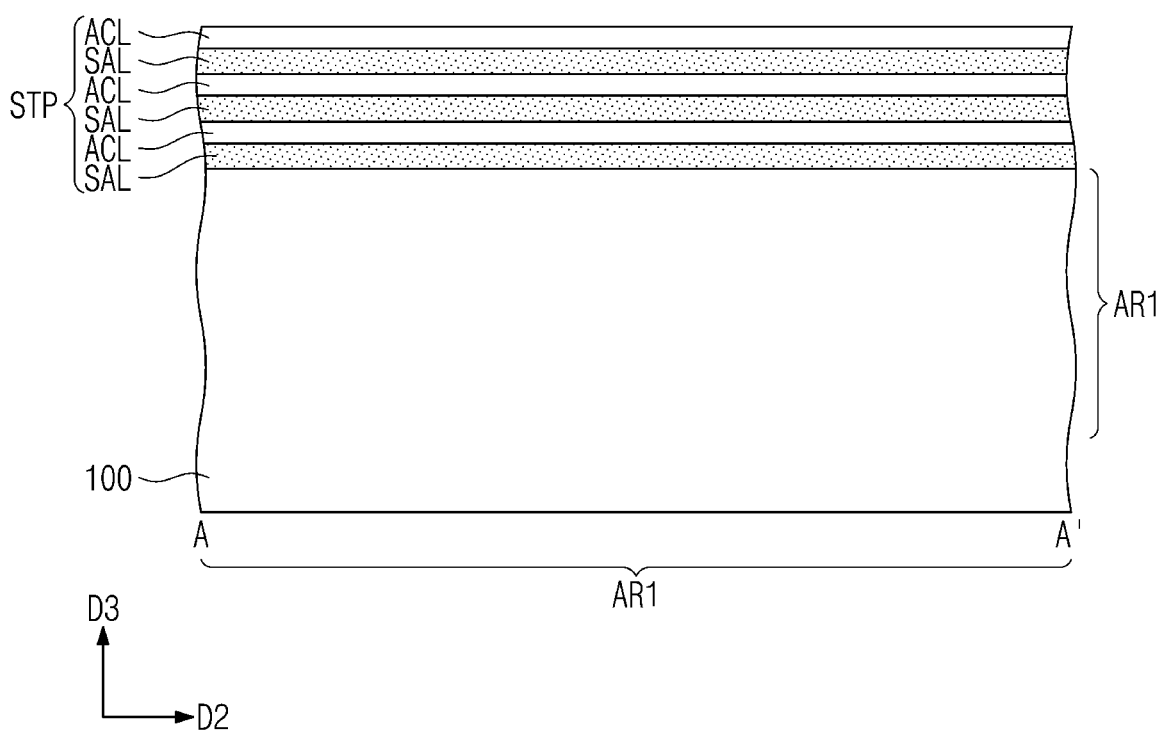
FIGS. 7A, 7B, 8A, 8B, 9A, 9B, 9C, 10A, 10B, 10C, 11A, 11B, 11C, 12A, 12B and 12C are sectional views illustrating a method of fabricating a semiconductor device, according to example embodiments.
Figure 7B:
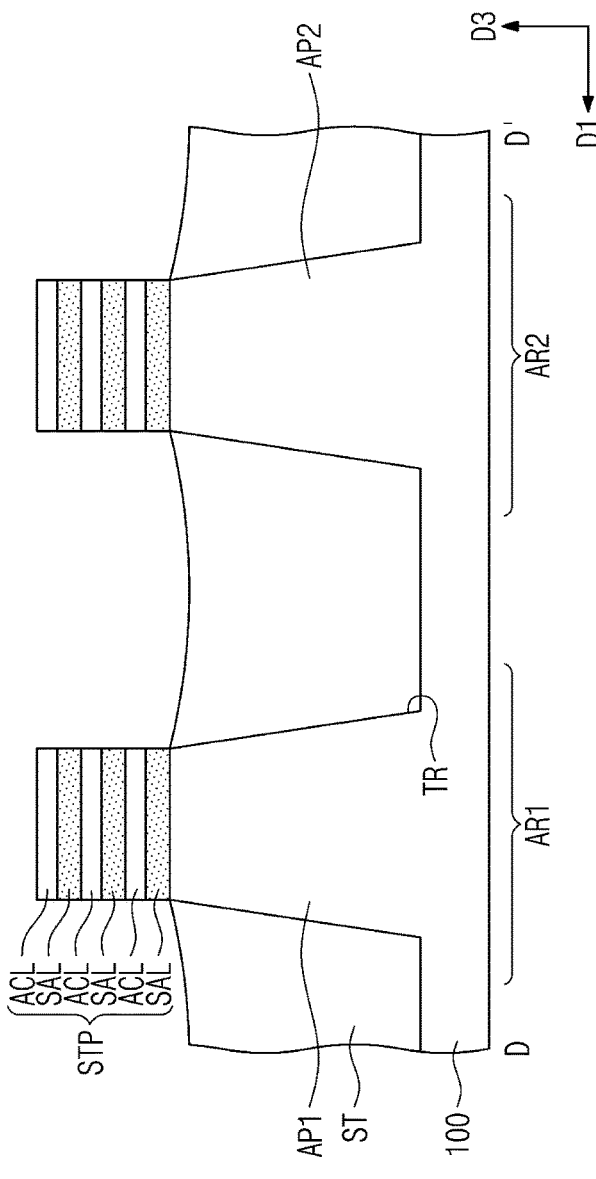

Referring to FIGS. 7A and 7B, the substrate 100 including the first and second active regions AR1 and AR2 may be provided. Active layers ACL and sacrificial layers SAL may be formed to be alternately stacked on the substrate 100. The active layers ACL may be formed of or include one of silicon (Si), germanium (Ge), and silicon germanium (SiGe), and the sacrificial layers SAL may be formed of or include another one of silicon (Si), germanium (Ge), and silicon germanium (SiGe).

The sacrificial layer SAL may be formed of or include a material having an etch selectivity with respect to the active layer ACL. For example, the active layers ACL may be formed of or include silicon (Si), and the sacrificial layers SAL may be formed of or include silicon germanium (SiGe). A germanium concentration in each of the sacrificial layers SAL may range from 10 at % to 30 at %.

Mask patterns may be respectively formed on the first and second active regions AR1 and AR2 of the substrate 100. The mask pattern may be a line- or bar-shaped pattern that extends in the second direction D2.

A patterning process using the mask patterns as an etch mask may be performed to form the trench TR defining the first and second active patterns AP1 and AP2. The first active pattern AP1 may be formed on the first active region AR1. The second active pattern AP2 may be formed on the second active region AR2.

A stacking pattern STP may be formed on each of the first and second active patterns AP1 and AP2. The stacking pattern STP may include the active layers ACL and the sacrificial layers SAL which are alternately stacked. The stacking pattern STP may be formed along with the first and second active patterns AP1 and AP2, during the patterning process.

The device isolation layer ST may be formed to fill the trench TR. In detail, an insulating layer may be formed on the substrate 100 to cover the first and second active patterns AP1 and AP2 and the stacking patterns STP. The device isolation layer ST may be formed by recessing the insulating layer to expose the stacking patterns STP.

The device isolation layer ST may be formed of or include at least one of insulating materials (e.g., silicon oxide). The stacking patterns STP may be placed above the device isolation layer ST and may be exposed to the outside of the device isolation layer ST. In this regard, the stacking patterns STP may protrude vertically above the device isolation layer ST.

Figure 8A:
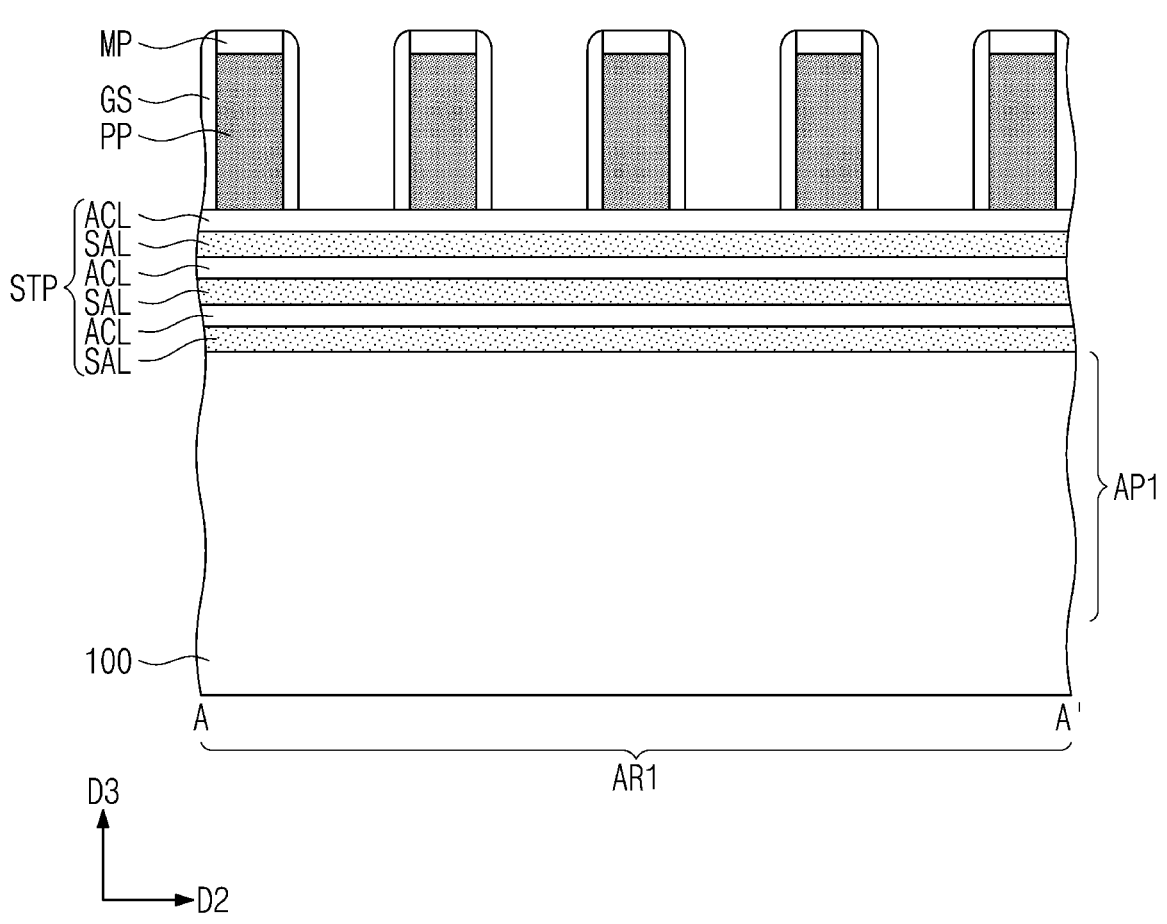
Figure 8B:
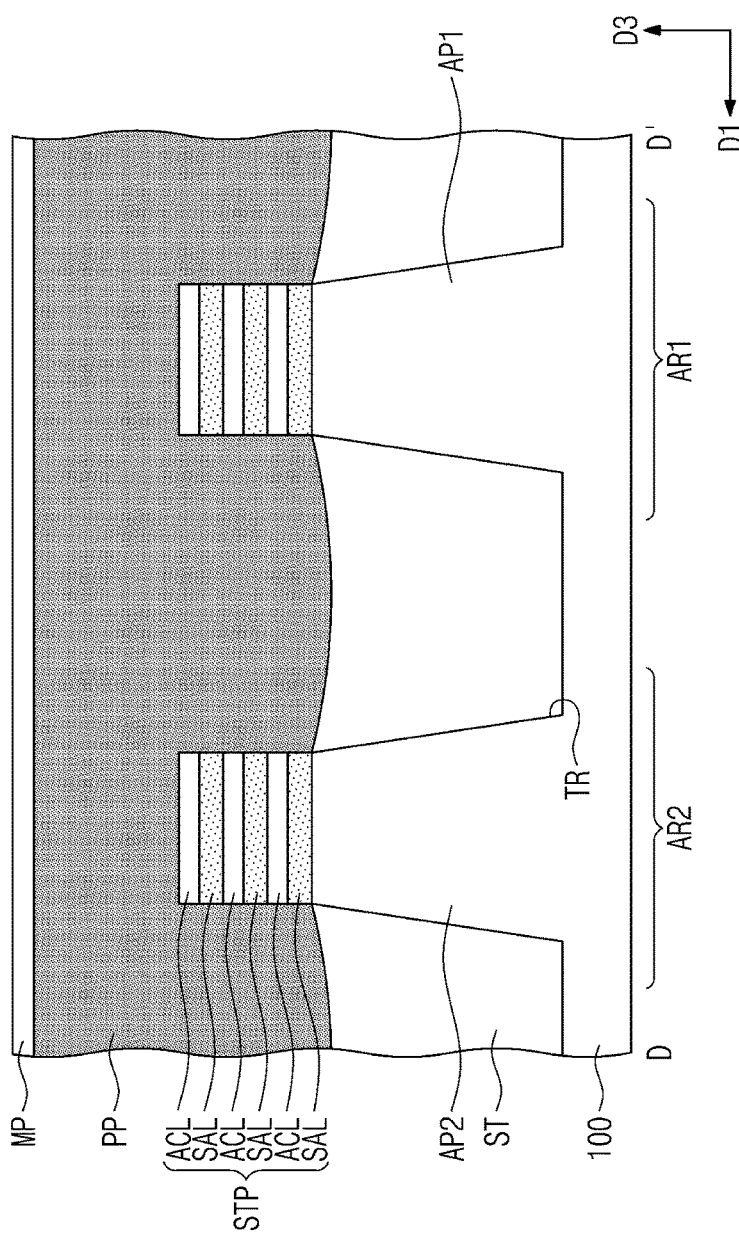

Referring to FIGS. 8A and 8B, sacrificial patterns PP may be formed on the substrate 100 to cross the stacking patterns STP. Each of the sacrificial patterns PP may be a line- or bar-shaped pattern that extends in the first direction D1. The sacrificial patterns PP may be arranged at a first pitch in the second direction D2.

In detail, the formation of the sacrificial patterns PP may include forming a sacrificial layer on the substrate 100, forming hard mask patterns MP on the sacrificial layer, and patterning the sacrificial layer using the hard mask patterns MP as an etch mask. The sacrificial layer may be formed of or include polysilicon.

A pair of the gate spacers GS may be formed on both side surfaces of each of the sacrificial patterns PP. The formation of the gate spacers GS may include conformally forming a gate spacer layer on the substrate 100 and anisotropically etching the gate spacer layer. In an example embodiment, the gate spacer GS may be a multi-layered structure including at least two layers.

Figure 9A:
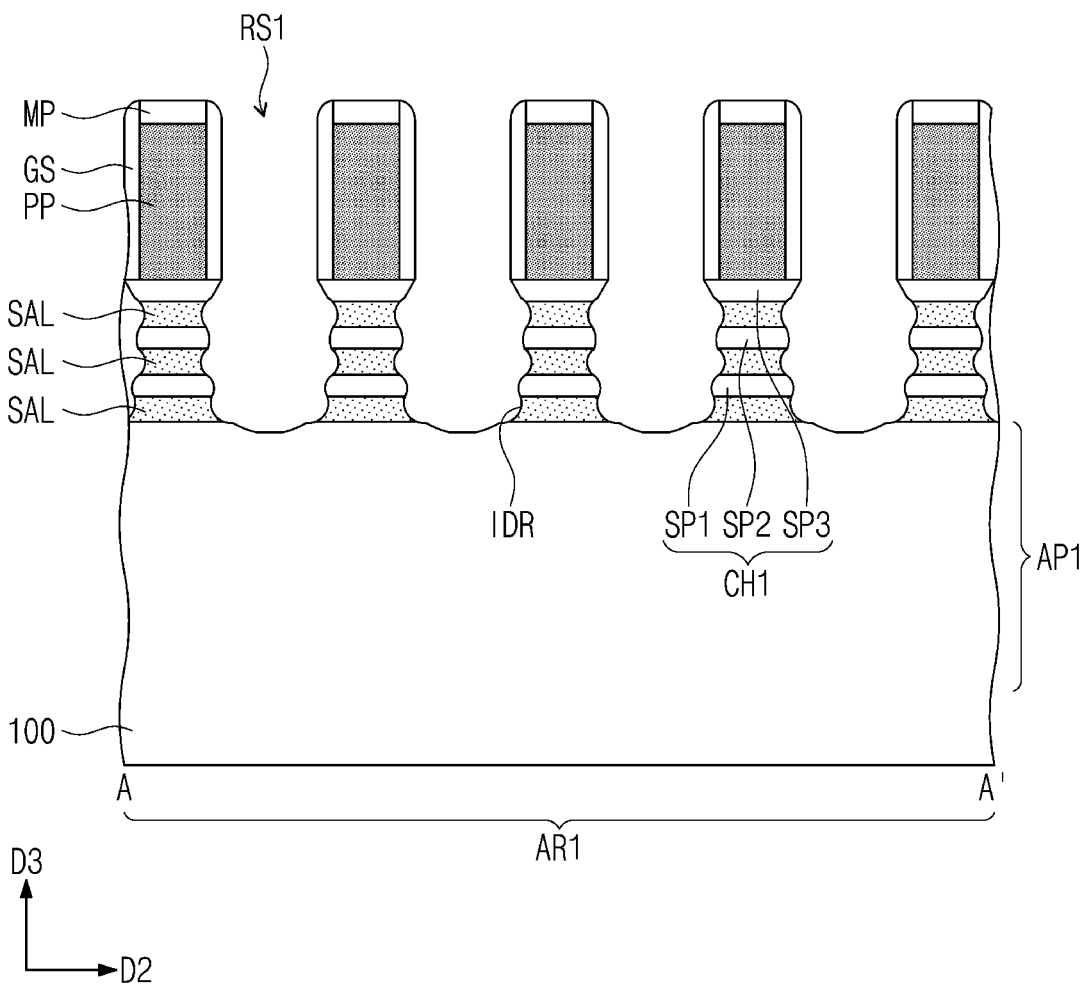
Figure 9B:
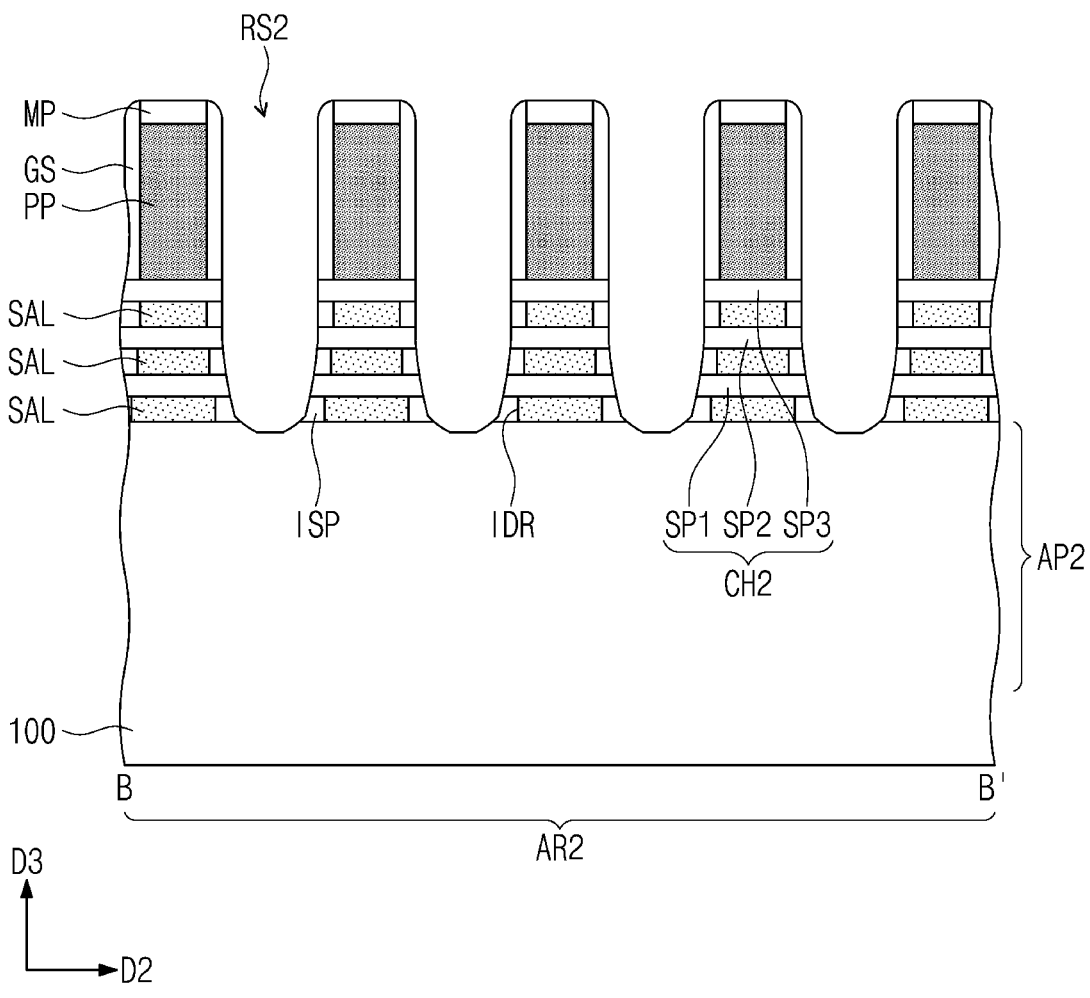
Figure 9C:
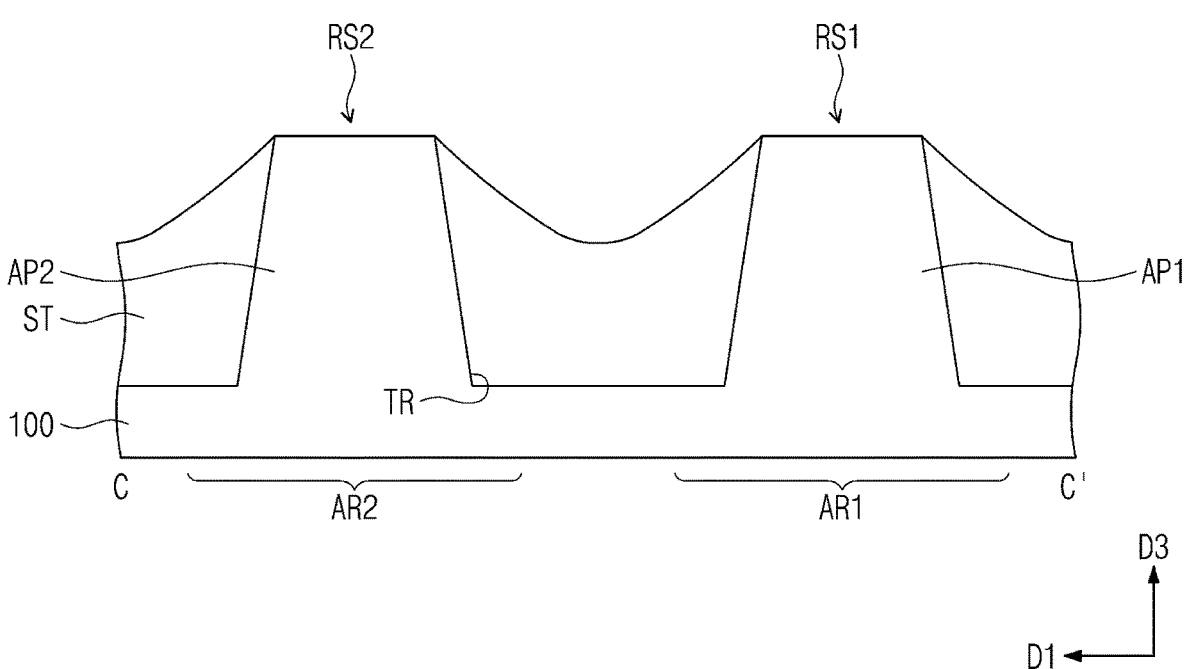

Referring to FIGS. 9A to 9C, the first recesses RS1 may be formed in the stacking pattern STP on the first active pattern AP1. The second recesses RS2 may be formed in the stacking pattern STP on the second active pattern AP2. Portions of the device isolation layer ST, which are located at both sides of each of the first and second active patterns AP1 and AP2, may be further recessed during the formation of the first and second recesses RS1 and RS2 (e.g., see FIG. 9C).

In detail, the first recesses RS1 may be formed by etching the stacking pattern STP on the first active pattern AP1 using the hard mask patterns MA and the gate spacers GS as an etch mask. The first recess RS1 may be formed between a pair of the sacrificial patterns PP.

The first to third semiconductor patterns SP1, SP2, and SP3, which are sequentially stacked between adjacent ones of the first recesses RS1, may be respectively formed from the active layers ACL. The first to third semiconductor patterns SP1, SP2, and SP3 between the adjacent ones of the first recesses RS1 may constitute the first channel pattern CH1.

The sacrificial layers SAL may be exposed by the first recess RS1. A selective etching process may be performed on the exposed sacrificial layers SAL. The etching process may include a wet etching process of removing only silicon-germanium selectively. As a result of the etching process, each of the sacrificial layers SAL may be indented to form an indent region IDR. Due to the presence of the indent region IDR, the sacrificial layer SAL may have a concave side surface. The first recess RS1 may have a wavy inner surface, owing to the indent regions IDR.

The second recesses RS2 in the stacking pattern STP on the second active pattern AP2 may be formed by a method similar to that for the first recesses RS1. The selective etching process may be performed on the sacrificial layers SAL exposed by the second recess RS2, and thus, the indent regions IDR may also be formed on the second active pattern AP2. The inner spacers ISP may be respectively formed in the indent regions IDR on the second active pattern AP2. The first to third semiconductor patterns SP1, SP2, and SP3 between adjacent ones of the second recesses RS2 may constitute the second channel pattern CH2.

Figure 10A:
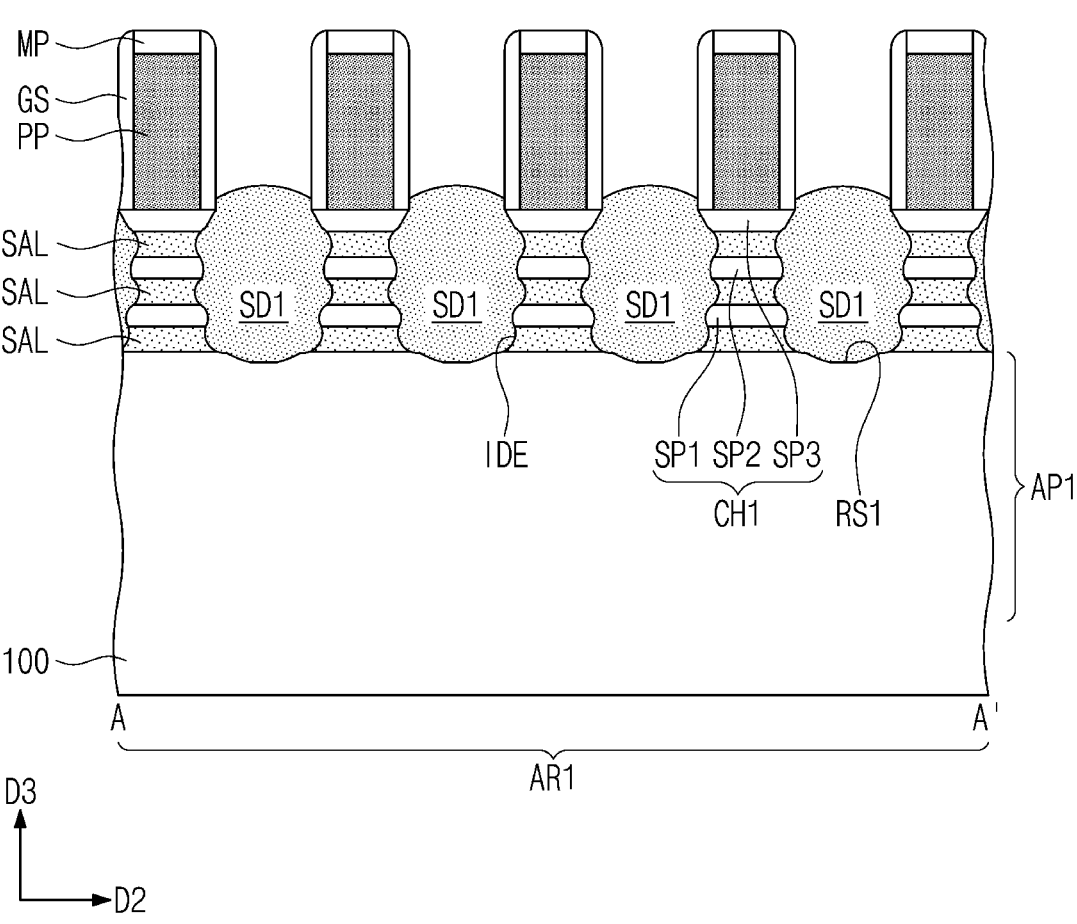
Figure 10B:
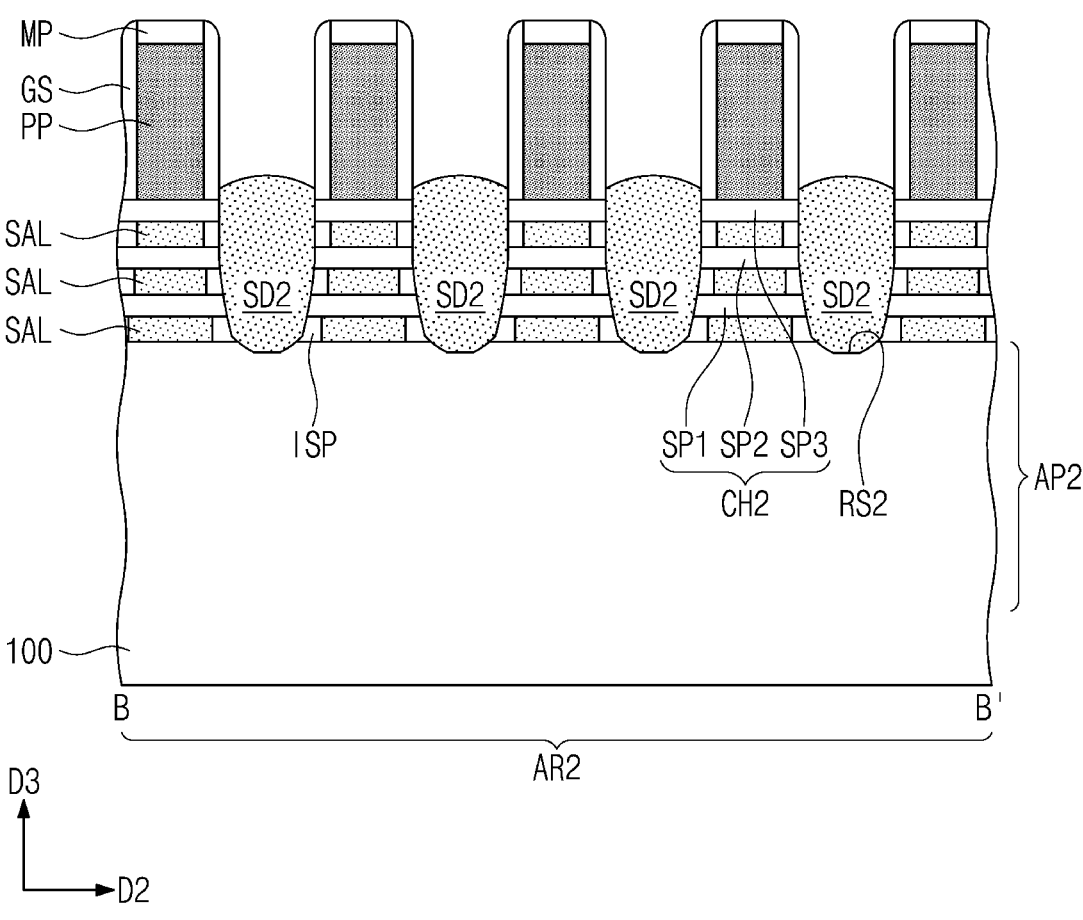
Figure 10C:
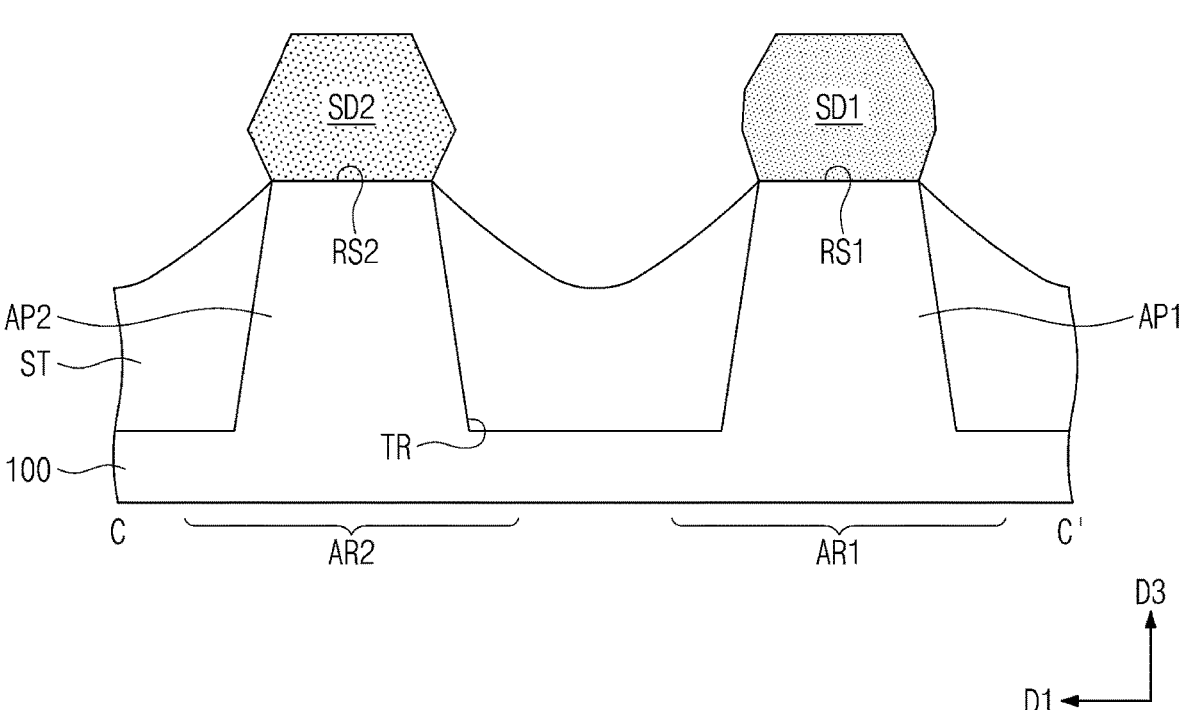

Referring to FIGS. 10A to 10C, the first source/drain patterns SD1 may be formed in the first recesses RS1, respectively. In detail, a SEG process, in which an inner surface of the first recess RS1 is used as a seed layer, may be performed to form an epitaxial layer filling the first recess RS1. The epitaxial layer may be grown using the first to third semiconductor patterns SP1, SP2, and SP3, the sacrificial layers SAL, and the substrate 100, which are exposed by the first recess RS1, as a seed layer. In an example embodiment, the SEG process may include a chemical vapor deposition (CVD) process or a molecular beam epitaxy (MBE) process.

In an example embodiment, the first source/drain pattern SD1 may be formed of or include a semiconductor material (e.g., SiGe) having a lattice constant greater than that of a semiconductor material of the substrate 100. During the formation of the first source/drain pattern SD1, the first source/drain pattern SD1 may be doped in-situ with p-type impurities (e.g., boron, gallium, or indium). Alternatively, impurities may be injected into the first source/drain pattern SD1, after the formation of the first source/drain pattern SD1.

The second source/drain patterns SD2 may be formed in the second recesses RS2, respectively. In detail, the second source/drain pattern SD2 may be formed by a SEG process using an inner surface of the second recess RS2 as a seed layer.

In an example embodiment, the second source/drain pattern SD2 may be formed of or include the same semiconductor material (e.g., Si) as the substrate 100. During the formation of the second source/drain pattern SD2, the second source/drain pattern SD2 may be doped in-situ with n-type impurities (e.g., phosphorus, arsenic, or antimony). Alternatively, impurities may be injected into the second source/drain pattern SD2, after the formation of the second source/drain pattern SD2.

Figure 11A:
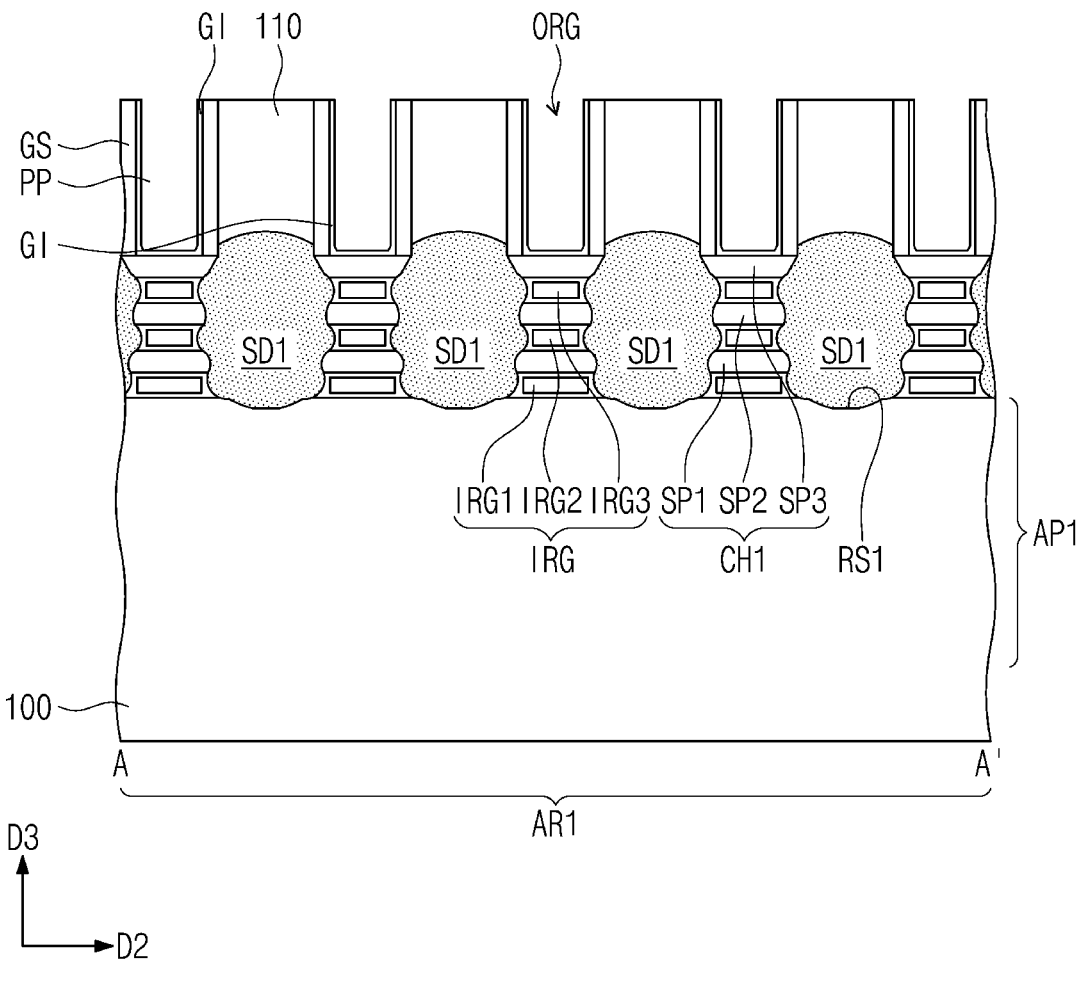
Figure 11B:
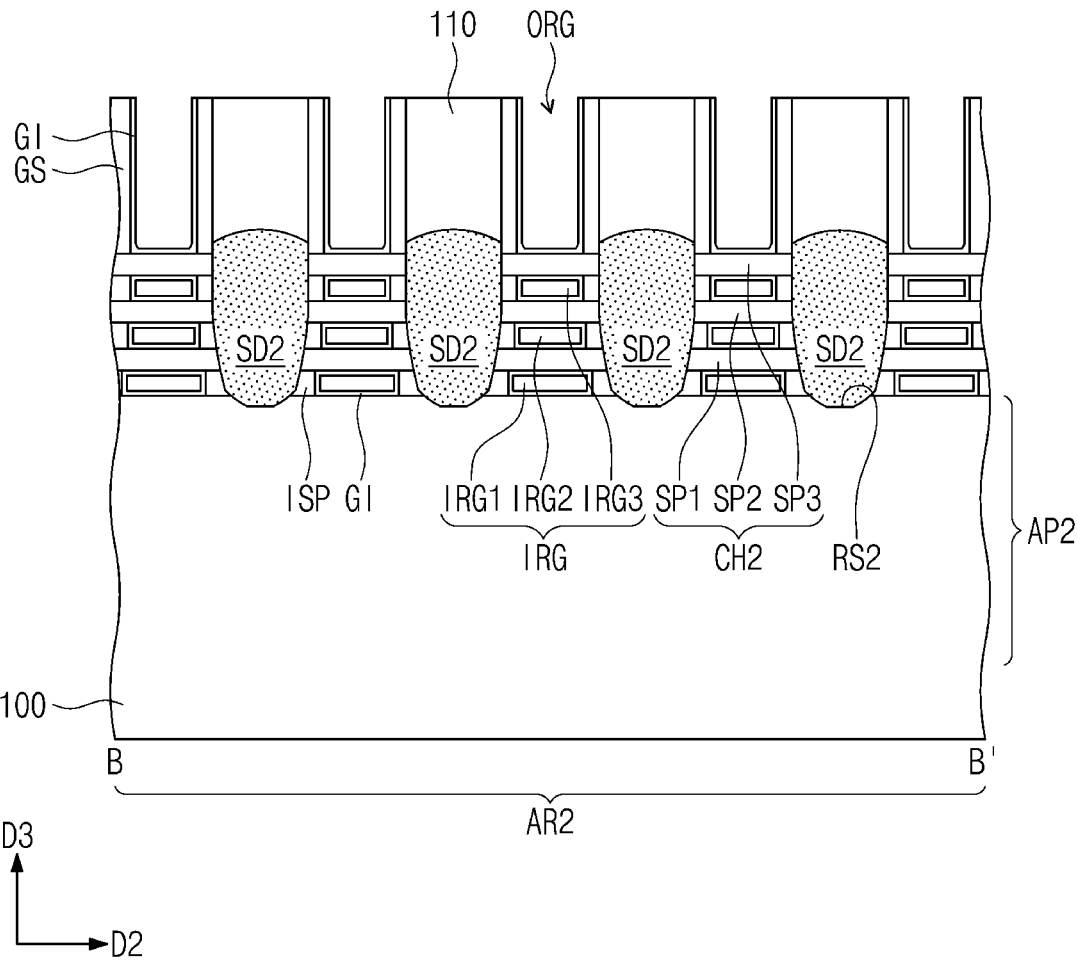
Figure 11C:
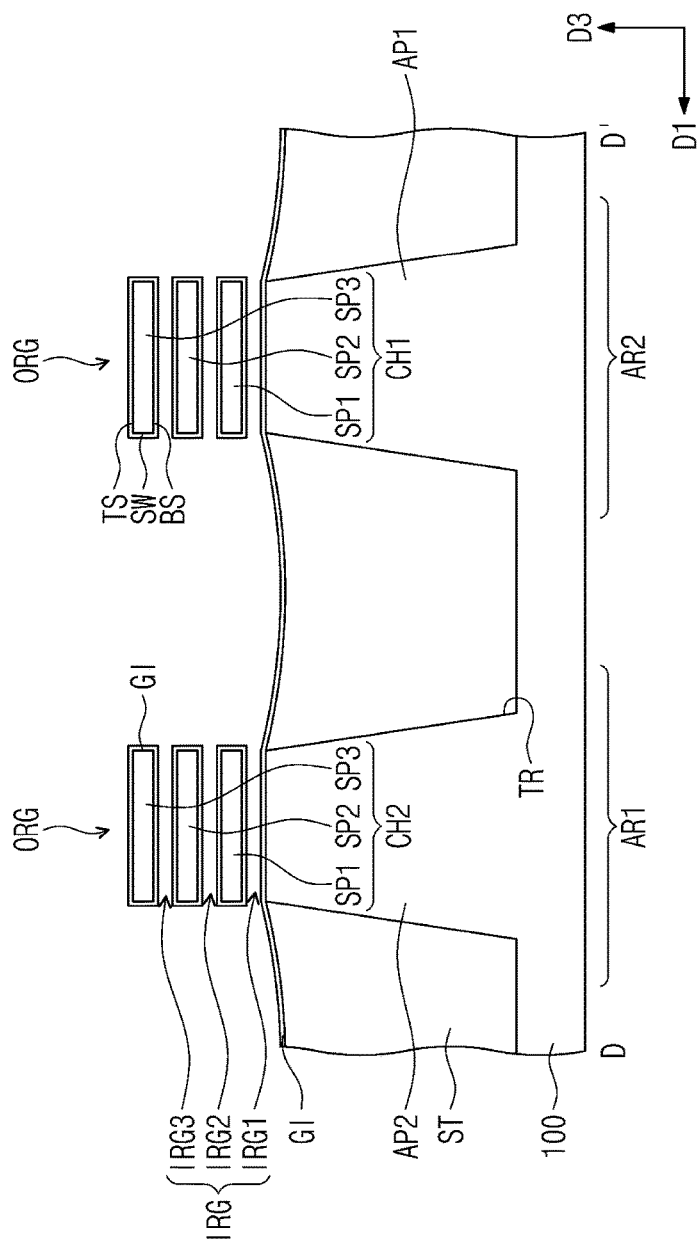

Referring to FIGS. 11A to 11C, the first interlayer insulating layer 110 may be formed to cover the first and second source/drain patterns SD1 and SD2, the hard mask patterns MP, and the gate spacers GS. In an example embodiment, the first interlayer insulating layer 110 may include a silicon oxide layer.

The first interlayer insulating layer 110 may be planarized to expose the top surfaces of the sacrificial patterns PP. The planarization of the first interlayer insulating layer 110 may be performed using an etch-back or chemical-mechanical polishing (CMP) process. All of the hard mask patterns MP may be removed during the planarization process. As a result, the first interlayered insulating layer 110 may have a top surface that is substantially coplanar the top surfaces of the sacrificial patterns PP and the top surfaces of the gate spacers GS.

The exposed sacrificial patterns PP may be selectively removed. As a result of the removal of the sacrificial patterns PP, an outer region ORG exposing the first and second channel patterns CH1 and CH2 may be formed (e.g., see FIG. 11C). The removal of the sacrificial patterns PP may include a wet etching process which is performed using an etching solution capable of selectively etching polysilicon.

The sacrificial layers SAL exposed through the outer region ORG may be selectively removed to form inner regions IRG (e.g., see FIG. 11C). In detail, a process of selectively etching the sacrificial layers SAL may be performed to leave the first to third semiconductor patterns SP1, SP2, and SP3 and to remove only the sacrificial layers SAL. The etching process may be chosen to have a high etch rate for a material (e.g., SiGe) having a relatively high germanium concentration. For example, the etching process may be chosen to have a high etch rate for a silicon germanium layer having a germanium concentration higher than 10 at %.

During the etching process, the sacrificial layers SAL on the first and second active regions AR1 and AR2 may be removed. The etching process may be a wet etching process. An etchant material, which is used in the etching process, may be chosen to quickly remove the sacrificial layer SAL having a relatively high germanium concentration.

Referring back to FIG. 11C, because the sacrificial layers SAL are selectively removed, only the stacked first to third semiconductor patterns SP1, SP2, and SP3 may remain on each of the first and second active patterns AP1 and AP2. As a result of the removal of the sacrificial layers SAL, the first to third inner regions IRG1, IRG2, and IRG3 may be formed on each of the first and second active patterns AP1 and AP2.

In detail, the first inner region IRG1 may be formed between the active pattern AP1 or AP2 and the first semiconductor pattern SP1, the second inner region IRG2 may be formed between the first semiconductor pattern SP1 and the second semiconductor pattern SP2, and the third inner region IRG3 may be formed between the second semiconductor pattern SP2 and the third semiconductor pattern SP3.

Referring back to FIGS. 11A to 11C, the gate insulating layer GI may be formed to cover exposed surfaces of the first to third semiconductor patterns SP1, SP2, and SP3. The gate insulating layer GI may be formed to enclose each of the first to third semiconductor patterns SP1, SP2, and SP3. The gate insulating layer GI may be formed in each of the first to third inner regions IRG1, IRG2, and IRG3. The gate insulating layer GI may be formed in the outer region ORG.

Figure 12A:
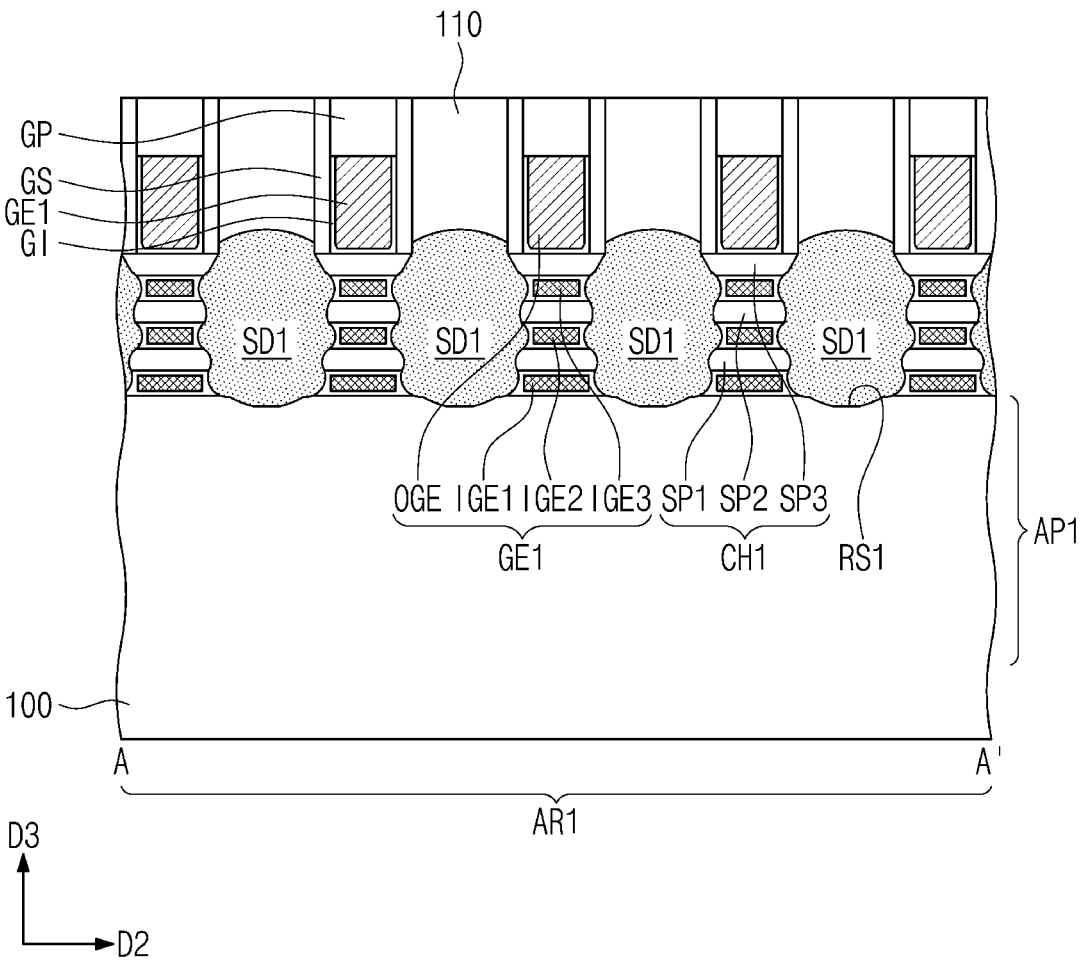
Figure 12B:
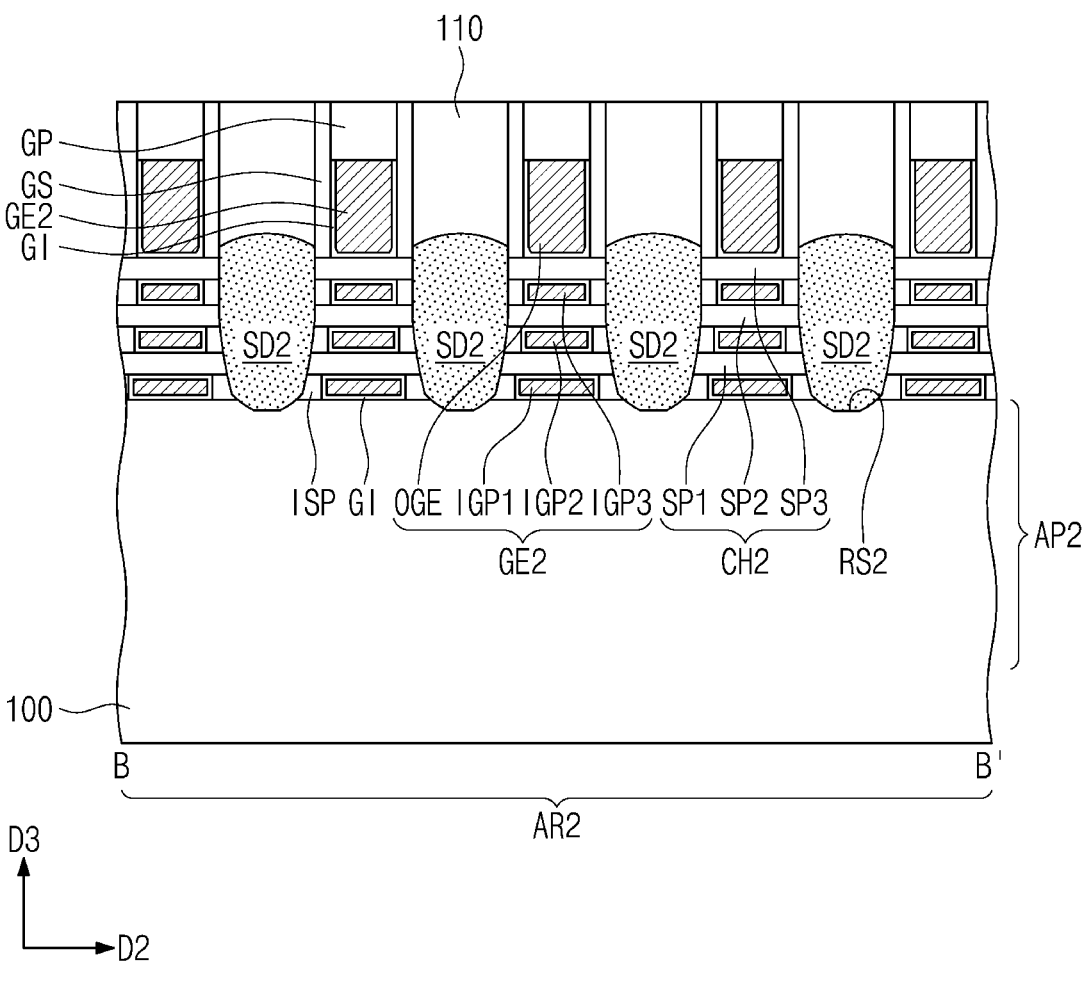
Figure 12C:
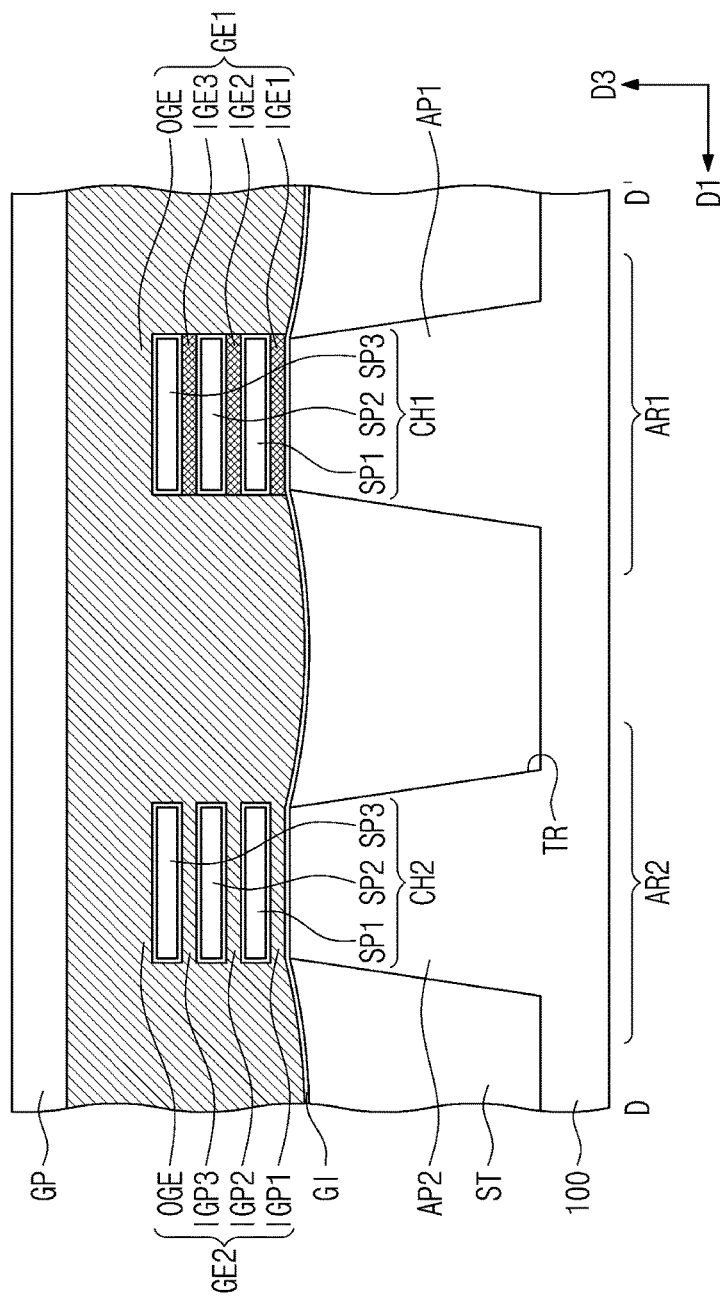

Referring to FIGS. 12A to 12C, the gate electrode GE, including the first gate electrode GE1 and the first gate electrode GE2, may be formed on the gate insulating layer GI. The formation of the gate electrode GE may include forming the first gate electrode GE1 on the first channel pattern CH1 and forming the second gate electrode GE2 on the second channel pattern CH2.

The formation of the first gate electrode GE1 may include forming the first to third inner electrodes IGE1, IGE2, and IGE3 in the first to third inner regions IRG1, IRG2, and IRG3, respectively, and forming the outer gate electrode OGE in the outer region ORG. The formation of the second gate electrode GE2 may include sequentially forming metal layers in the inner regions IRG and the outer region ORG.

The first and second gate electrodes GE1 and GE2 may be connected to form one gate electrode GE. The gate electrode GE may be vertically recessed to have a reduced height. The gate capping pattern GP may be formed on the recessed gate electrode GE.

Referring back to FIGS. 5A to 5D, the second interlayer insulating layer 120 may be formed on the first interlayer insulating layer 110. The second interlayer insulating layer 120 may include a silicon oxide layer. The active contacts AC may be formed to penetrate the second interlayer insulating layer 120 and the first interlayer insulating layer 110, and to be electrically connected to the first and second source/drain patterns SD1 and SD2. The gate contact GC may be formed to penetrate the second interlayer insulating layer 120 and the gate capping pattern GP, and to be electrically connected to the gate electrode GE.

The formation of each of the active and gate contacts AC and GC may include forming the barrier pattern BM and forming the conductive pattern FM on the barrier pattern BM. The barrier pattern BM may be conformally formed and may include a metal layer and a metal nitride layer. The conductive pattern FM may be formed of or include a low resistance metal.

The division structures DB may be formed on borders of the first logic cell LGC1. The division structure DB may be formed to penetrate the second interlayer insulating layer 120 and the gate electrode GE, and may extend into the active pattern AP1 or AP2. The division structure DB may be formed of or include an insulating material (e.g., silicon oxide or silicon nitride).

The third interlayer insulating layer 130 may be formed on the active contacts AC and the gate contacts GC. The first metal layer M1 may be formed in the third interlayer insulating layer 130. The fourth interlayer insulating layer 140 may be formed on the third interlayer insulating layer 130. The second metal layer M2 may be formed in the fourth interlayer insulating layer 140.

FIGS. 13A to 17C are enlarged views illustrating a method of forming first, second and third gate electrodes. In detail, FIGS. 13A, 14A, 15A, 16A, and 17A are enlarged views corresponding to the portion 'M' of FIG. 5D. FIGS. 13B, 14B, 15B, 16B, and 17B are enlarged views corresponding to the portion 'N' of FIG. 5D. FIGS. 13C, 14C, 15C, 16C, and 17C are enlarged views corresponding to the portion 'O' of FIG. 5G.

Figure 13A:
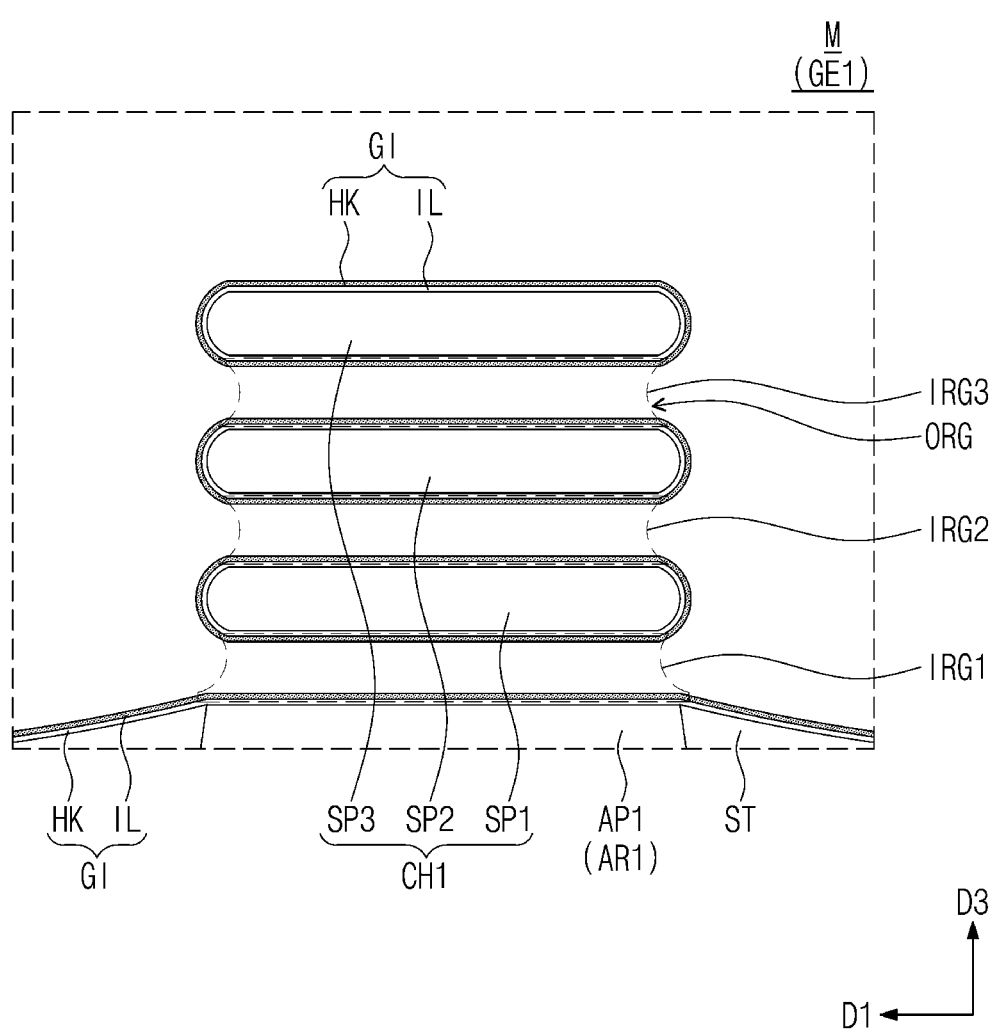
FIGS. 13A, 13B, 13C, 14A, 14B, 14C, 15A, 15B, 15C, 16A, 16B, 16C, 17A, 17B and 17C are enlarged views illustrating a method of forming first, second and third gate electrodes according to example embodiments.
Figure 13B:
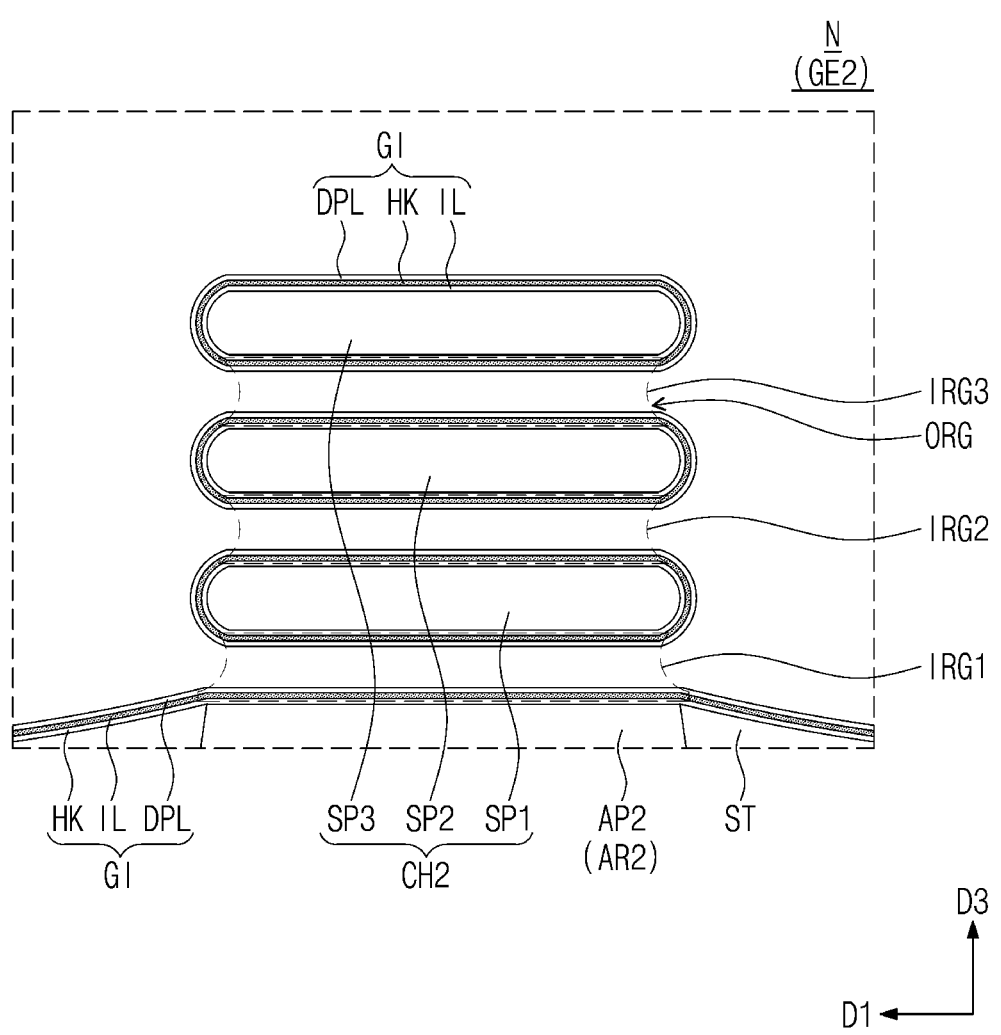
Figure 13C:
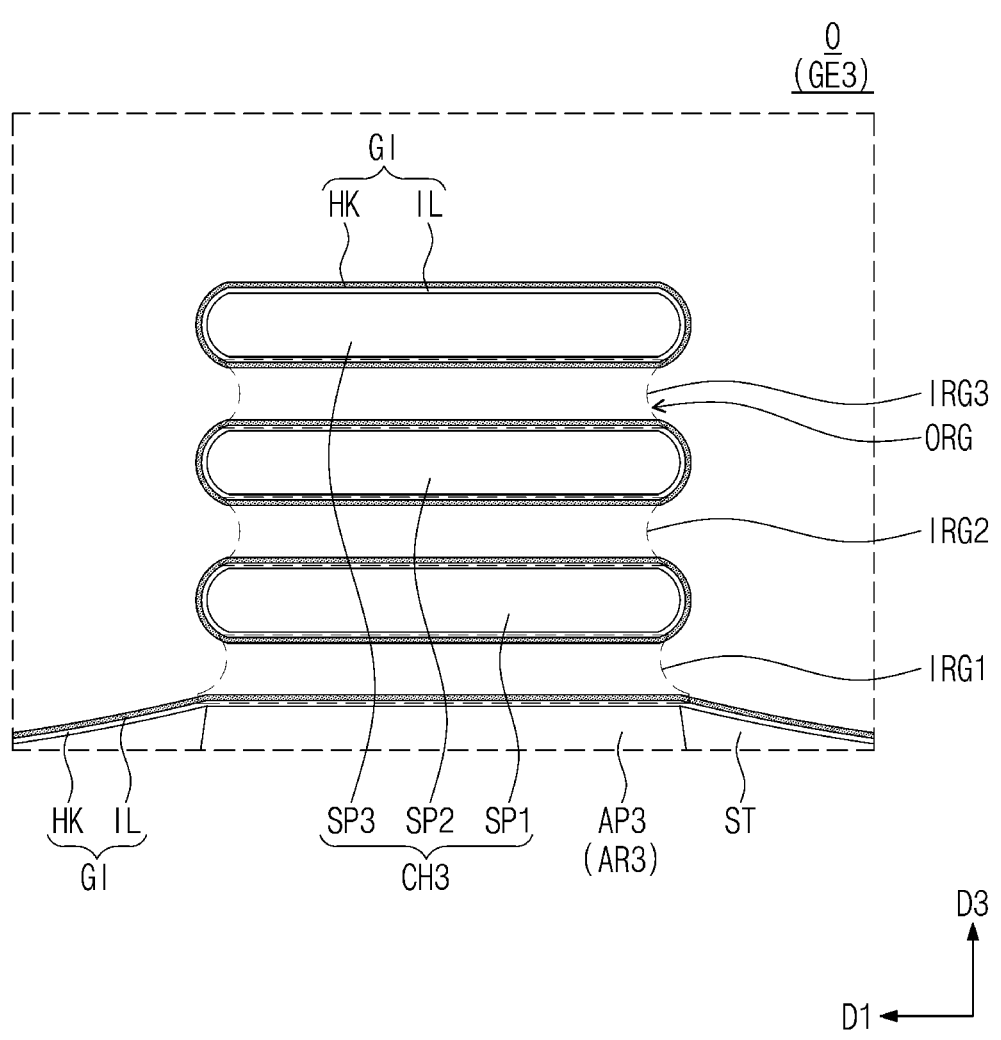

Referring to FIGS. 13A, 13B, and 13C, the gate insulating layer GI may be formed on the first to third channel patterns CH1-CH3, as previously described with reference to FIGS. 11A to 11C. The formation of the gate insulating layer GI may include forming the interface layer IL to directly cover a surface of each of the first to third channel patterns CH1-CH3 and forming the high-k dielectric layer HK on the interface layer IL.

In an example embodiment, the dipole layer DPL may be additionally formed on the second channel pattern CH2. The dipole layer DPL may be formed of a dipole-element-containing oxide material (e.g., lanthanum oxide (LaO)). An annealing process may be performed on the dipole layer DPL, and in this case, the dipole element (e.g., La), which is contained in the dipole layer DPL, may be diffused into the gate insulating layer GI on the second channel pattern CH2.

Figure 14A:
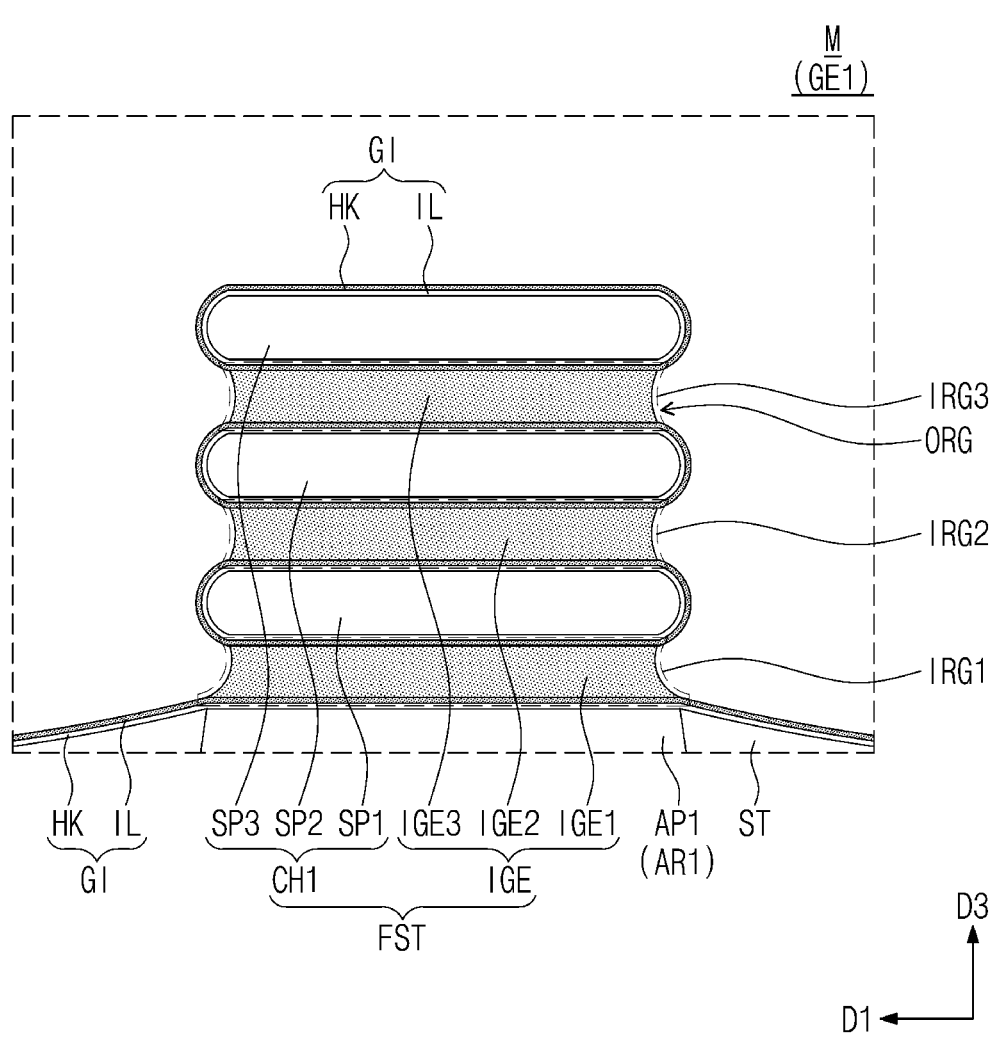
Figure 14B:
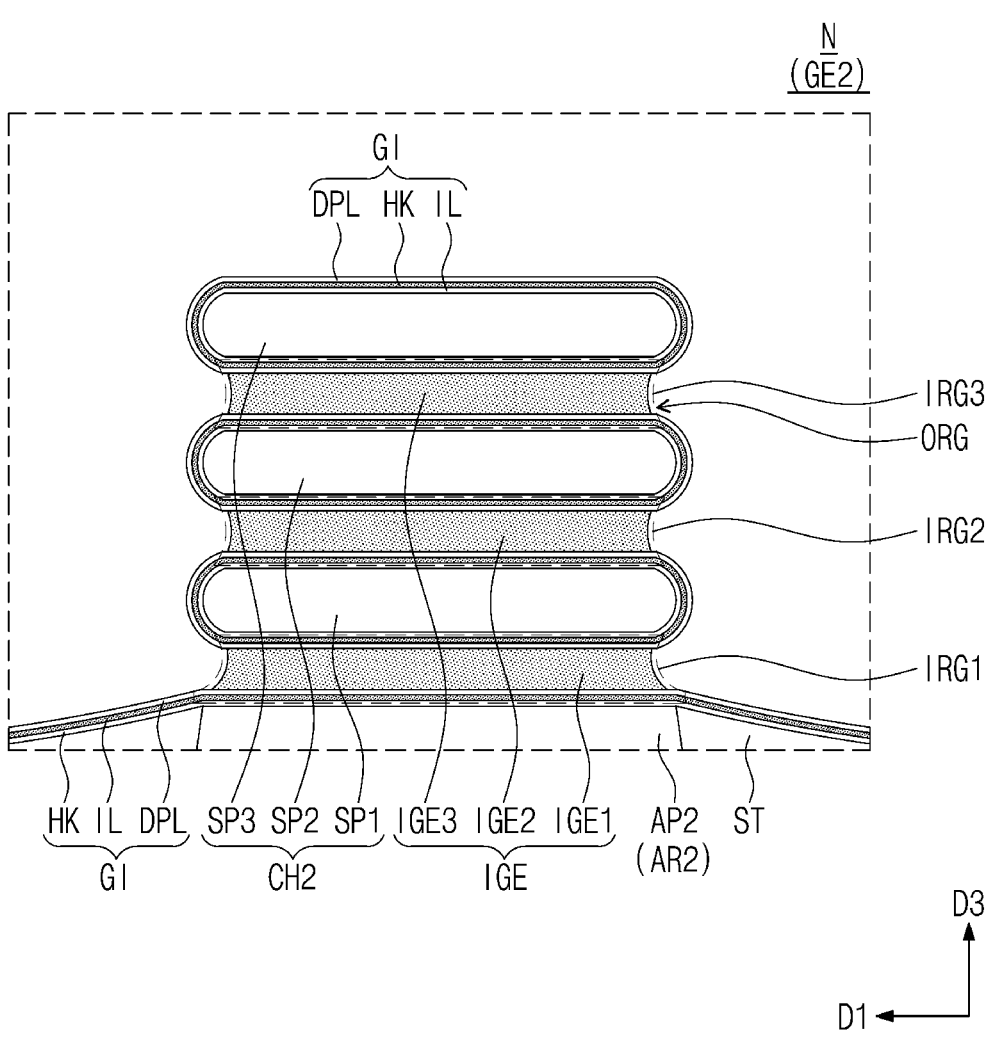
Figure 14C:
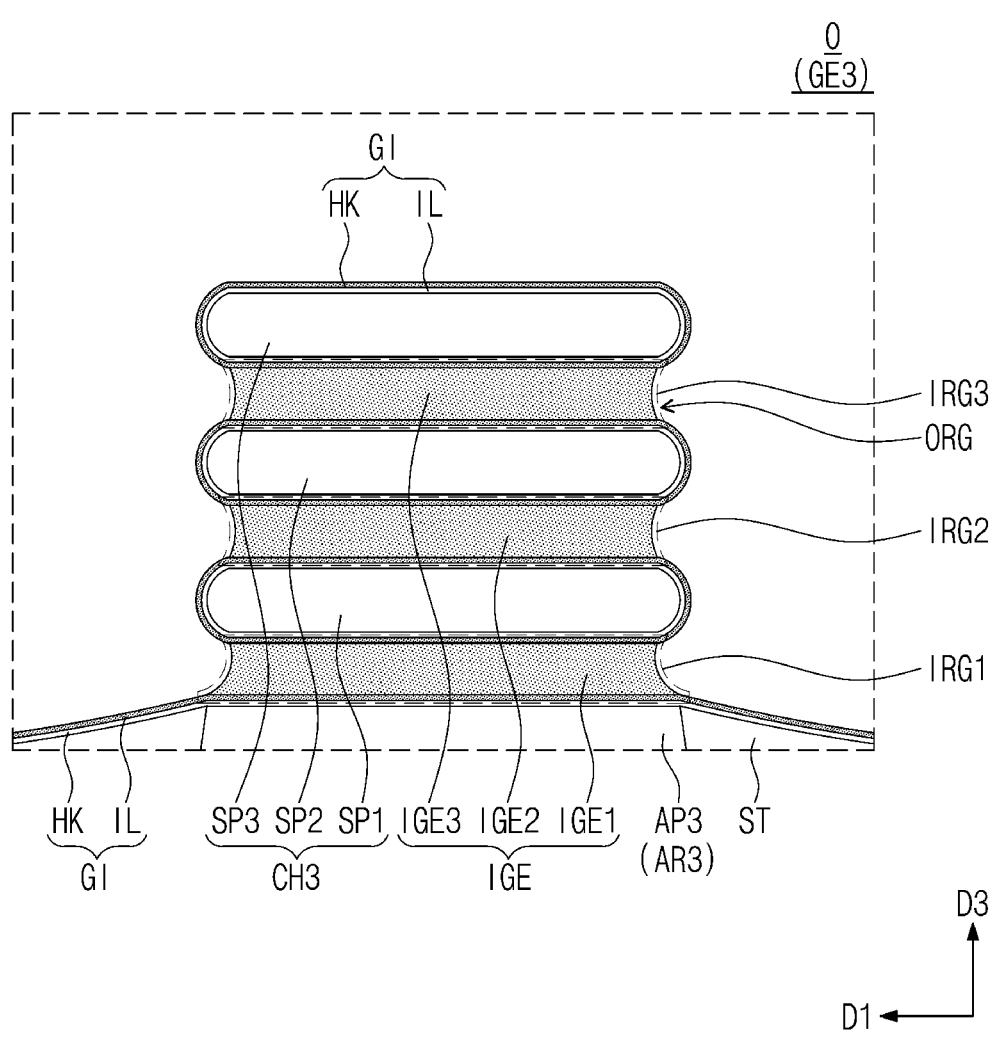

Referring to FIGS. 14A, 14B, and 14C, the first to third inner electrodes IGE1, IGE2, and IGE3 may be formed in the first to third inner regions IRG1, IRG2, and IRG3, respectively. The first to third inner electrodes IGE1, IGE2, and IGE3 and the first to third semiconductor patterns SP1, SP2, and SP3, which are alternately stacked, may constitute the fin structure FST.

In detail, the formation of an inner gate electrode IGE may include forming a first work-function metal layer on the first to third channel patterns CH1-CH3 and performing a wet etching process on the first work-function metal layer to leave only the inner gate electrode IGE. The inner gate electrode IGE may be formed of or include at least one of metal nitride materials, metal oxynitride materials, metal oxycarbide materials, or metal oxynitride carbide materials.

Figure 15A:
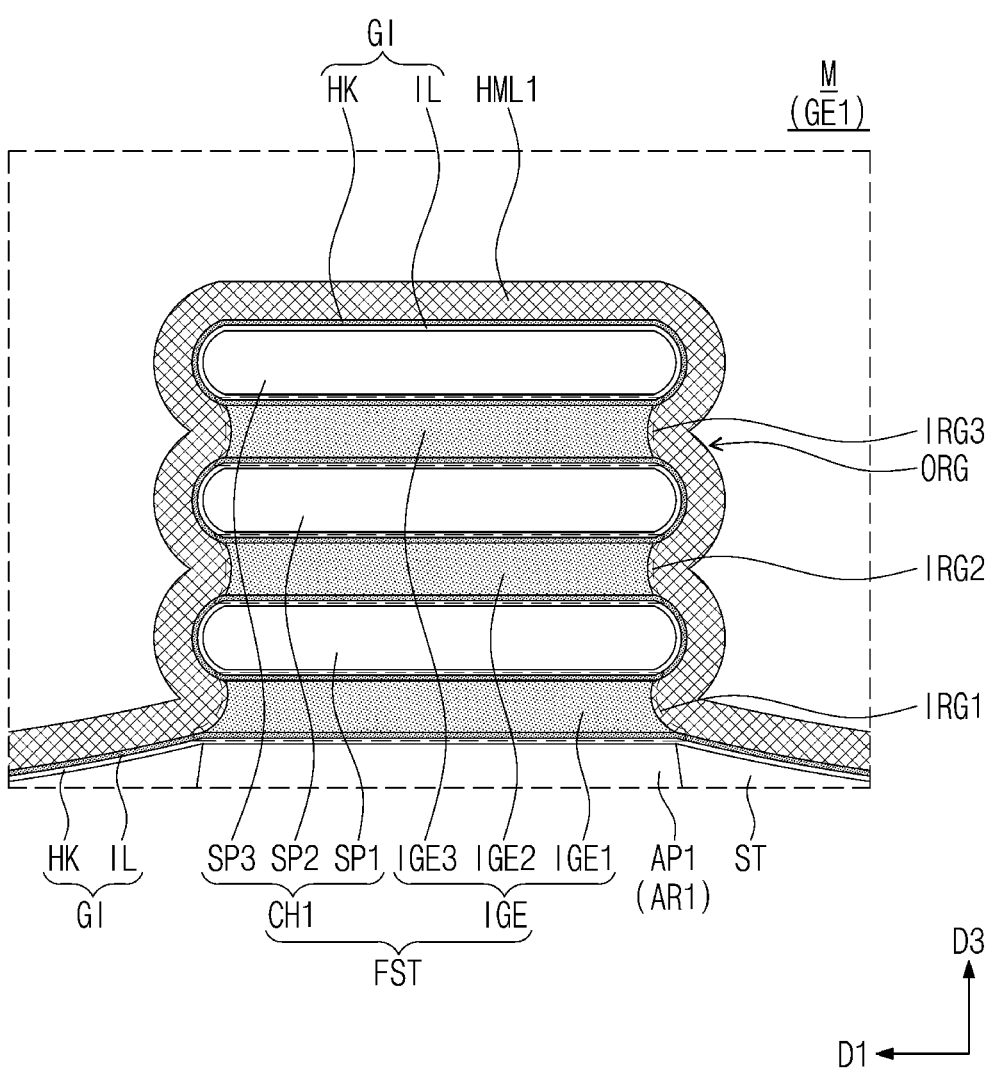
Figure 15B:
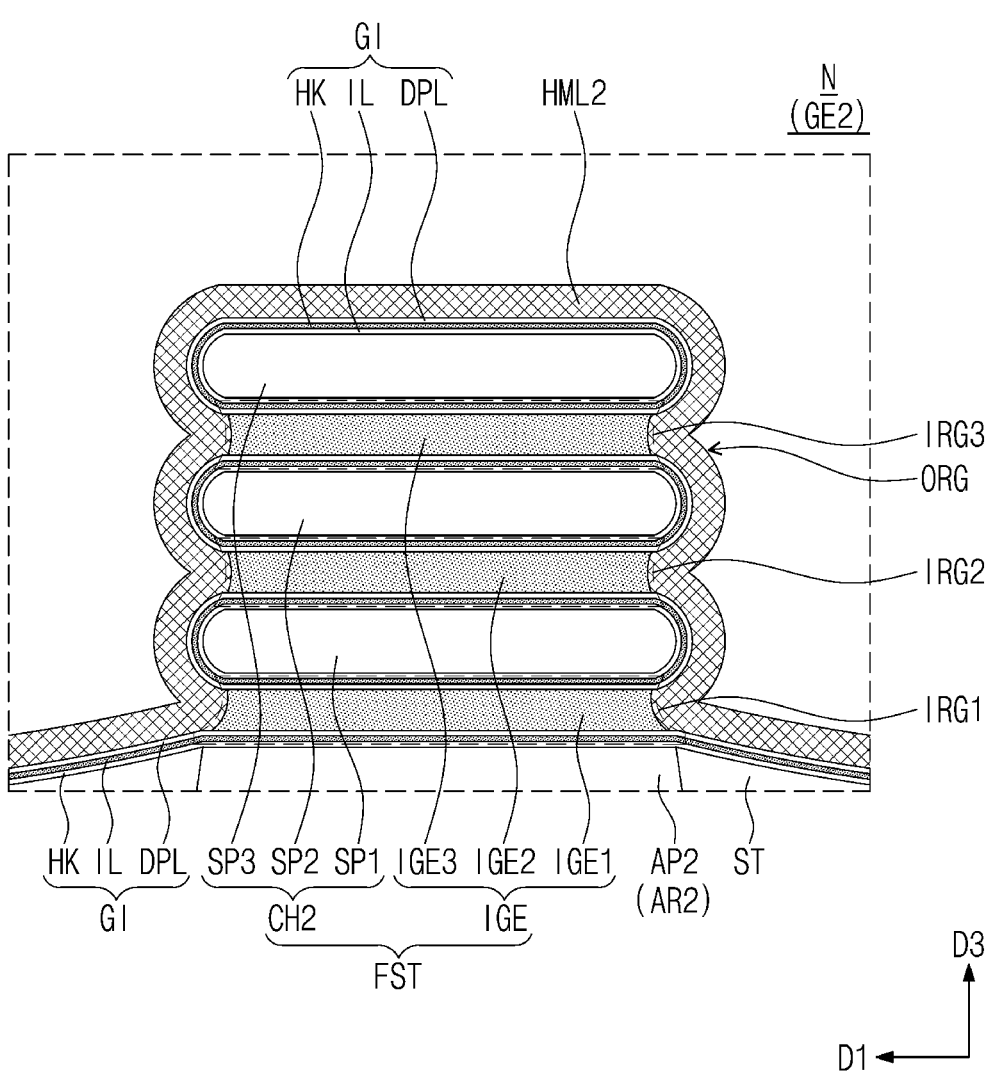
Figure 15C:
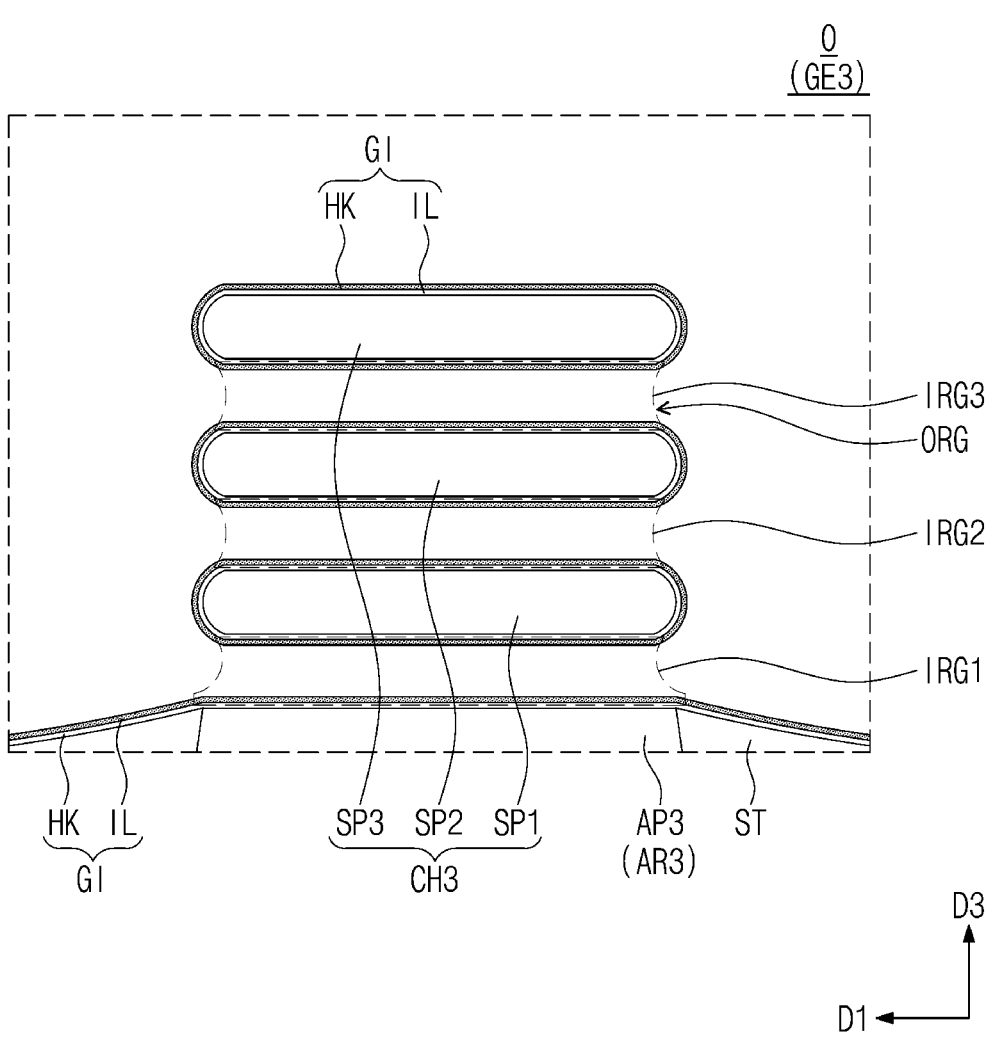

Referring to FIGS. 15A, 15B, and 15C, a first hard mask layer HML1 may be formed on the fin structures FST on the first and second active patterns AP1 and AP2. The first hard mask layer HML1 may not be formed on the fin structure FST on the third active pattern AP3.

The inner gate electrode IGE on the third active pattern AP3, which is not protected by the first hard mask layer HML1, may be selectively removed. Thus, the gate insulating layer GI on the third active pattern AP3 may be fully exposed to the outside again. The inner gate electrodes IGE on the first and second active patterns AP1 and AP2, which are protected by the first hard mask layer HML1, may remain as they are.

Figure 16A:
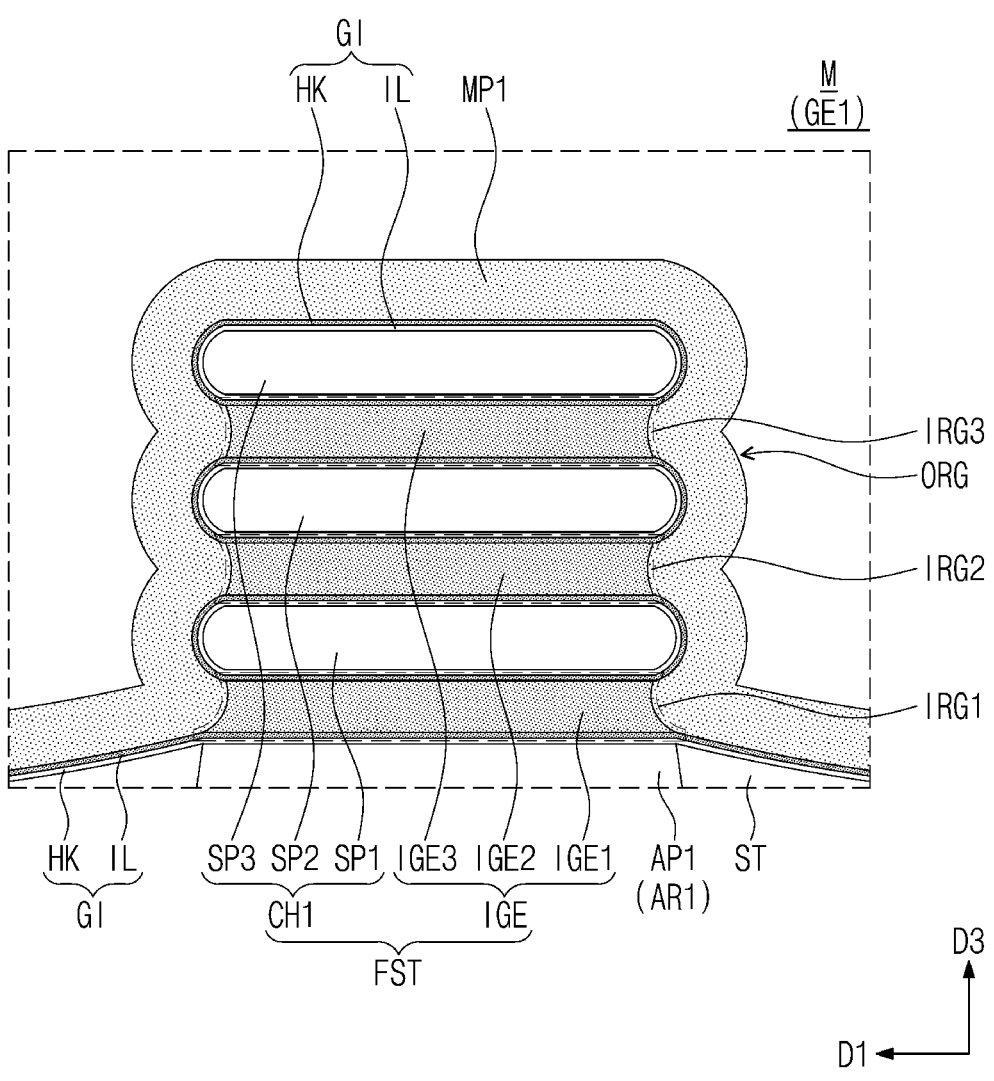
Figure 16B:
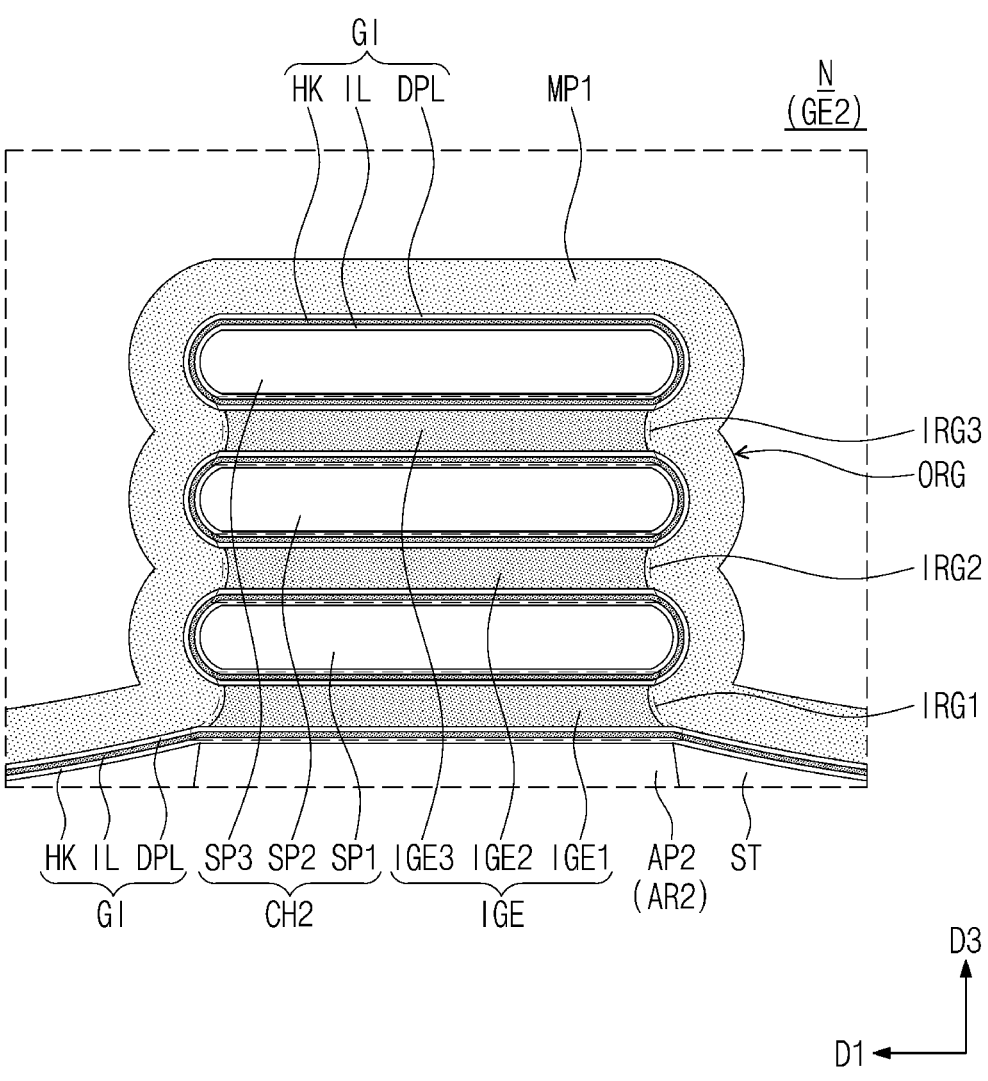
Figure 16C:
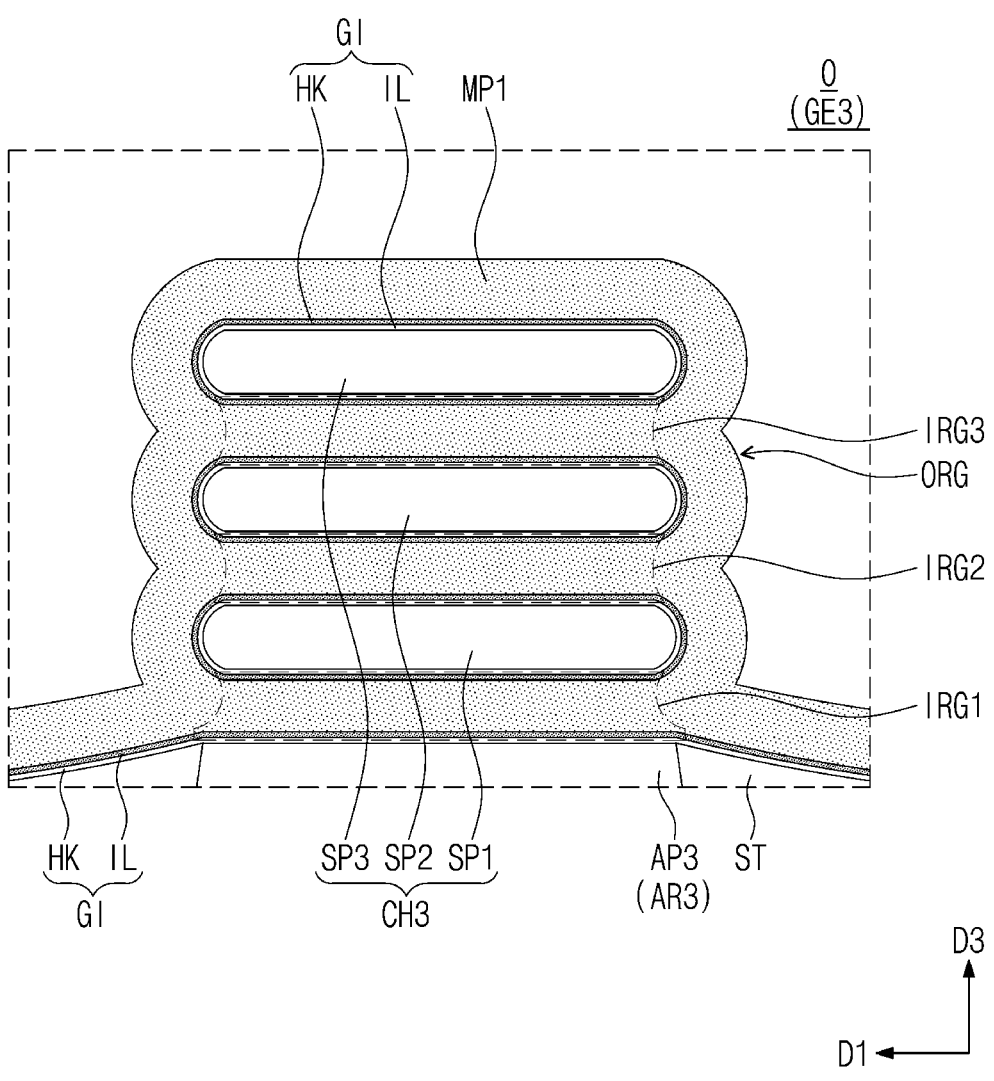

Referring to FIGS. 16A, 16B, and 16C, the first hard mask layer HML1 may be selectively removed. The first metal pattern MP1 may be formed on the first to third channel patterns CH1-CH3. The first metal pattern MP1 on the first and second active patterns AP1 and AP2 may be formed to cover the fin structure FST. The first metal pattern MP1 may be formed of or include a p-type work-function metal and may have a work-function lower than the inner gate electrode IGE.

The first metal pattern MP1 on the third active pattern AP3 may be provided to fully fill the first to third inner regions IRG1, IRG2, and IRG3. The first metal pattern MP1 filling the first to third inner regions IRG1, IRG2, and IRG3 may constitute the second inner gate electrode IGEb. In this regard, a composition of a metallic material of the second inner gate electrode IGEb may be different from a composition of a metallic material of the first inner gate electrode IGEa on the first active pattern AP1.

Figure 17A:
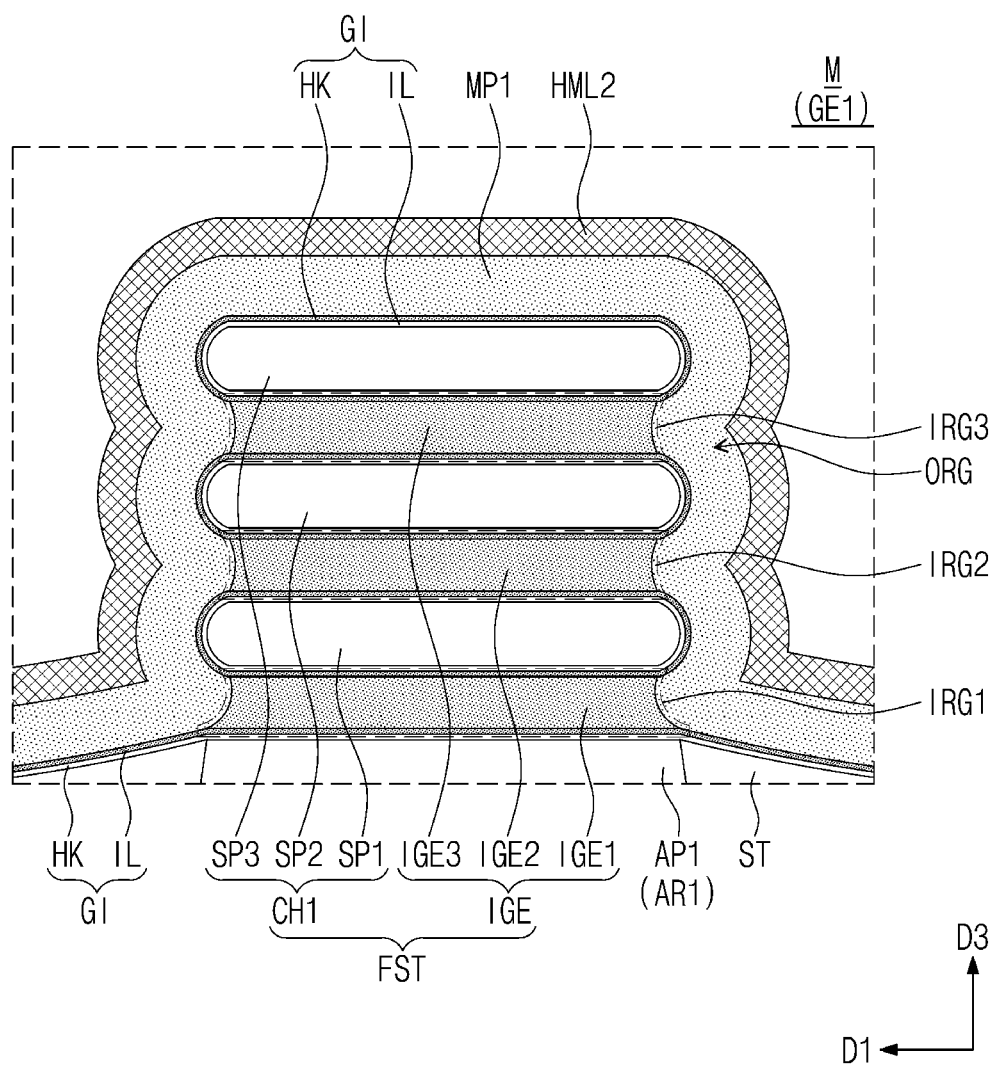
Figure 17B:
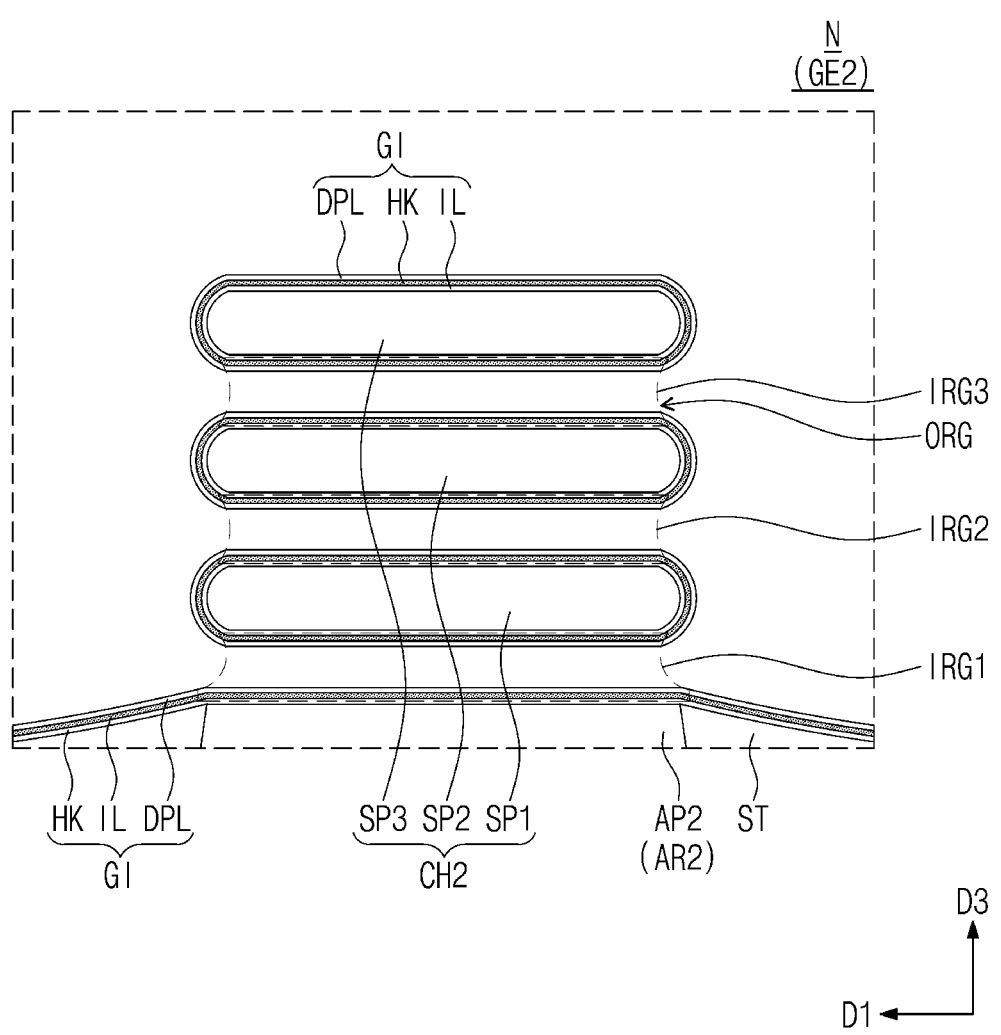
Figure 17C:
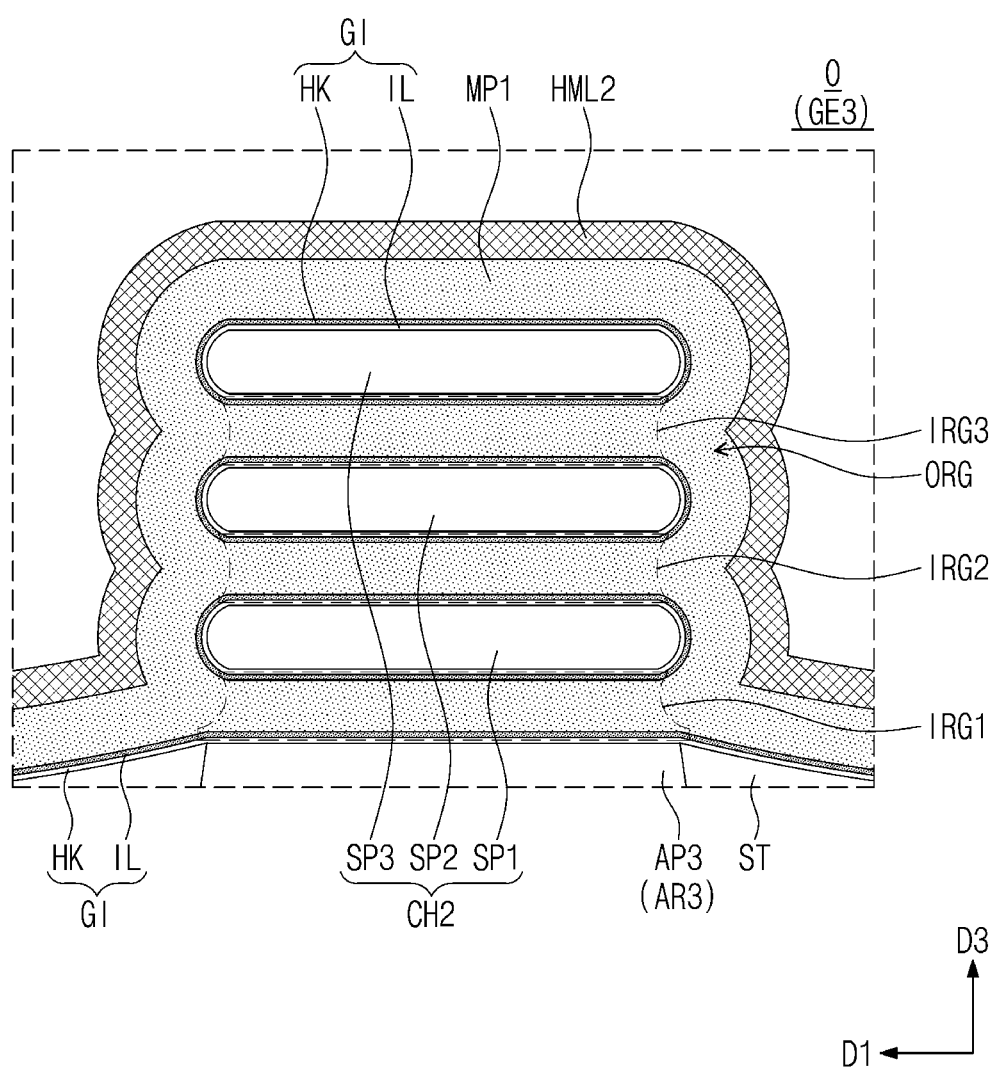

Referring to FIGS. 17A, 17B, and 17C, a second hard mask layer HML2 may be formed on the first metal pattern MP1 on the first and third active patterns AP1 and AP3. The second hard mask layer HML2 may not be formed on the first metal pattern MP1 on the second active pattern AP2.

Both of the first metal pattern MP1 and the inner gate electrode IGE on the second active pattern AP2, which are not protected by the second hard mask layer HML2, may be selectively removed. Thus, the gate insulating layer GI on the second active pattern AP2 may be fully exposed to the outside again. The first metal patterns MP1 on the first and third active patterns AP1 and AP3, which are protected by the second hard mask layer HML2, may remain they are.

Referring back to FIGS. 6A, 6B, and 6C, the second hard mask layer HML2 may be selectively removed. The capping pattern CAM, the second metal pattern MP2, and the fill metal pattern FMP may be sequentially formed on the first to third channel patterns CH1-CH3. The second metal pattern MP2 may be formed of or include at least one of n-type work-function metals.

The capping pattern CAM and the second metal pattern MP2 on the second active pattern AP2 may fully fill the first to third inner regions IRG1, IRG2, and IRG3. Thus, a composition of a metallic material, which is provided on the second active pattern AP2 to fill the first to third inner regions IRG1, IRG2, and IRG3, may be different from a composition of a metallic material, which is provided on the first active pattern AP1 to fill the first to third inner regions IRG1, IRG2, and IRG3.

The first metal pattern MP1, the capping pattern CAM, the second metal pattern MP2, and the fill metal pattern FMP on the first active pattern AP1 may constitute the outer gate electrode OGE. The first inner gate electrode IGEa and the outer gate electrode OGE on the first active pattern AP1 may constitute the first gate electrode GE1. The capping pattern CAM, the second metal pattern MP2, and the fill metal pattern FMP on the second active pattern AP2 may constitute the second gate electrode GE2. The second inner gate electrode IGEb and the outer gate electrode OGE on the third active pattern AP3 may constitute the third gate electrode GE3.

According to an example embodiment, there may be no difference between the low Vt region LVC and the high Vt region HVC in a process of forming the outer gate electrode OGE, and thus, a process difficulty in the fabrication process may be reduced. Furthermore, it may be possible to improve reliability characteristics of a semiconductor device. In addition, only the work-function metals filling the inner regions IRG may be controlled to have a difference in the compositions (i.e., the effective work-functions), and this may make it possible to realize transistors having different threshold voltages in a simple manner.

Figure 18A:
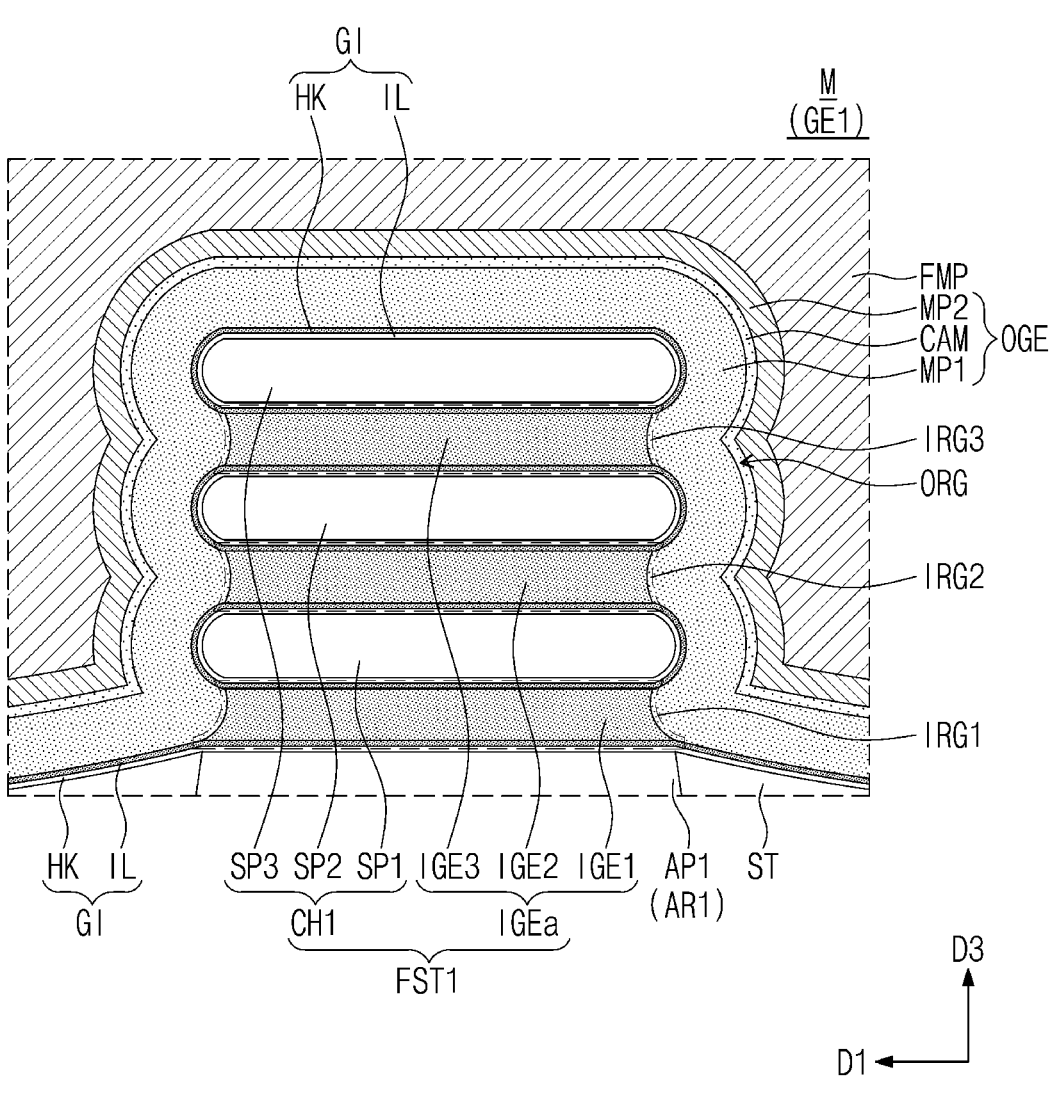
FIGS. 18A and 18B are enlarged sectional views illustrating portions (e.g., the portion 'M' of FIG. 5D and the portion 'O' of FIG. 5G) of first and third gate electrodes according to example embodiments.
Figure 18B:
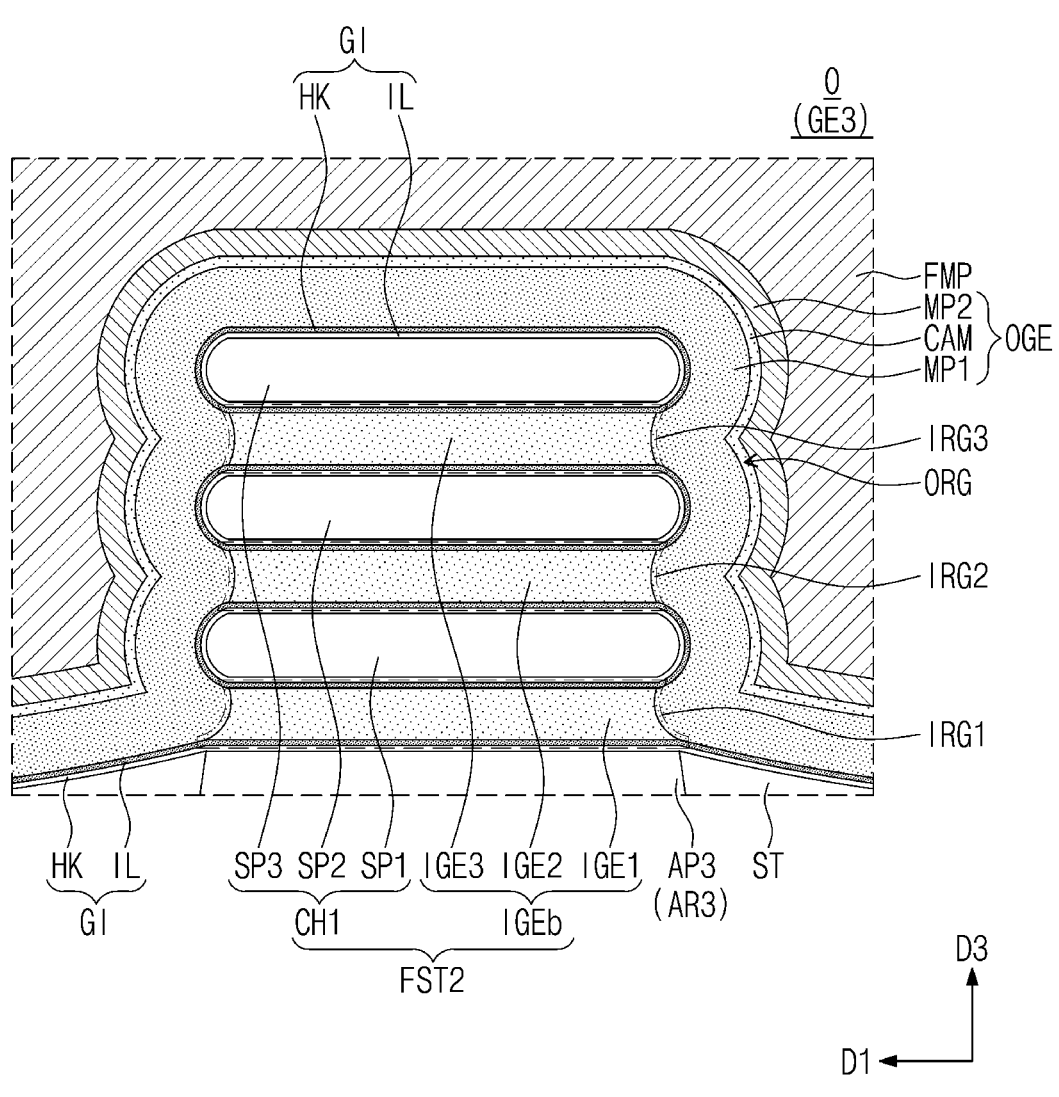

FIGS. 18A and 18B are enlarged sectional views illustrating portions (e.g., the portion 'M' of FIG. 5D and the portion 'O' of FIG. 5G) of first and third gate electrodes according to an example embodiment. In the following description, an element previously described with reference to FIGS. 1 to 6E may be identified by the same reference number without repeating an overlapping description thereof, for concise description.

Referring to FIGS. 18A and 18B, the first gate electrode GE1 may include the first inner gate electrode IGEa and the outer gate electrode OGE, and the third gate electrode GE3 may include the second inner gate electrode IGEb and the outer gate electrode OGE. The outer gate electrode OGE of the first gate electrode GE1 may have substantially the same structure as the outer gate electrode OGE of the third gate electrode GE3.

The first to third inner electrodes IGE1, IGE2, and IGE3 of the first inner gate electrode IGEa and the first to third semiconductor patterns SP1, SP2, and SP3 may constitute a first fin structure FST1. The first to third inner electrodes IGE1, IGE2, and IGE3 of the second inner gate electrode IGEb and the first to third semiconductor patterns SP1, SP2, and SP3 may constitute a second fin structure FST2. The outer gate electrode OGE may cover each of the first and second fin structures FST1 and FST2.

Both of the first and second inner gate electrodes IGEa and IGEb may be formed of or include a p-type work-function metal. However, the second inner gate electrode IGEb may have a work-function that is lower than that of the first inner gate electrode IGEa. For example, by making a difference in the compositions of the first and second inner gate electrodes IGEa and IGEb, the second inner gate electrode IGEb may have a work-function lower than that of the first inner gate electrode IGEa.

In an example embodiment, the second inner gate electrode IGEb may contain aluminum (Al) or silicon (Si). Here, a concentration of aluminum (Al) or silicon (Si) in the second inner gate electrode IGEb may be higher than the concentration of aluminum (Al) or silicon (Si) in the first inner gate electrode IGEa. For example, the concentration of aluminum (Al) or silicon (Si) in the second inner gate electrode IGEb may be higher than the concentration of aluminum (Al) or silicon (Si) in the first inner gate electrode IGEa by 3 at % to 25 at %.

As an example, the second inner gate electrode IGEb may be formed of or include titanium silicon nitride (TiSiN) or titanium aluminum nitride (TiAlN), and the first inner gate electrode IGEa may be formed of or include titanium nitride (TiN). As another example, each of the first and second inner gate electrodes IGEa and IGEb may be formed of or include titanium silicon nitride (TiSiN) or titanium aluminum nitride (TiAlN). Here, a concentration of aluminum (Al) or silicon (Si) in the second inner gate electrode IGEb may be higher than a concentration of aluminum (Al) or silicon (Si) in the first inner gate electrode IGEa.

Because the material of the first inner gate electrode IGEa in the first fin structure FST1 is adjusted to be different from the material of the second inner gate electrode IGEb in the second fin structure FST2, it may be possible to make a difference in threshold voltages of PMOSFETs. According to an example embodiment, even when the outer gate electrodes OGE of the first and third gate electrodes GE1 and GE3 have the same structure, the PMOSFETs may be controlled to have threshold voltages different from each other.

In a semiconductor device according to an example embodiment, by making a difference in compositions (or effective work-functions) of work-function metals filling inner regions, it may be possible to realize transistors having different threshold voltages. Outer gate electrodes of the same structure may be formed in outer regions, which are provided outside the inner regions, by the same process, and thus it may be possible to reduce a process difficulty in a process of fabricating the semiconductor device and to improve reliability characteristics of the semiconductor device.

While aspects of example embodiments have been particularly shown and described, it will be understood by one of ordinary skill in the art that variations in form and detail may be made therein without departing from the spirit and scope of the attached claims.

What is claimed is:

1. A semiconductor device, comprising:
   a first active pattern provided on a first PMOSFET region of a substrate and a second active pattern respectively a second PMOSFET region of the substrate;
   a first channel pattern on the first active pattern, the first channel pattern comprising first semiconductor patterns stacked and spaced apart from each other;

a second channel pattern on the second active pattern, the second channel pattern comprising second semiconductor patterns stacked and spaced apart from each other;

a first gate electrode on the first channel pattern; and a second gate electrode on the second channel pattern, wherein the first gate electrode comprises a first inner gate electrode provided in a first inner region between the first semiconductor patterns and a first outer gate electrode provided in a first outer region spaced apart from the first semiconductor patterns, wherein the second gate electrode comprises a second inner gate electrode provided in a second inner region between the second semiconductor patterns and a second outer gate electrode provided in a second outer region spaced apart from the second semiconductor patterns, and wherein a first concentration of aluminum (Al) or silicon (Si) in the first inner gate electrode is different from a second concentration of aluminum (Al) or silicon (Si) in the second inner gate electrode.

2. The semiconductor device of claim 1, wherein a work-function of the first inner gate electrode is different from a work-function of the second inner gate electrode.

3. The semiconductor device of claim 1, wherein a difference between the first concentration and the second concentration ranges from 3 at % to 25 at %.

4. The semiconductor device of claim 1, wherein each of the first outer gate electrode and the second outer gate electrode comprises a first metal pattern, a second metal pattern on the first metal pattern, and a fill metal pattern on the second metal pattern, wherein the first inner gate electrode has a composition different from the first metal pattern, and wherein the second inner gate electrode and the first metal pattern have a common composition.

5. The semiconductor device of claim 4, wherein the first concentration is different from a concentration of aluminum (Al) or silicon (Si) in the first metal pattern.

6. The semiconductor device of claim 4, wherein the first metal pattern of the first outer gate electrode covers both side surfaces of the first inner gate electrode.

7. The semiconductor device of claim 4, wherein the first inner gate electrode has a first thickness, and wherein the first metal pattern has a second thickness that is greater than the first thickness.

8. The semiconductor device of claim 1, further comprising a high-k dielectric layer interposed between the first channel pattern and the first gate electrode, wherein the high-k dielectric layer comprises:

a first portion on a top or bottom surface of each of the first semiconductor patterns; and a second portion on a side surface of each of the first semiconductor patterns, wherein the first inner gate electrode covers the first portion, and wherein the first outer gate electrode covers the second portion.

9. The semiconductor device of claim 1, wherein one of the first semiconductor patterns comprises a first side surface, wherein the first inner gate electrode comprises a second side surface, and wherein a recess depth of the second side surface relative to the first side surface ranges from about 2 nm to about 5 nm.

10. The semiconductor device of claim 1, wherein the first inner gate electrode comprises a metal nitride material, in which aluminum (Al) or silicon (Si) is absent, and wherein the second inner gate electrode comprises a metal nitride material comprising aluminum (Al) or silicon (Si).

11. A semiconductor device, comprising:

a substrate;

a device isolation layer provided on the substrate and defining an active pattern;

semiconductor patterns on the active pattern; and a gate electrode on the semiconductor patterns, wherein the gate electrode comprises an inner gate electrode and an outer gate electrode, each of which comprises inner electrodes, wherein the inner electrodes of the inner gate electrode and the semiconductor patterns are alternately stacked to define a fin structure, wherein the outer gate electrode comprises:

a first metal pattern on the fin structure;

a second metal pattern on the first metal pattern; and a fill metal pattern on the second metal pattern, and wherein a first concentration of aluminum (Al) or silicon (Si) in the inner gate electrode is different from a second concentration of aluminum (Al) or silicon (Si) in the first metal pattern.

12. The semiconductor device of claim 11, wherein a difference between the first concentration and the second concentration ranges from 3 at % to 25 at %.

13. The semiconductor device of claim 11, wherein the inner gate electrode comprises a metal nitride material, in which aluminum (Al) or silicon (Si) is absent, and wherein the first metal pattern comprises a metal nitride material comprising aluminum (Al) or silicon (Si).

14. The semiconductor device of claim 11, wherein the semiconductor patterns comprise a first semiconductor pattern, a second semiconductor pattern, and a third semiconductor pattern, which are stacked on the active pattern and spaced apart from each other, and wherein the inner gate electrode comprises a first inner electrode between the active pattern and the first semiconductor pattern, a second inner electrode between the first semiconductor pattern and the second semiconductor pattern, and a third inner electrode between the second semiconductor pattern and the third semiconductor pattern.

15. The semiconductor device of claim 11, further comprising a high-k dielectric layer enclosing each of the semiconductor patterns, wherein the high-k dielectric layer comprises:

a first portion on a top or bottom surface of each of the semiconductor patterns; and a second portion on a side surface of each of the semiconductor patterns, wherein the inner gate electrode covers the first portion, and wherein the first metal pattern covers the second portion.

* * * * *